US011069773B2

(12) United States Patent
Lin et al.

(10) Patent No.: US 11,069,773 B2
(45) Date of Patent: Jul. 20, 2021

(54) CONTACT-TO-GATE MONITOR PATTERN AND FABRICATION THEREOF

(71) Applicant: TAIWAN SEMICONDUCTOR MANUFACTURING CO., LTD., Hsinchu (TW)

(72) Inventors: Meng-Han Lin, Hsinchu (TW); Chih-Ren Hsieh, Changhua County (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 17 days.

(21) Appl. No.: 16/572,357

(22) Filed: Sep. 16, 2019

(65) Prior Publication Data

US 2020/0168701 A1 May 28, 2020

Related U.S. Application Data

(60) Provisional application No. 62/771,412, filed on Nov. 26, 2018.

(51) Int. Cl.

| | |
|---|---|
| ***H01L 29/06*** | (2006.01) |
| ***H01L 29/788*** | (2006.01) |
| ***H01L 27/11529*** | (2017.01) |
| ***H01L 27/11519*** | (2017.01) |
| ***H01L 27/11524*** | (2017.01) |
| ***H01L 29/66*** | (2006.01) |

(52) U.S. Cl.

CPC .... *H01L 29/0649* (2013.01); *H01L 27/11519* (2013.01); *H01L 27/11524* (2013.01); *H01L 27/11529* (2013.01); *H01L 29/66825* (2013.01); *H01L 29/788* (2013.01)

(58) Field of Classification Search

CPC ........... H01L 29/0649; H01L 29/66825; H01L 29/788; H01L 27/11519; H01L 27/11524; H01L 27/11529; H01L 22/10–14

See application file for complete search history.

(56) References Cited

U.S. PATENT DOCUMENTS

| | | | | |
|---|---|---|---|---|
| 6,020,616 | A * | 2/2000 | Bothra | H01L 21/76229 257/207 |
| 6,603,162 | B1 * | 8/2003 | Uchiyama | G03F 9/7076 257/296 |
| 8,946,706 | B2 * | 2/2015 | Kim | H01L 22/34 257/48 |
| 10,818,595 | B2 * | 10/2020 | Ho | H01L 23/5283 |
| 2006/0183256 | A1 * | 8/2006 | Chi | H01L 22/12 438/14 |
| 2009/0191281 | A1 | 7/2009 | Marchal | |

(Continued)

FOREIGN PATENT DOCUMENTS

| | | |
|---|---|---|
| TW | 201523313 A | 8/2015 |
| TW | 201841349 A | 11/2018 |

*Primary Examiner* — Shaun M Campbell
(74) *Attorney, Agent, or Firm* — Maschoff Brennan

(57) ABSTRACT

A method includes forming a shallow trench isolation (STI) region in a semiconductor substrate, the STI region bordering an active region in the semiconductor substrate; forming a plurality of gate structures over the semiconductor substrate; and forming a plurality of conductive contacts between the gate structures and in contact with the STI region, wherein a portion of the active region is between the conductive contacts.

20 Claims, 76 Drawing Sheets

(56) References Cited

U.S. PATENT DOCUMENTS

| | | | |
|---|---|---|---|
| 2011/0165746 A1 | 7/2011 | Liu et al. | |
| 2016/0093736 A1* | 3/2016 | Liang | H01L 29/0847 257/384 |
| 2016/0141298 A1 | 5/2016 | Chuang et al. | |
| 2017/0067955 A1* | 3/2017 | Moll | H01L 27/1203 |
| 2017/0133287 A1* | 5/2017 | Moll | H01L 21/02488 |
| 2017/0323878 A1* | 11/2017 | Tsumura | H01L 27/088 |
| 2018/0151459 A1* | 5/2018 | Ho | H01L 21/76807 |
| 2019/0326311 A1* | 10/2019 | Chakihara | H01L 22/12 |
| 2020/0411534 A1* | 12/2020 | Lin | H01L 21/3086 |

* cited by examiner

SL

SL

SL

100

100

100

CONTACT-TO-GATE MONITOR PATTERN AND FABRICATION THEREOF

PRIORITY CLAIM AND CROSS-REFERENCE

This application claims priority to U.S. Provisional Application Ser. No. 62/771,412, filed Nov. 26, 2018, which is herein incorporated by reference.

BACKGROUND

The semiconductor integrated circuit (IC) industry has experienced exponential growth over the last few decades. In the course of IC evolution, functional density (i.e., the number of interconnected devices per chip area) has generally increased while geometry size (i.e., the smallest component (or line) that can be created using a fabrication process) has decreased. One advancement implemented as technology nodes shrink, in some IC designs, has been the replacement of the polysilicon gate electrode with a metal gate electrode to improve device performance with the decreased feature sizes.

Super-flash technology has enabled designers to create cost effective and high performance programmable SOC (system on chip) solutions through the use of split-gate flash memory cells. The aggressive scaling of the third generation embedded super-flash memory (ESF3) enables designing flash memories with high memory array density.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 2:
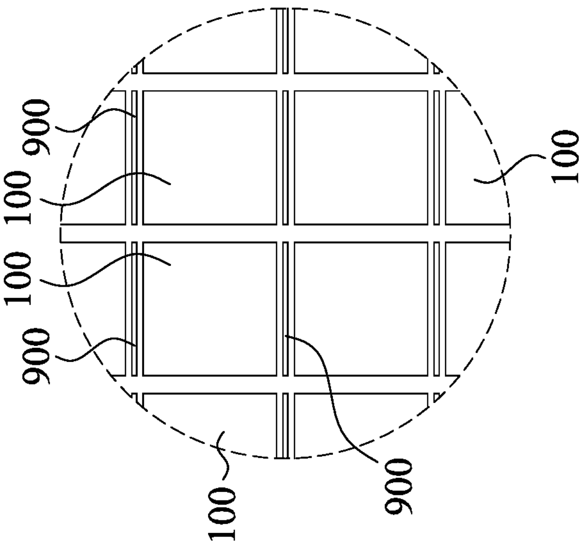
FIG. 2 is an enlarged view of a portion of the semiconductor substrate of FIG. 1 according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
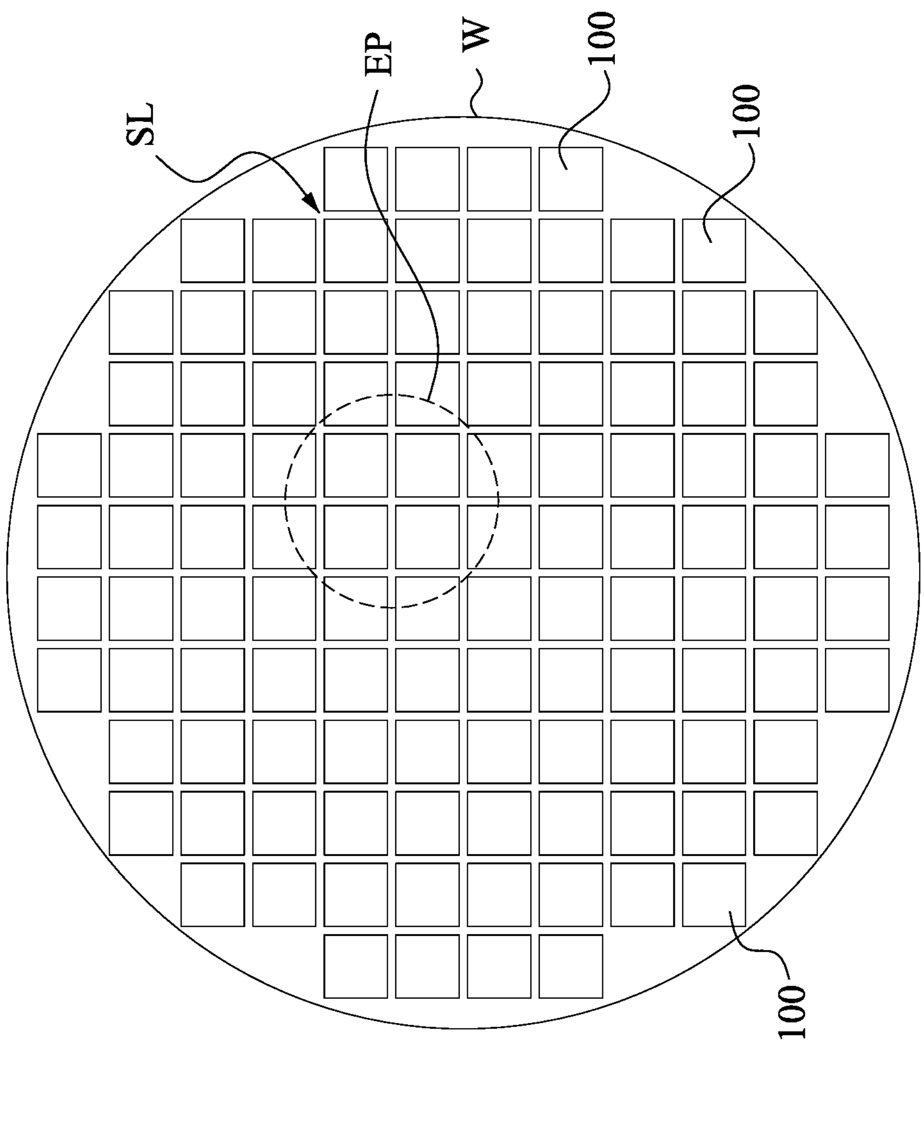
FIG. 1 is a diagrammatic plan view of a semiconductor substrate according to some embodiments of the present disclosure.

FIG. 1 is a diagrammatic plan view of a semiconductor substrate (e.g., wafer) W on which a plurality of semiconductor die regions 100 are formed. FIG. 2 is an enlarged view of a portion EP of the wafer W of FIG. 1, showing additional detail, according to some embodiments of the present disclosure. The semiconductor die regions 100 are separated by scribe line regions SL along which the wafer W will be cut to produce individual integrated circuit (IC) chips. The scribe line regions SL include the kerf of a saw that will be used to separate the wafer W into dies 100, and thus define the chips on the wafer W. The material removed by the saw, and the material surrounding the die regions 100 will be discarded as waste following the separation process. However, additional semiconductor devices and circuits 900 may be formed in the scribe line regions SL as indicated in FIG. 2. These devices 900 can be referred to as process control monitor (PCM) test keys, and are used for monitoring various functions and processes during manufacturing, to ensure proper operability of devices in the die regions 100. Such devices 900 may be employed to monitor, for example, threshold voltages, saturation current, off current, breakdown voltage, back-end processes, capacitances and resistances, etc. One or more flash memory devices and one or more logic devices are formed in the semiconductor die regions 100, one or more contact-to-gate monitor patterns are formed in the PCM test keys 900, as will be described in greater detail below.

The contact-to-gate monitor pattern in the PCM test keys 900 is used to ensure acceptable insulation between the source/drain contact and the gate electrode during manufacturing the IC dies 100. However, because the drain-side junction breakdown voltage is lower than the contact-to-gate breakdown voltage, test results or monitor results of the contact-to-gate monitor pattern might be inaccurate due to the noise of the drain-side junction breakdown voltage. Therefore, the contact-to-gate monitor pattern is formed within a larger shallow trench isolation (STI) region as compared to other STI regions in the wafer W.

However, it has been appreciated that the large STI region suffers aggravated STI dishing effect during chemical mechanical planarization (CMP) performed on the STI, leading to unacceptable defects in the subsequent processes, especially in fabrication of the flash memory devices. Therefore, in some embodiments of the present disclosure, an improved layout of the contact-to-gate monitor pattern is provided to increase active region density (i.e., oxide definition (OD) density) in the contact-to-gate monitor pattern and decrease area of the STI region, thus alleviating the STI dishing effect.

Figure 3:
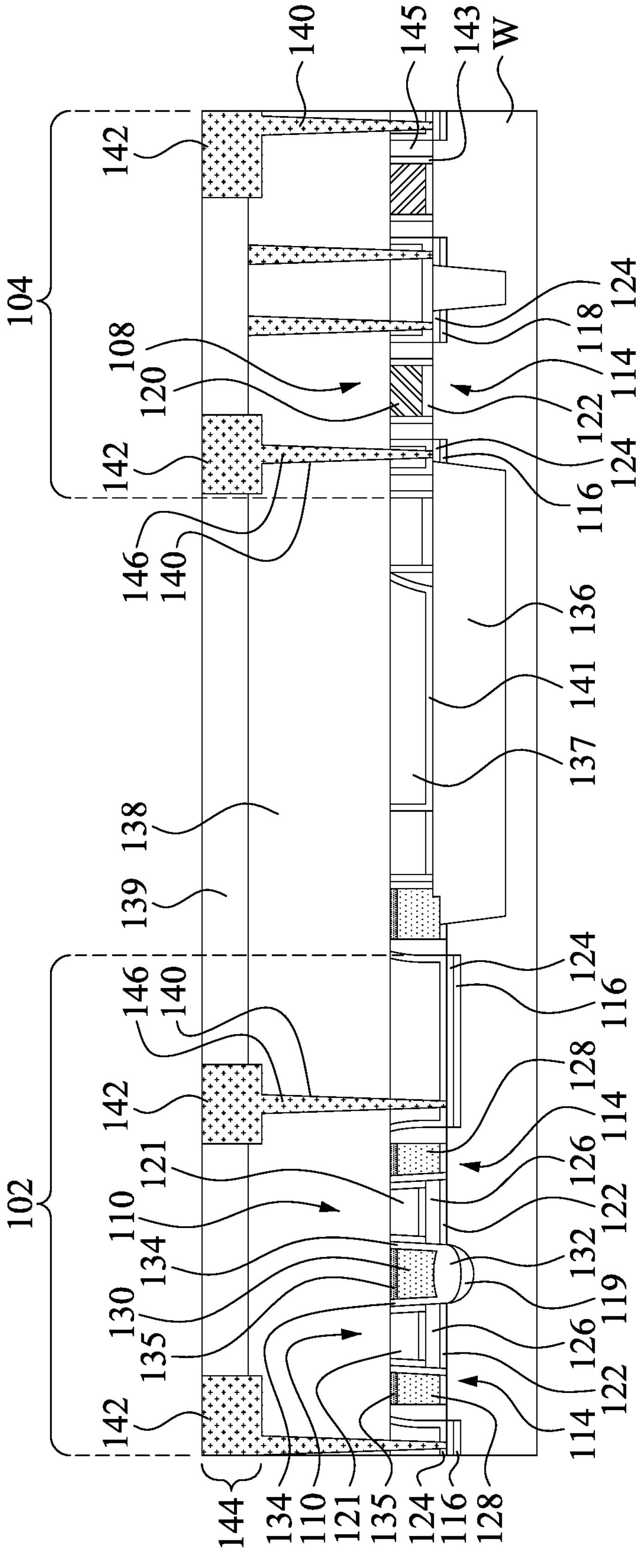
FIG. 3 is a cross-sectional view of a portion of a semiconductor die region according to some embodiments of the present disclosure.

FIG. 3 is a cross-sectional view of a portion of a semiconductor die region 100 according to some embodiments of the present disclosure. The semiconductor die region includes a flash memory array 102 and a peripheral circuit 104 formed on the semiconductor wafer W. The peripheral circuit 104 includes one or more transistors 108, while the memory array 102 includes a pair of flash memory cells 110.

The transistor 108 includes a channel region 114 extending between source/drain regions 116 and 118. A control gate 120 is isolated from the channel region 114 by a gate dielectric 122, and silicide contact terminals 124 are formed over the drain and source regions 116 and 118. The control gate 120 includes one or more metal layers.

The flash memory cells 110 include respective channel regions 114 extending below the corresponding floating gate 126 and select gate 128, a respective drain 116 and they share a common source region 119. Each flash memory cell 110 includes a control gate 121, a floating gate 126 positioned between the control gate 121 and the channel region 114, and a select gate 128 adjacent to the control and floating gates 121 and 126. A gate dielectric 122 separates the channel regions 114 from the respective floating and select gates 126, 128. The pair of flash memory cells 110 shares a common erase gate 130 that is separated from the common source region 119 by a common source dielectric region 132. Each of the floating gates 126 is separated from the erase gate 130 by a tunnel dielectric layer 134. Isolation structures (STI structures) 136 separate regions of the semiconductor die region 100 that have different types or levels of conductivity. Additional silicide contact terminals 135 are formed on upper surfaces of the select gates 128, the erase gates 130.

First, second and third interlayer dielectric (ILD) layers 137, 138 and 139 extend over the semiconductor wafer W, and vias 140 extend through the first and second ILD layers 137 and 138 to the silicide contact terminals 124. In some embodiments, the layer 139 can be interchangeably referred to as an inter-metal dielectric (IMD) layer. Electrical traces (e.g., metal lines) 142 formed in a first metal layer 144 in the IMD layer 139 are coupled to respective ones of the silicide contact terminals 124 by metal connectors 146 formed in the vias 140.

While connections are not shown for each component, it will be understood that in practice, connections are provided for the control gates 120, 121, the common source region 119, the select gates 128, the common source region 119, etc., placing each component in electrical contact with the appropriate circuitry. In some cases, the connections are by way of a metal layer, similar to those shown. In other cases, the connections are formed on or over the semiconductor wafer W. The floating gates 126 are isolated from direct electrical contact with other components and circuits of the IC die region 100.

Various layers of dielectric materials (e.g., etch stop layer 141, seal layer 143 and spacers 145) are shown in general outline, which are not configured to act as conductors or semiconductors in the IC die region 100. These layers may each comprise one or more dielectric materials.

The transistor 108 operates by applying an electric field over the channel region 114, thereby changing the conductivity of the channel region 114. The electric field is produced by application of a voltage potential between the control gate 120 and the semiconductor substrate W. A FET can be configured either to increase or decrease conductivity when an electric field of a selected polarity is present. Transistors in a peripheral circuit (e.g., logic circuit) are designed to function like switches, turning on or off in response to an electric field with a selected strength, and controlling.

In the memory cells 110, during a write operation, electrons can be forced to tunnel through the gate dielectric 122 (thus interchangeably referred to as tunnel dielectric) to the floating gate 126, where they can remain trapped indefinitely, by applying a write voltage to the control gate 121 while generating an electric current in the channel region 114. If there is a sufficient number of electrons trapped on the floating gate 126, the electrons can block an electric field produced by the control gate 121, preventing the control gate 121 from acting to change conductivity in the channel region 114. Thus, the presence of electrons can be detected by applying a voltage potential across the drain and source regions 116, 119 while applying a read voltage to the control gate 121 to produce an electric field, and testing for a current flow in the channel region 114. In some embodiments, a binary value of "one" is the default setting of a flash memory cell at the time of manufacture and before programming, while a binary value of "zero" is indicated if channel current is unaffected by a read voltage at the control gate 121. A binary "zero" value on a flash memory cell can be erased—i.e., returned to a "one"—by applying a sufficiently powerful erase voltage to the erase gate 130. This causes electrons trapped on the floating gates 126 of both of the memory cells 110 to tunnel out through the tunnel dielectric layers 134 to the erase gate 130. In practice, there would be many more memory cells adjacent to the erase gate 130, extending along rows lying perpendicular to the view of FIG. 3. During an erase operation, each of those memory cells would be erased simultaneously—i.e., in a "flash"-hence the term "flash" memory.

The term "tunneling" is used herein to refer to any process by which electrons are moved through a dielectric layer to or from a floating gate, including, for example, fowler-Nordheim tunneling, quantum tunneling, hot electron injection, etc.

Figure 4A:
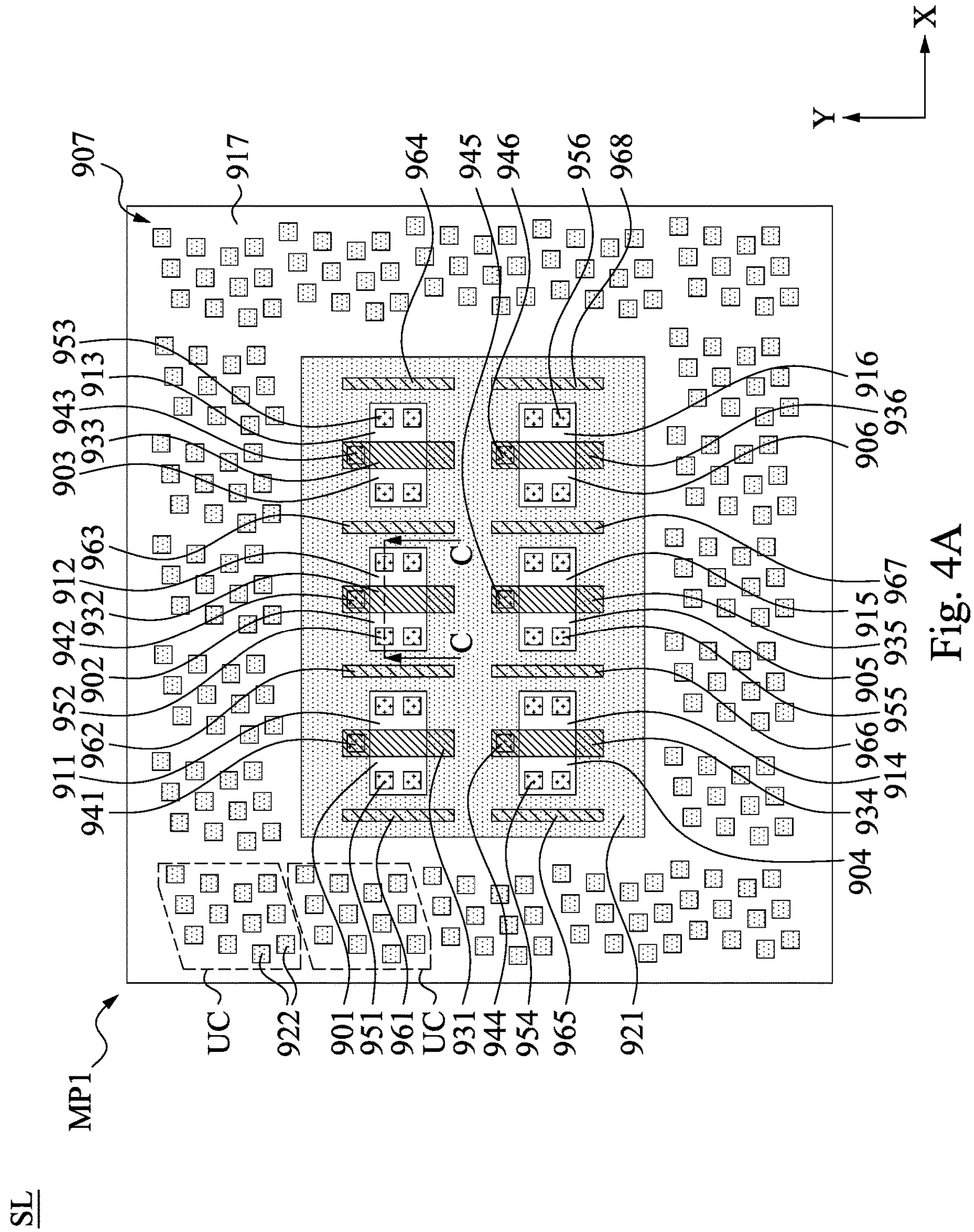
FIG. 4A is an overlaid layout of various levels of a contact-to-gate monitor pattern in a scribe line region according to some embodiments of the present disclosure.
Figure 4B:
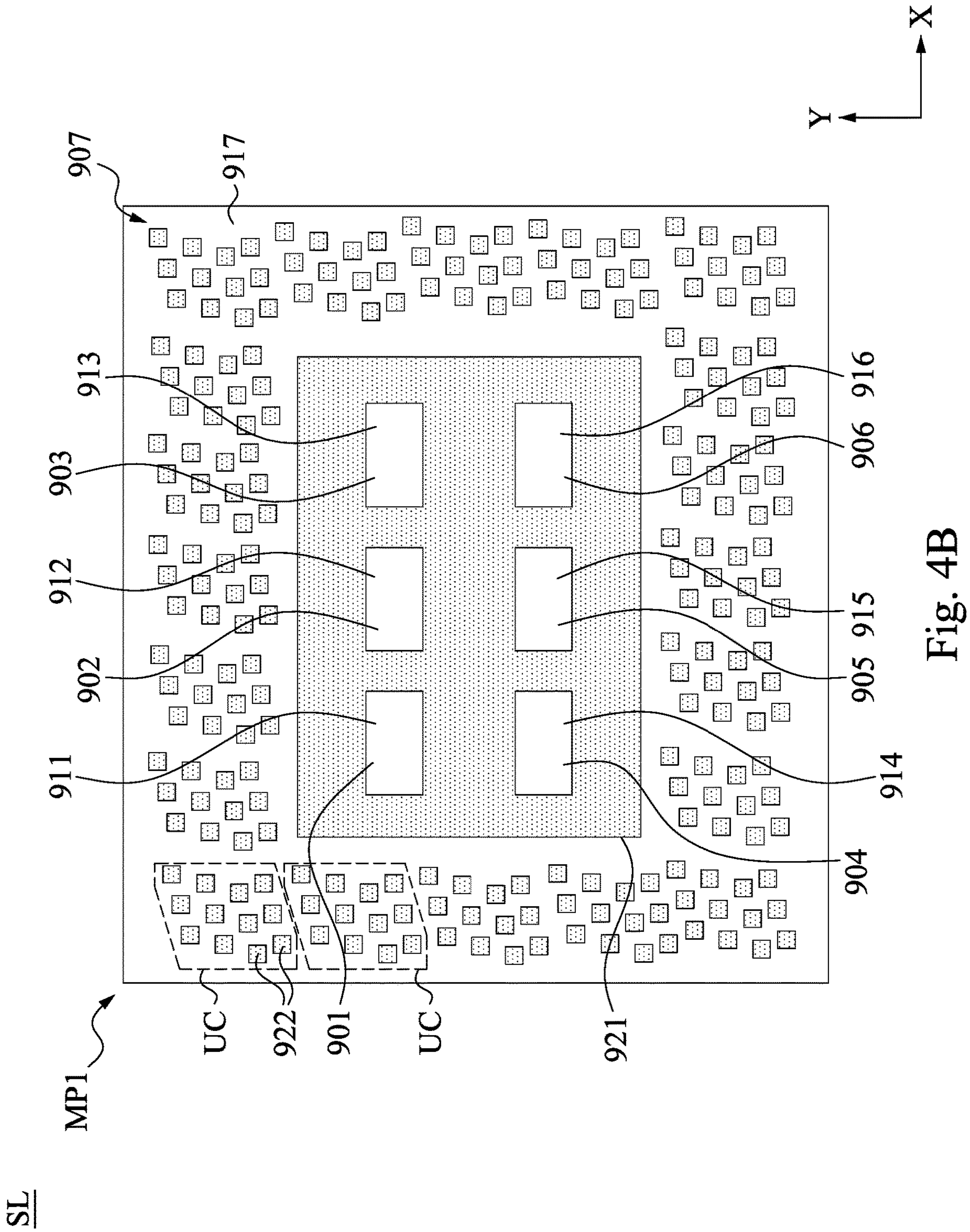
FIG. 4B is a layout of the active region of the contact-to-gate monitor pattern in the scribe line region of FIG. 4A.
Figure 4C:
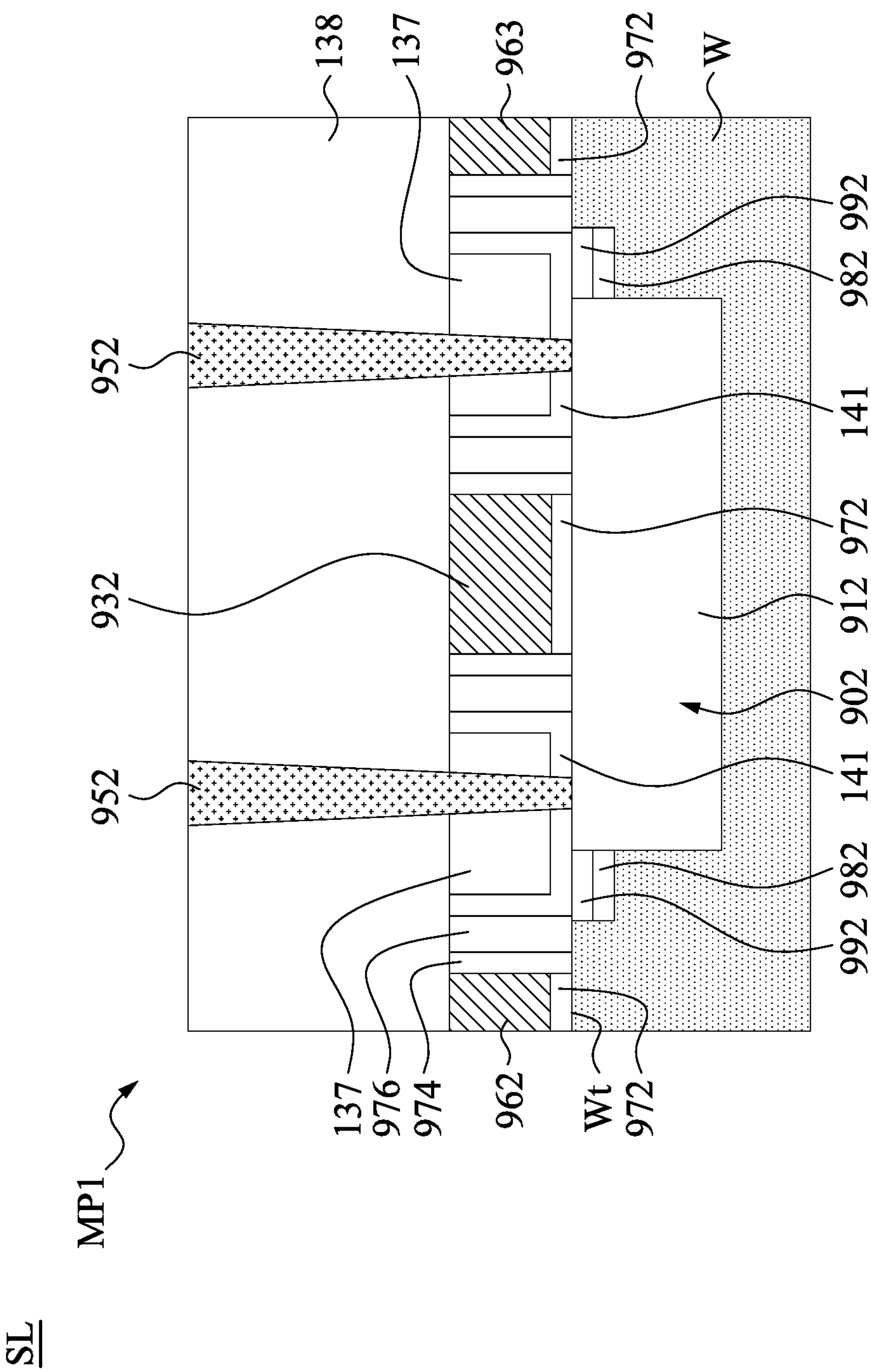
FIG. 4C is a cross-sectional view of a portion of the contact-to-gate monitor pattern in the scribe line region along a cross-sectional line C-C' of FIG. 4A.

FIG. 4A is an overlaid layout of various levels of a contact-to-gate monitor pattern MP1 in the scribe line region SL according to some embodiments of the present disclosure, FIG. 4B is a layout of the active region of a contact-to-gate monitor pattern MP1 in the scribe line region SL, and FIG. 4C is a cross-sectional view of a portion of the contact-to-gate monitor pattern MP1 in the scribe line region SL along a cross-sectional line C-C' of FIG. 4A. The contact-to-gate monitor pattern MP1 is formed on the wafer W in one or more of the scribe line regions SL, for example. Elements of the contact-to-gate monitor pattern MP1 are formed simultaneously with the formation of similar elements of the memory cells 110 and peripheral circuits 104 of the semiconductor dies region 100 as shown in of FIG. 3.

As shown in FIGS. 4A-4C, in the scribe line region SL, the semiconductor substrate W includes interior surfaces defining trenches 901, 902, 903, 904, 905, 906 and 907 extending within an upper surface Wt of the semiconductor substrate W. First isolation structures (e.g., shallow trench isolation (STI) structures) 911, 912, 913, 914, 915 and 916, and a second isolation structure 917 comprising one or more dielectric materials are disposed within the respective trenches 901-907. The first and second isolation structures 911-917 include sidewalls defining a first active region 921 and a plurality of second active regions 922 in the semiconductor substrate W. The isolation structures can be interchangeably referred to as STI regions in this context.

As shown in the top view of FIG. 4A, the second isolation structure 917 continuously extends around the first and second active regions 921 and 922. The first active region 921 has a greater top surface area than each of the second active regions 922. The second active regions 922 form a periodic array of substantially identical unit cells UC. Each unit cell UC includes several (e.g., twelve) second active regions 922 that are separated by the second isolation structure 917 and arranged in, for example, four rows and three columns. The periodic array of unit cells UC of the second active regions 922 can alleviate STI dishing effect in the contact-to-gate monitor pattern MP1 caused by CMP performed on the isolation structures 911-917.

The first active region 921 is surrounded by the periodic array of the unit cells UC. The first active region 921 continuously extends around the first isolation structures 911-916. The first isolation structures 911-916 are disposed within a boundary between the first active region 921 and the second isolation structure 917, and arranged in several rows and columns (e.g., two rows and three columns). In greater detail, the first isolation structures 911-913 are respectively aligned with the first isolation structures 914-916 along Y-direction. The first isolation structures 911-913 are aligned with each other along X-direction, and the first isolation structures 914-916 are aligned with each other along X-direction as well, wherein X-direction is perpendicular to Y-direction.

Longitudinal axes of the first isolation structures 911-916 and the first active region 921 extend along X-direction. For example, the first isolation structure 911 has a dimension in X-direction and a dimension in Y-direction, and the X-directional dimension is greater than the Y-directional dimension, thus resulting in a longitudinal axis of the first isolation structure 911 extending along the X-direction. Because the X-directional dimension is greater than the Y-directional dimension for the first isolation structures 911-916 and the first active region 921, the X-directional dimensions of the first isolation structures 911-916 and the first active region 921 can be interchangeably referred to as lengths of the first isolation structures 911-916 and the first active region 921, and the Y-directional dimensions of the first isolation structures 911-916 and the first active region 921 can be interchangeably referred to as widths of the first isolation structures 911-916 and the first active region 921. In some embodiments, the length of the first active region 921 is more than several times (e.g., three times) the length of each of the first isolation structures 911-916, and the width of the first active region 921 is more than several times (e.g. twice) the width of each of the first isolation structures 911-916.

In the scribe line region SL, gate structures 931, 932, 933, 934, 935 and 936 are disposed within a boundary between the first active region 921 and the second isolation structure 917. The gate structure 931 extends across the first isolation structure 911 along Y-direction. In greater detail, the gate structure 931 extends past opposing X-directional edges of the first isolation structure 911 along Y-direction by non-zero distances D101 and D102, as shown in the enlarged view of FIG. 4D. Therefore, the gate structure 931 has a portion overlapping with the first isolation structure 911 and two opposite end portions overlapping with the first active region 921. In some embodiments, the non-zero distances D101 and D102 are different. In some other embodiments, the non-zero distances D101 and D102 are the same. In some embodiments, the non-zero distances D101 and D102 are in a range from about 0.001 μm to about 1 μm. Excessively small distances D101 and D102 might lead to an unsatisfactory overlay window that impedes lithography processes of forming the gate structure 931 and/or STI region 911. The distances D101 and D102 up to about 1 μm allows for measuring breakdown voltage of high voltage (HV) devices. Similarly, the gate structures 932-936 respectively extend across the first isolation structures 911-916. The gate structures 931-933 are respectively aligned with the gate structures 934-936 along Y-direction. The gate structures 931-933 are aligned with each other along X-direction, and the gate structure 934-936 are aligned with each other along X-direction. In this manner, the gate structures 931-936 are arranged in, for example, two rows and three columns. In some embodiments, the gate structures 931-936 include one or more metal layers the same as that included in the control gate 120 in the peripheral circuit 104. In some other embodiments, the gate structures 931-936 include polysilicon.

In the scribe line region SL, gate contacts 941, 942, 943, 944, 945 and 946 respectively overlap with the gate structures 931-936. The gate contact 941 is disposed within a boundary between the gate structure 931 and the first active region 921. In greater detail, the gate contact 941 is set back from (i.e., offset from or separated from) Y-directional boundaries between the gate structure 931 and the first active region 921 along X-direction by non-zero distances D103, and set back from an X-directional boundary between the gate structure 931 and the first active region 921 by a non-zero distance D104, as illustrated in the enlarged view of FIG. 4D. Moreover, the gate contact 941 is set back from an X-directional boundary between the first active region 921 and the first isolation structure 911 along Y-direction by a non-zero distance D105, as illustrated in the enlarged view of FIG. 4D. In some embodiments, the non-zero distances D103, D104 and D105 are in a range from about 0.001 μm to about 1 μm. Excessively small distances D103, D104 and D105 might lead to an unsatisfactory overlay window that impedes lithography processes of forming the gate contact 941, gate structure 931 and/or the STI region 911. The distances D103, D104 and D105 up to about 1 μm allows for measuring breakdown voltage of high voltage (HV) devices. Similarly, the gate contact 942 is disposed within a boundary between the gate structure 932 and the first active region 921, and set back from a boundary between the gate structure 932 and the first isolation structure 912 along Y-direction by a non-zero distance. Similarly, the gate contact 943 is disposed within a boundary between the gate structure 933 and the first active region 921, and set back from a boundary between the gate structure 933 and the first isolation structure 913 along Y-direction by a non-zero distance. Similarly, the gate contact 944 is disposed within a boundary between the gate structure 934 and the first active region 921, and set back from a boundary between the gate structure 934 and the first isolation structure 914 along Y-direction by a non-zero distance. Similarly, the gate contact 945 is disposed within a boundary between the gate structure 935 and the first active region 921, and set back from a boundary between the gate structure 935 and the first isolation structure 915 along Y-direction by a non-zero distance. Similarly, the gate contact 946 is disposed within a boundary between the gate structure 936 and the first active region 921, and set back from a boundary between the gate structure 936 and the first isolation structure 916 along Y-direction by a non-zero distance.

In some embodiments, the first active region 921 extends between the gate structures 931 and 934, between the gate structures 932 and 935, and between the gate structures 933 and 936. Moreover, the first active region 921 may further extend between the gate structures 931 and 932, between the gate structures 934 and 935, between the gate structures 932 and 933, and between the gate structures 935 and 936.

In the scribe line region SL, conductive contacts 951, 952, 953, 954, 955 and 956 respectively overlap with the first isolation structures 911-916. The contact 951 is set back from a Y-directional boundary between the first active region 921 and the first isolation structure 911 along X-direction by a non-zero distance D106, and set back from an X-directional boundary between the first active region 921 and the first isolation structure 911 along Y-direction by a non-zero distance D107, as illustrated in the enlarged view of FIG. 4D. In some embodiments, the non-zero distances D106 and D107 are in a range from about 0.001 μm to about 1 μm. Excessively small distances D106 and D107 might lead to an unsatisfactory overlay window that impedes lithography processes of forming the gate contacts 951 and/or STI region 911. The distances D106 and D107 up to about 1 μm allows for measuring breakdown voltage of high voltage (HV) devices. In this manner, the contacts 951 non-overlap with the first active region 921. Similarly, the contacts 952-956 non-overlap with the first active region 921.

Figure 4D:
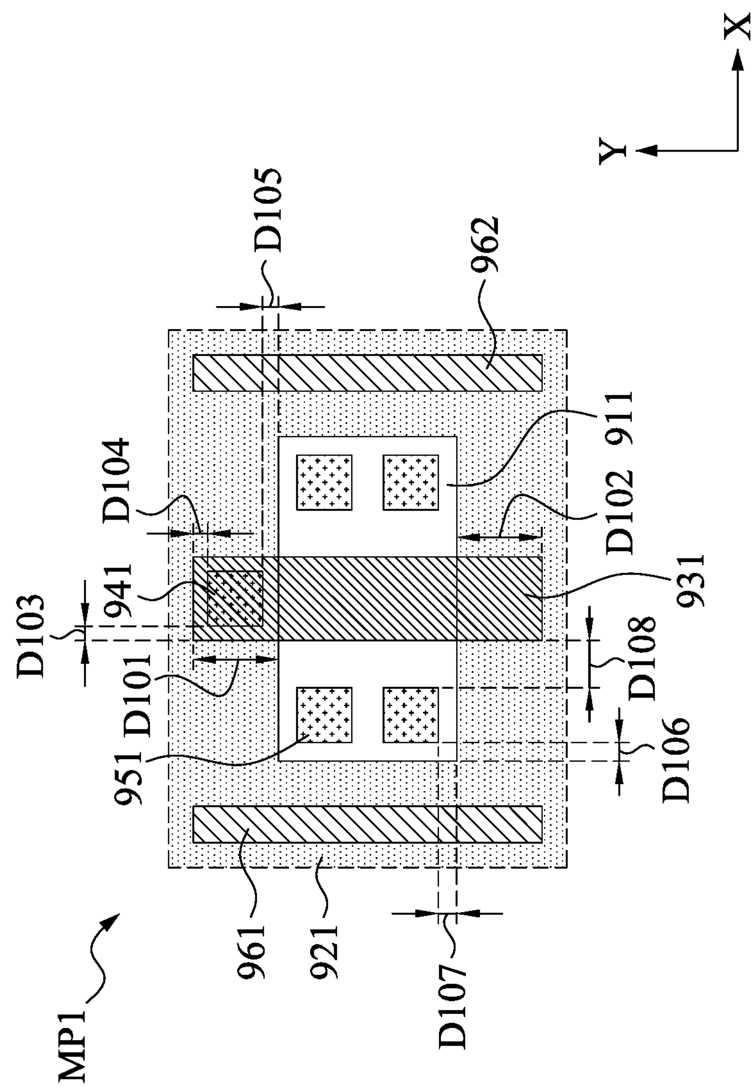
FIG. 4D is an enlarged view of a portion of the contact-to-gate monitor pattern in the scribe line region of FIG. 4A.

Moreover, contacts 951 are set back from opposing Y-directional edges of the gate structure 931 along X-direction by non-zero distances D108, as illustrated in the enlarged view of FIG. 4D. Thus, the contacts 951 non-overlap with the gate structure 931. In some embodiments, the non-zero distance D108 is in a range from about 0.001 μm to about 1 μm. Excessively small distance D108 might lead to an unsatisfactory overlay window that impedes lithography processes of forming the gate contacts 951 and/or the gate structure 931. The distance D108 up to about 1 μm allows for measuring breakdown voltage of high voltage (HV) devices. Similarly, the contacts 952-956 non-overlap with the gate structure 932-936, respectively.

A contact-to-gate breakdown voltage associated with the gate structure 931 can be measured by applying different voltages respectively on the gate contact 941 and the contact 951. Similarly, a contact-to-gate breakdown voltage associated with the gate structure 932 can be measured by applying different voltages respectively on the gate contact 942 and the contact 952. Similarly, a contact-to-gate breakdown voltage associated with the gate structure 933 can be measured by applying different voltages respectively on the gate contact 943 and the contact 953. Similarly, a contact-to-gate breakdown voltage associated with the gate structure 934 can be measured by applying different voltages respectively on the gate contact 944 and the contact 954. Similarly, a contact-to-gate breakdown voltage associated with the gate structure 935 can be measured by applying different voltages respectively on the gate contact 945 and the contact 955. Similarly, a contact-to-gate breakdown voltage associated with the gate structure 936 can be measured by applying different voltages respectively on the gate contact 946 and the contact 956.

Because the contacts 951-956 non-overlap with the first active region 921, noises resulting from drain-side junction breakdown can be prevented, thus improving accuracy of the measurement results of the contact-to-gate breakdown voltage. Moreover, because of the presence of the first active region 921 in the contact-to-gate monitor pattern MP1, the density of active regions (i.e., OD density) in the contact-to-gate monitor pattern MP1 can be increased, thus alleviating STI dishing effect on the isolation structures 911-917.

In some embodiments, in the scribe line region SL, dummy gate structures 961, 962, 963, 964, 965, 966, 967 and 968 overlap the first active region 921, but non-overlap with the first isolation structures 911-916 and the second isolation structure 917. The dummy gate structures 961-968 are free from gate contacts landing on their top surfaces, and thus are not used to test (or monitor) contact-to-gate breakdown voltages. The dummy gate structures 961-968 have widths in X-direction less than, or more than, or equal to widths of the functional gate structures 931-936 in X-direction. The dummy gate structures 961-968 have lengths in Y-direction substantially the same as lengths of the gate structures 931-936 in Y-direction. In this manner, the functional gate structures 931-936 have larger, or smaller, or the same sizes than the dummy gate structures 961-968, so as to facilitate to monitor a maximum contact-to-gate breakdown voltage.

In some embodiments, the dummy gate structures 961-964 and the gate structures 931-933 are equidistantly arranged in an alternating manner along X-direction. For example, the gate structure 931 is between the dummy gate structures 961 and 962, the gate structure 932 is between the dummy gate structures 962 and 963, the gate structure 933 is between the dummy gate structures 963 and 964. Similarly, the dummy gate structures 965-968 and the gate structures 934-936 are equidistantly arranged in an alternating manner along X-direction. For example, the gate structure 934 is between the dummy gate structures 965 and 966, the gate structure 935 is between the dummy gate structures 966 and 967, the gate structure 936 is between the dummy gate structures 967 and 968. The dummy gate structures 961-964 are respectively aligned with the dummy gate structures 965-968 along Y-direction. The dummy gate structures 961-964 are aligned with each other along X-direction, and the dummy gate structures 965-968 are aligned with each other along X-direction as well. In this manner, the dummy gate structures 961-968 are arranged in two rows and four columns. During CMP in a gate replacement process for forming the gate structures 931-936 and dummy gate structures 961-968, dishing effect of the gate structures 931-936 can be reduced due to the presence of the dummy gate structures 961-968.

The gate structures 931-936, and the dummy gate structures 961-968 are isolated from the semiconductor substrate W by a gate dielectric 972, and silicide contact terminals 992 are formed over the source/drain regions 982 in the semiconductor substrate W, as illustrated in FIG. 4C. Various layers of dielectric materials (e.g., etch stop layer 141, seal layer 974, spacers 976, ILD layers 137 and 138) are shown in general outline, which are not configured to act as conductors or semiconductors in the scribe line region SL. These layers may each comprise one or more dielectric materials.

Figure 5A:
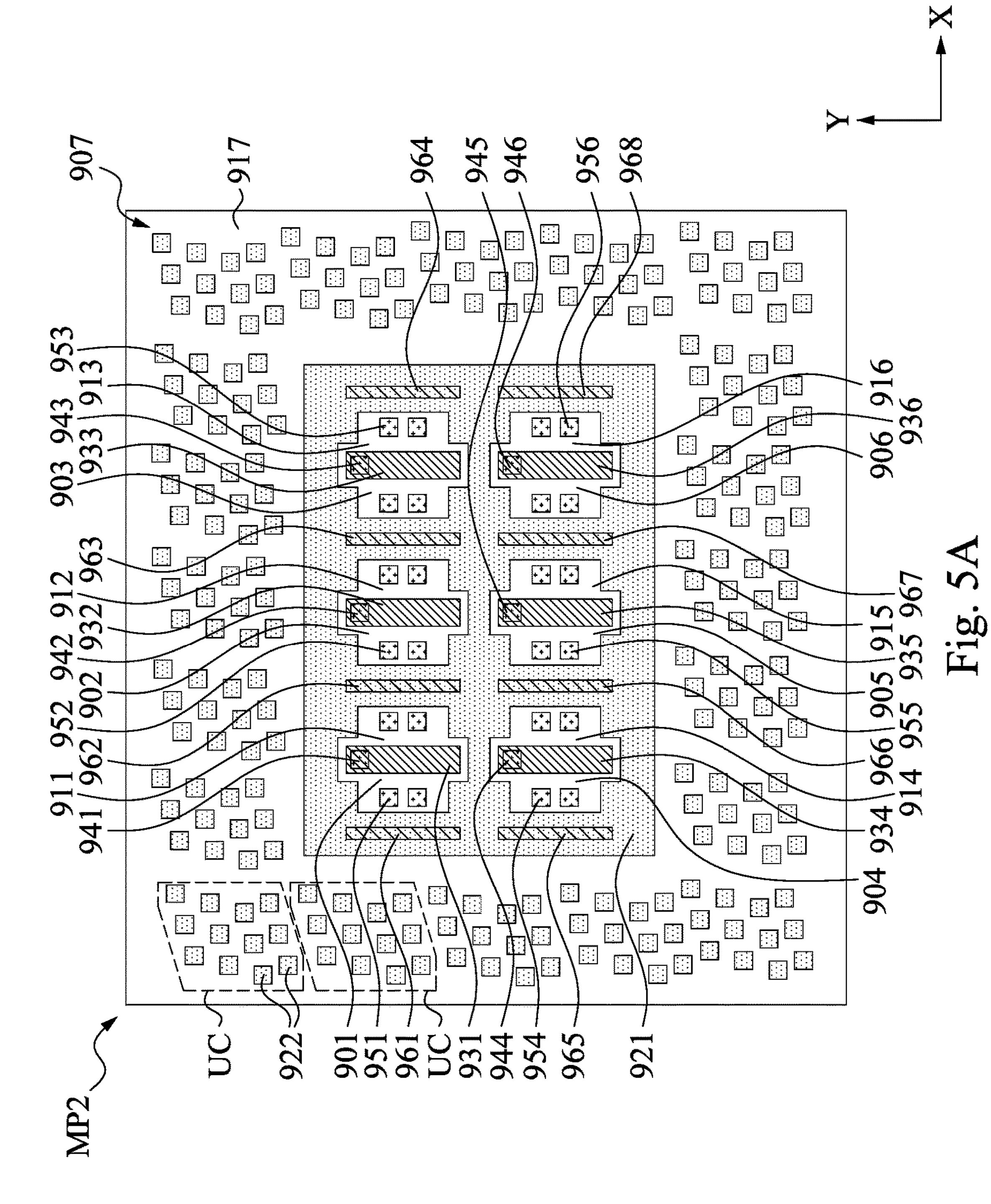
FIG. 5A is an overlaid layout of various levels of a contact-to-gate monitor pattern in a scribe line region according to some embodiments of the present disclosure.
Figure 5B:
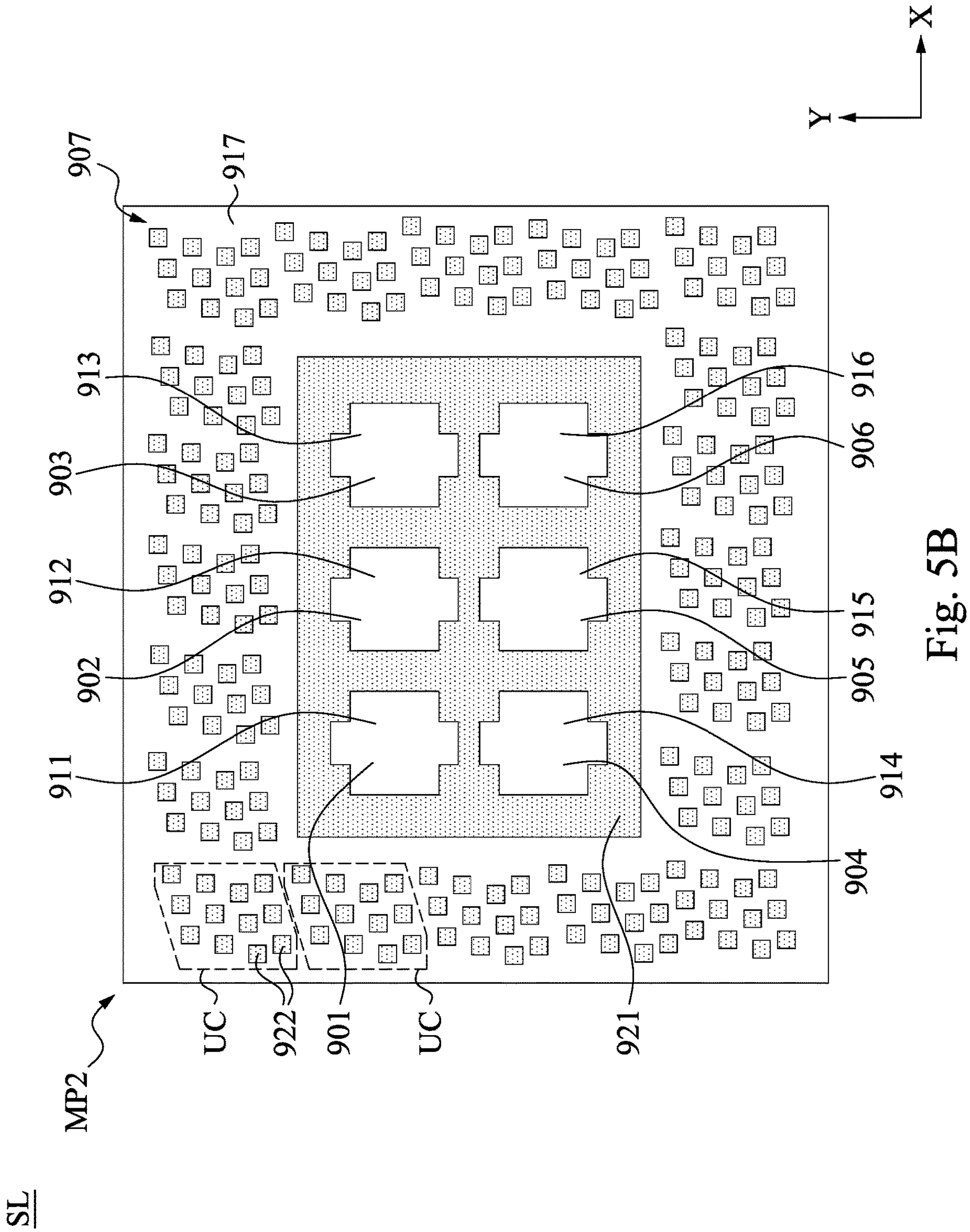
FIG. 5B is a layout of the active region of the contact-to-gate monitor pattern in the scribe line region of FIG. 5A.
Figure 5C:
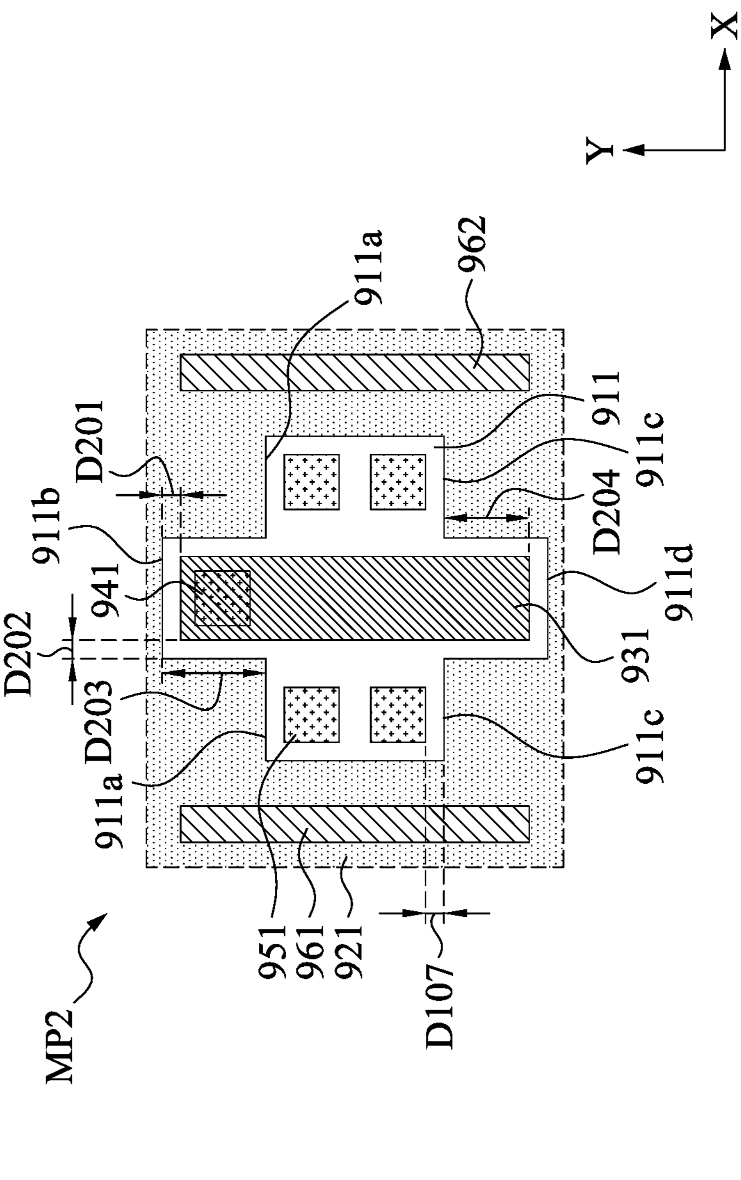
FIG. 5C is an enlarged view of a portion of the contact-to-gate monitor pattern in the scribe line region of FIG. 5A.

FIG. 5A is an overlaid layout of various levels of another contact-to-monitor pattern MP2 in the scribe line region SL according to some embodiments of the present disclosure, FIG. 5B is a layout of the active region of the contact-to-gate monitor pattern MP2 in the scribe line region SL, and FIG. 5C is an enlarged view of a portion of FIG. 5A. As illustrated in the top view of FIG. 5A, the gate structure 931 does not extend pass opposing X-directional edges of the first isolation structure 911. Instead, the gate structure 931 is set back from an X-directional boundary between the first isolation structure 911 and the first active region 921 along Y-direction by a non-zero distance D201, and set back from Y-directional boundaries between the first isolation structure 911 and the first active region 921 along X-direction by non-zero distances D202, as illustrated in the enlarged view of FIG. 5C. In some embodiments, the non-zero distances D201 and D202 are in a range from about 0.001 μm to about 1 μm. Excessively small distances D201 and D202 might lead to an unsatisfactory overlay window that impedes lithography processes of forming the gate structure 931 and/or the STI region 911. The distances D201 and D202 up to about 1 μm allows for measuring breakdown voltage of high voltage (HV) devices. Similarly, the gate structures 932-936 do not extend pass opposing edges of the respective first isolation structures 912-916. In this manner, the gate structures 931-936 non-overlap with the first active region 921.

Moreover, the first isolation structures 911-916 each have a length in Y-direction and a width in X-direction less than the length thereof. In some embodiments, as illustrated in the enlarged view of FIG. 5C, an upper edge of the first isolation structure 911 includes peripheral portions 911*a* and a center portion 911*b* between the peripheral portions 911*a*, and the center portion 911*b* is set back from the peripheral portions 911*a* along Y-direction by a non-zero distance D203. Similarly, a lower edge of the first isolation structure 911 includes peripheral portions 911*c* and a center portion 911*d* between the peripheral portions 911*c*, and the center portion 911*d* is set back from the peripheral portions 911*c* along Y-direction by a non-zero distance D204. In some embodiments, the non-zero distances D203 and D204 are in a range from about 0.001 μm to about 1 μm. In some embodiments, other first isolation structures 912-916 have substantially the same top view profile as the first isolation structure 911, and thus are not repeated for the sake of brevity.

Figure 6A:
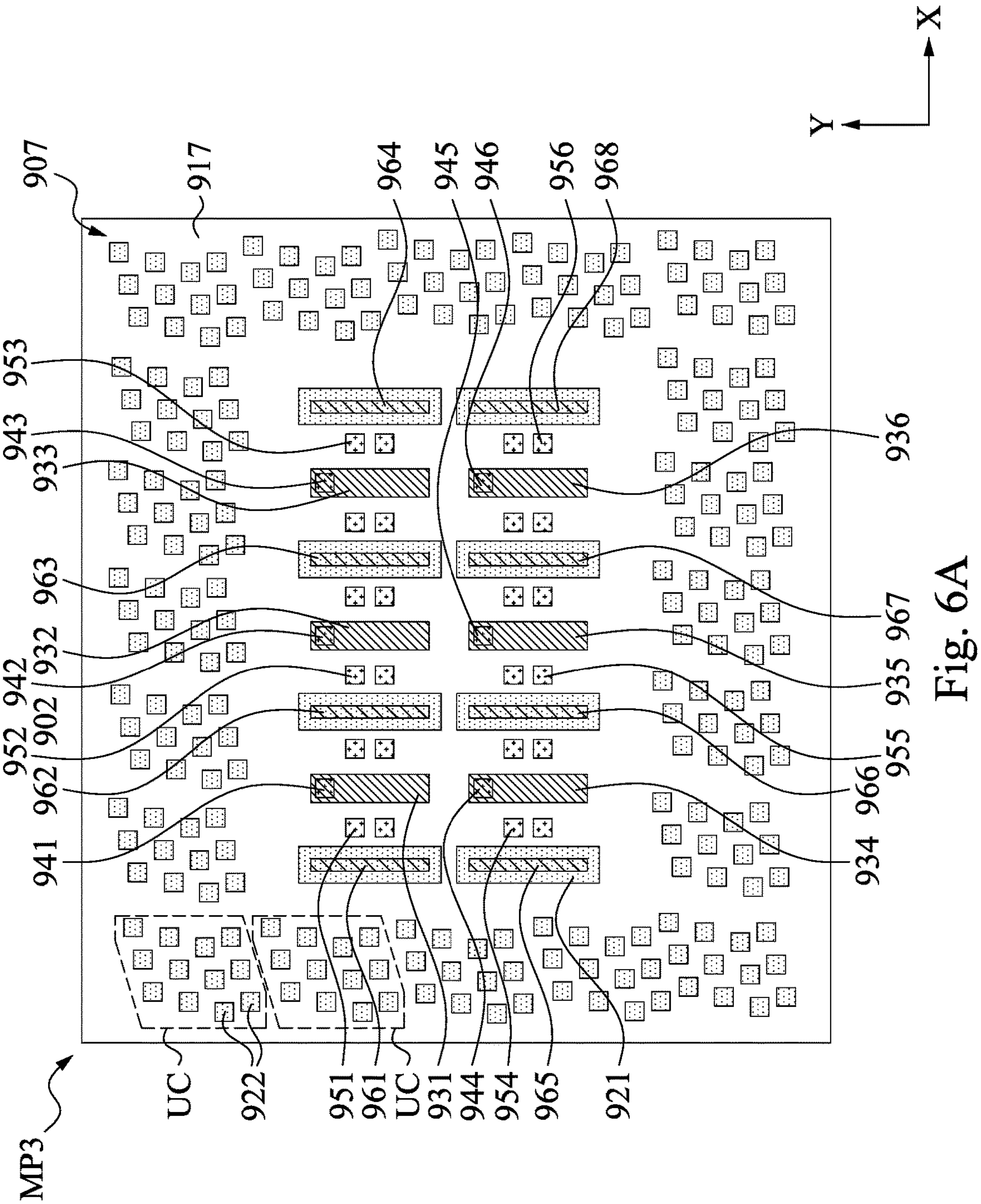
FIG. 6A is an overlaid layout of various levels of a contact-to-gate monitor pattern in a scribe line region according to some embodiments of the present disclosure.
Figure 6B:
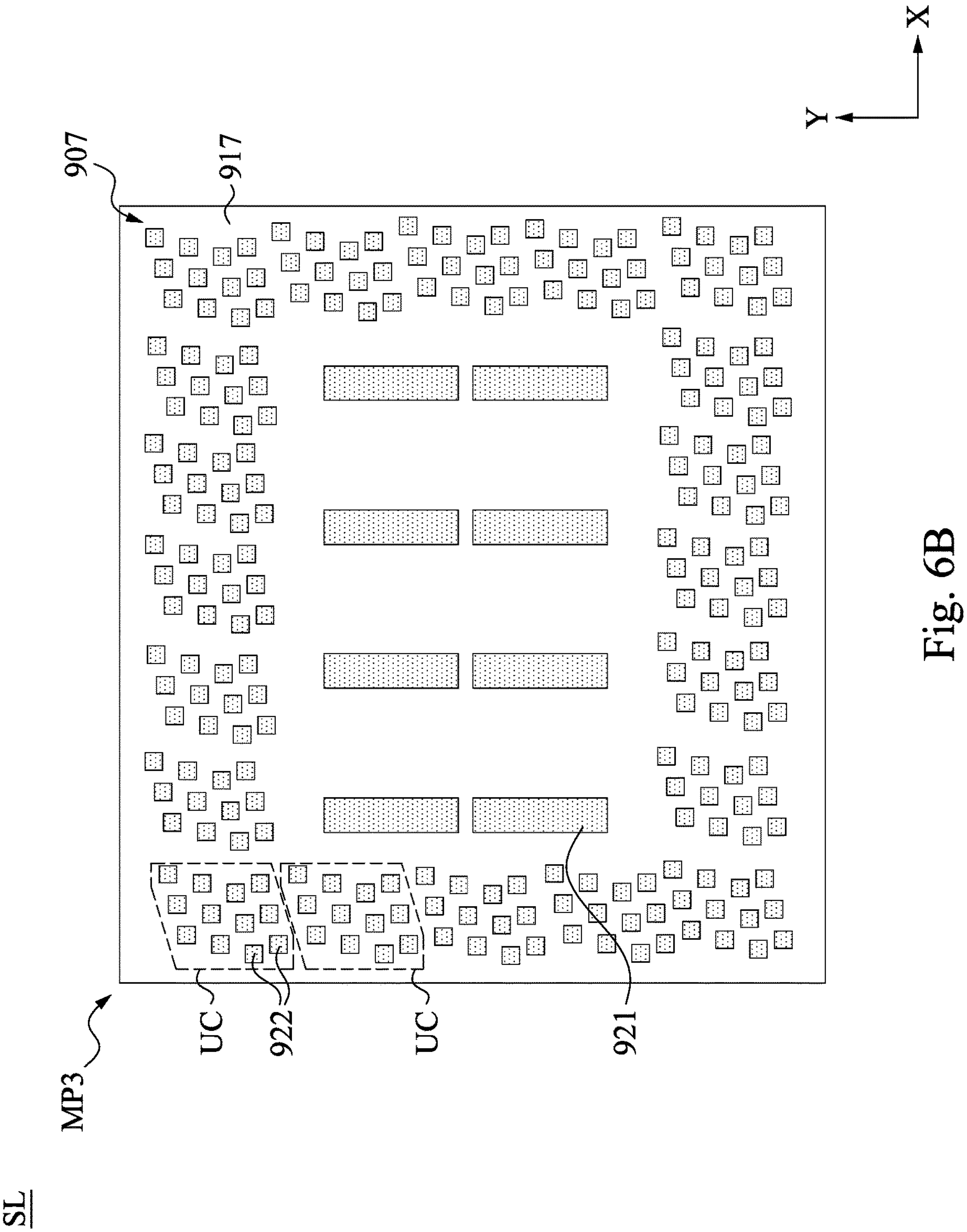
FIG. 6B is a layout of the active region of the contact-to-gate monitor pattern in the scribe line region of FIG. 6A.
Figure 6C:
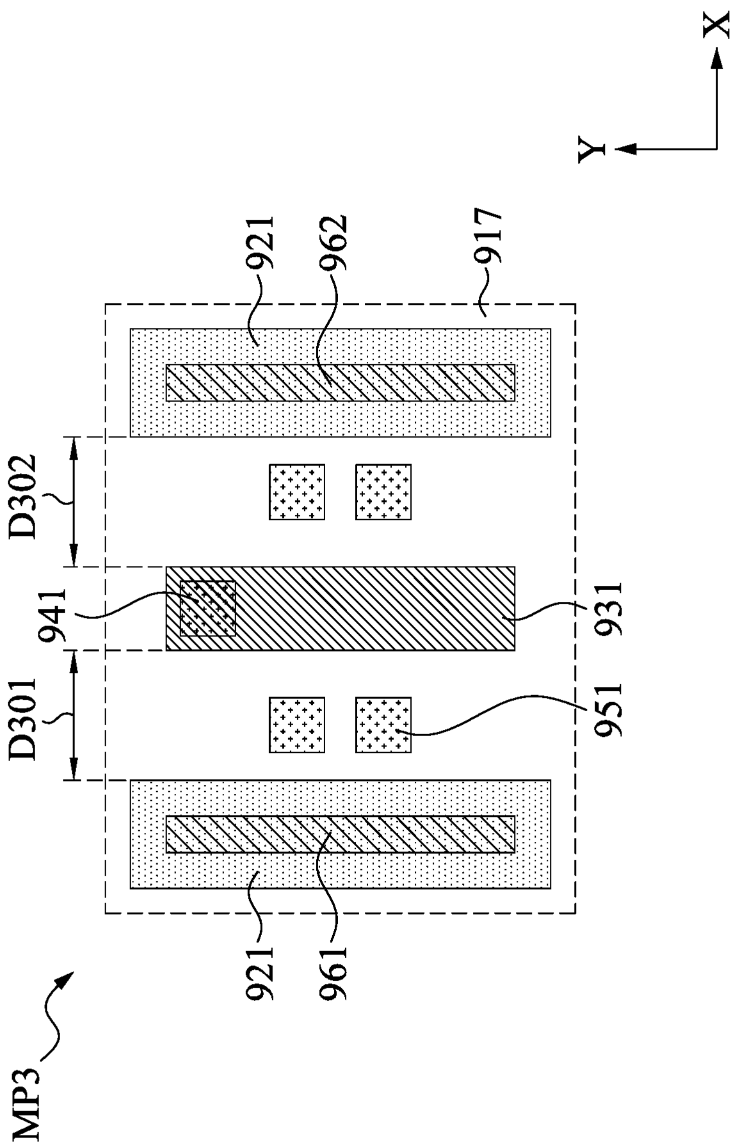
FIG. 6C is an enlarged view of a portion of the contact-to-gate monitor pattern in the scribe line region of FIG. 6A.

FIG. 6A is an overlaid layout of various levels of another contact-to-monitor pattern MP3 in the scribe line region SL according to some embodiments of the present disclosure, FIG. 6B is a layout of the active region of the contact-to-gate monitor pattern MP3 in the scribe line region SL, and FIG. 6C is an enlarged view of a portion of FIG. 5A. As illustrated in the top view of FIG. 6A, the contact-to-monitor pattern MP3 includes a plurality of separate first active regions 921, which are arranged in an alternating manner with the gate structures 931-936. No first isolation structure is surrounded by a single first active region 921. These first active regions 921 each have a length in Y-direction and a width in X-direction less than the length thereof. In this manner, the first active regions 921 have longitudinal axes substantially parallel with longitudinal axes of the gate structures 931-936 and the dummy gate structures 961-968. In some embodiments, the dummy gate structures 961-968 are respectively disposed within boundaries of the first active regions 921. Therefore, the dummy gate structures 961-968 respectively overlap with the first active regions 921.

As illustrated in the enlarged view of FIG. 6C, opposing Y-directional edges of the gate structure 931 are respectively separated from first active regions 921 along X-direction by non-zero distances D301 and D302, which are greater than the width of the contact 951 in X-direction. In this manner, the contacts 951 non-overlap with the first active regions 921 and the gate structure 931. In some embodiments, the non-zero distances D301 and D302 are different. In some other embodiments, the non-zero distances D301 and D302 are the same. In some embodiments, the non-zero distances D301 and D302 are in a range from about 0.001 μm to about 1 μm. The distances D301 and D302 up to about 1 μm allows for measuring breakdown voltage of high voltage (HV) devices.

Figure 7A:
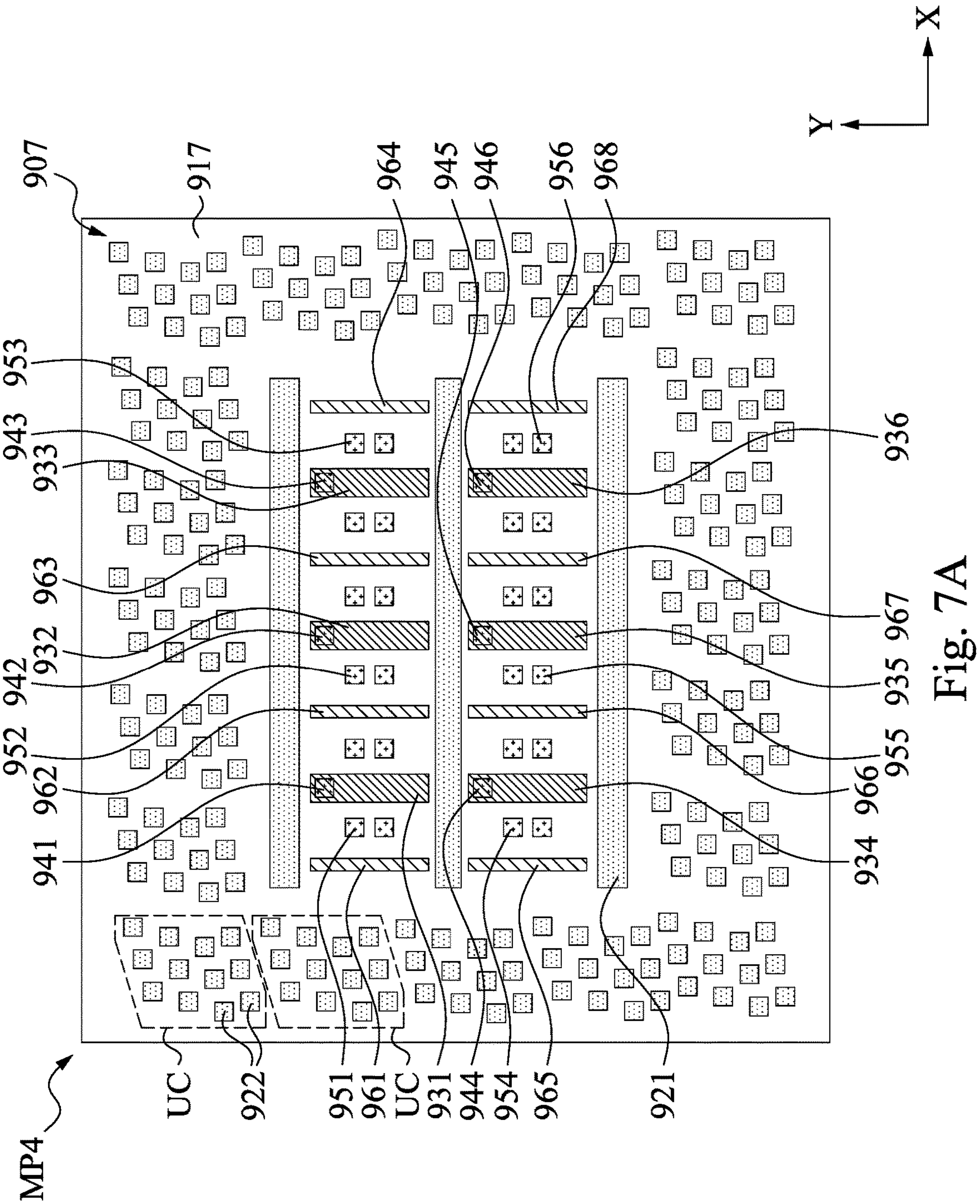
FIG. 7A is an overlaid layout of various levels of a contact-to-gate monitor pattern in a scribe line region according to some embodiments of the present disclosure.
Figure 7B:
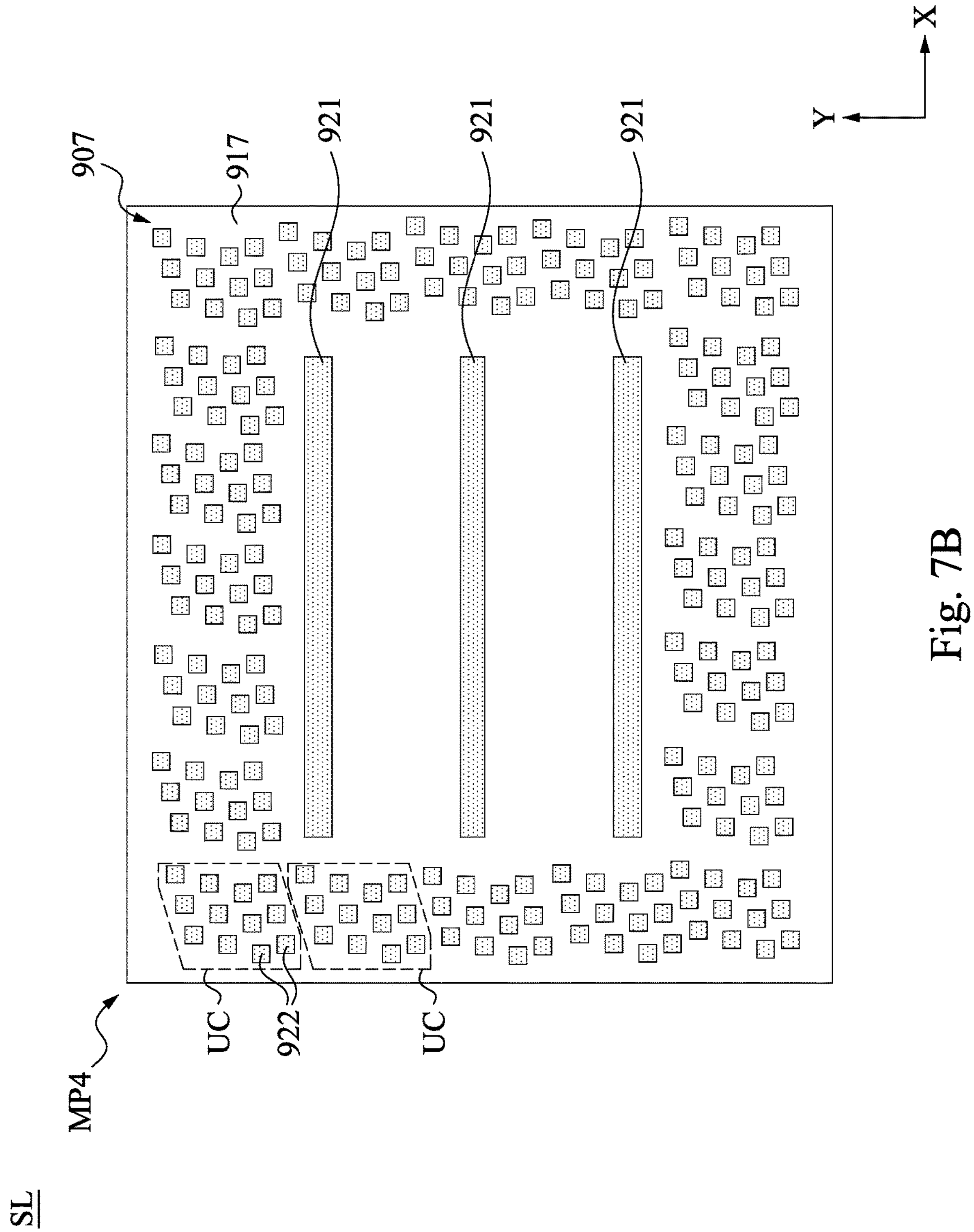
FIG. 7B is a layout of the active region of the contact-to-gate monitor pattern in the scribe line region of FIG. 7A.
Figure 7C:
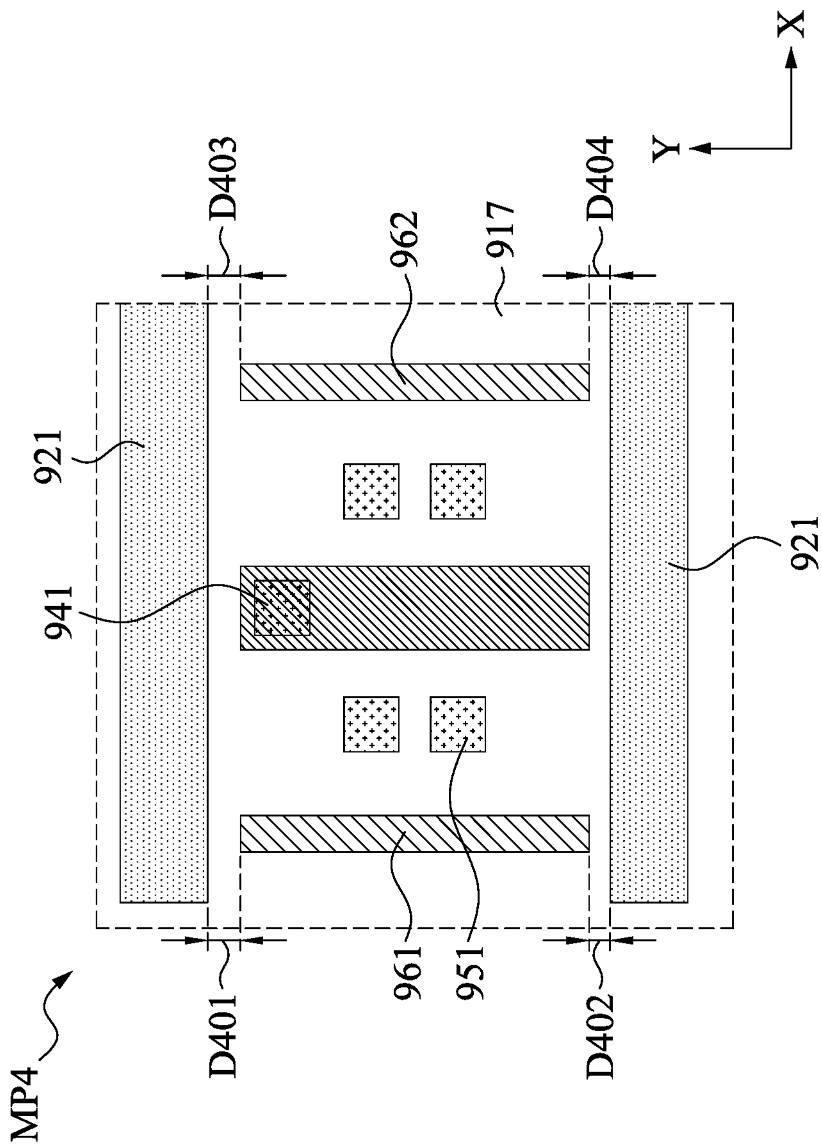
FIG. 7C is an enlarged view of a portion of the contact-to-gate monitor pattern in the scribe line region of FIG. 7A.

FIG. 7A is an overlaid layout of various levels of another contact-to-monitor pattern MP4 in the scribe line region SL according to some embodiments of the present disclosure, FIG. 7B is a layout of the active region of the contact-to-gate monitor pattern MP4 in the scribe line region SL, and FIG. 7C is an enlarged view of a portion of FIG. 7A. As illustrated in the top view of FIG. 7A, the dummy gate structures 961-968 non-overlap with the first active regions 921. Moreover, the first active regions 921 each have a length in X-direction and a width in Y-direction less than the length thereof. Therefore, longitudinal axes of the first active regions 921 are substantially perpendicular to the longitudinal axes of the gate structures 931-936 and the dummy gate structures 961-968.

As illustrated in the enlarged view of FIG. 7C, opposing X-directional edges of the dummy gate structure 961 are respectively set back from the first active regions 921 along Y-direction by non-zero distances D401 and D402. In some embodiments, the non-zero distances D401 and D402 are different. In some other embodiments, the non-zero distances D401 and D402 are the same. Similarly, opposing X-directional edges of the dummy gate structure 962 are respectively set back from the separate first active regions 921 along Y-direction by non-zero distances D403 and D404. In some embodiments, the non-zero distances D403 and D404 are different. In some other embodiments, the non-zero distances D403 and D404 are the same. The non-zero distances D401 and D403 may be the same or different, and the non-zero distances D402 and D404 may be the same or different as well. In some embodiments, the non-zero distances D401-D404 are in a range from about 0.001 μm to about 1 μm. Excessively small distances D401-D404 might lead to an unsatisfactory overlay window that impedes lithography processes of forming the dummy gate structures 961, 962 and/or the STI region 917.

FIGS. 8A-37B illustrate diagrammatic cross-sectional views of a semiconductor substrate (e.g., wafer) 210 at respective stages of a manufacturing process of forming flash memory cells, peripheral circuits and contact-to-gate monitor patterns. The "A" figures (e.g., FIGS. 8A, 9A, 10A, etc.) show portions of one of a plurality of IC die regions 100, like the device described above with reference to FIG. 3, which are to be eventually separated as respective IC dies from the wafer 210. The "B" figures (e.g., FIGS. 8B, 9B, 10B, etc.) show the contact-to-gate monitor pattern, formed in a scribe line region SL of the wafer 210, as described above with reference to FIGS. 4A-7B. It is understood that additional steps may be implemented before, during, or after the manufacturing process, and some of the steps described may be replaced or eliminated for other embodiments of the manufacturing process.

Figure 8A:
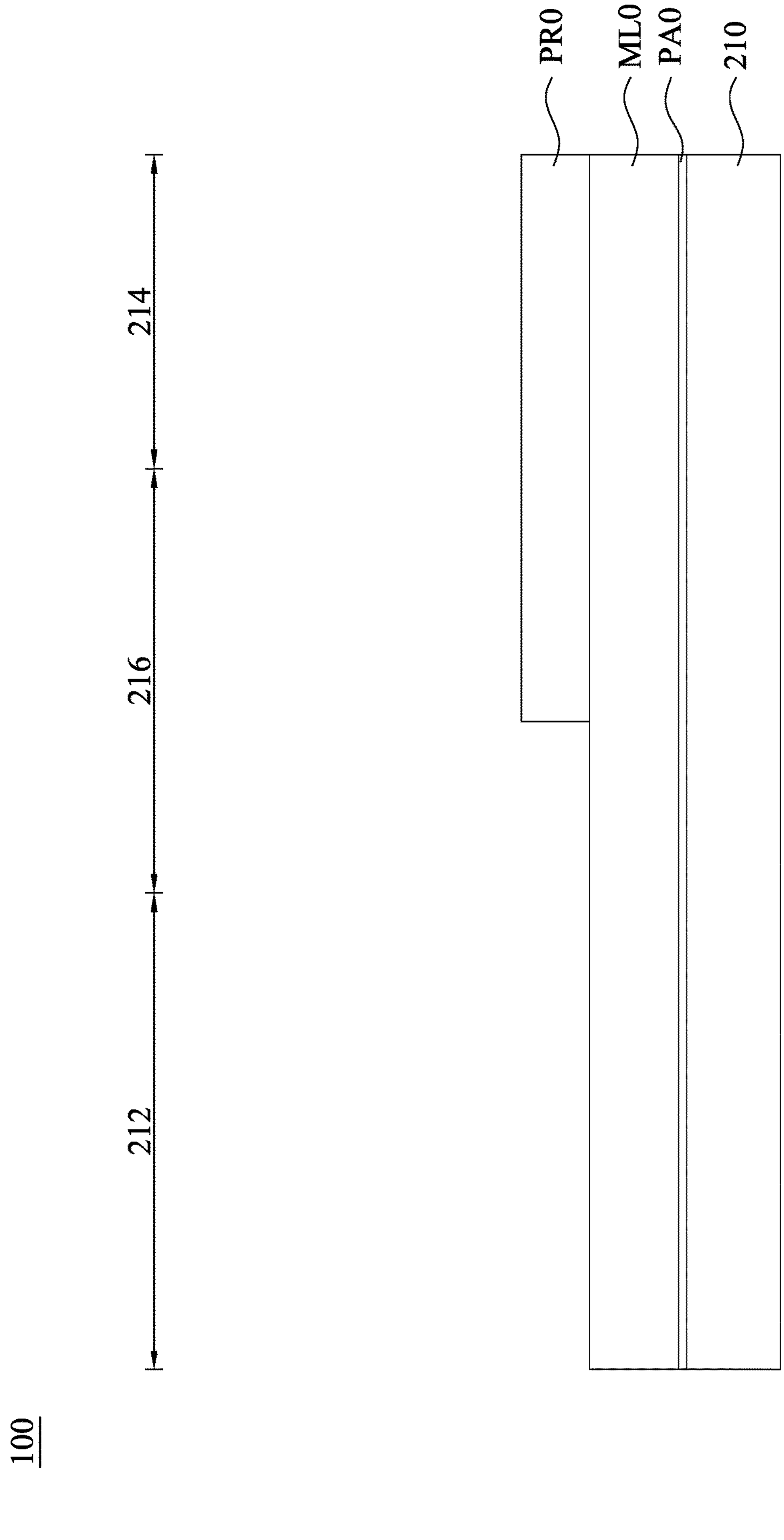
FIGS. 8A-37B illustrate diagrammatic cross-sectional views of a semiconductor substrate at respective stages of a manufacturing process of forming flash memory cells, peripheral circuits and contact-to-gate monitor patterns, according to some embodiments of the present disclosure.
Figure 8B:
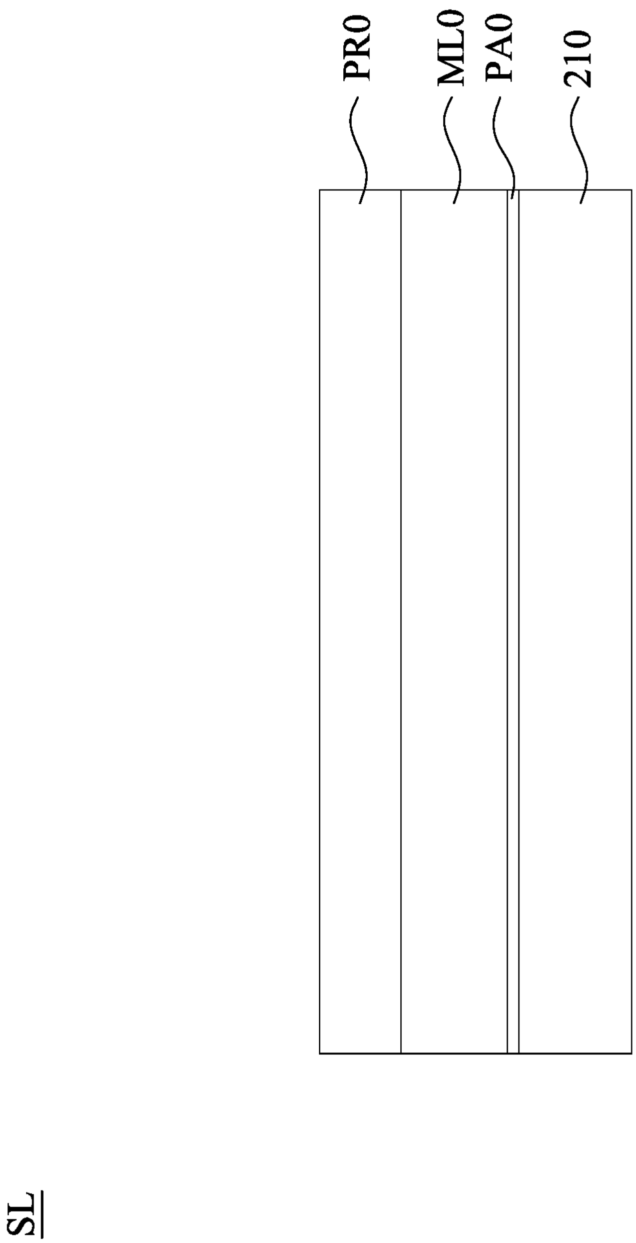

As illustrated in FIGS. 8A and 8B, a pad layer PA0 and a mask layer ML0 are in sequence over the semiconductor substrate 210. In some embodiments, the semiconductor substrate 210 can be a bulk silicon substrate, a germanium substrate, a compound semiconductor substrate, or other suitable substrate. In some embodiments, the semiconductor substrate 210 may include an epitaxial layer overlying a bulk semiconductor, a silicon germanium layer overlying a bulk silicon, a silicon layer overlying a bulk silicon germanium, or a semiconductor-on-insulator (SOI) substrate. The substrate 210 includes die regions 100 each having a flash memory array region 212, a peripheral circuit region 214, and a transition region 216. The peripheral circuit region 214 is located at an edge of the flash memory array region 212. For example, the peripheral circuit region 214 surrounds the flash memory array region 212. The transition region 216 is between the flash memory array region 212 and the peripheral circuit region 214. Moreover, the substrate 210 includes a scribe line region SL surrounding the die region 100.

The pad layer PA0 and the mask layer ML0 may be deposited over entire substrate 210 using suitable deposition techniques, such as atomic layer deposition (ALD), chemical vapor deposition (CVD), physical vapor deposition (PVD) or the like. In this way, the flash memory array region 212, the peripheral circuit region 214, the transition region 216, and the scribe line region SL are covered by the pad layer PA0 and the mask layer ML0. The pad layer PA0 may be formed of a dielectric material, such as an oxide layer, and the mask layer ML0 may be formed of a different dielectric material than the pad layer PA0, such as silicon nitride (SiN) or other suitable materials. In some embodiments, the mask layer ML0 is thicker than the pad layer PA0.

A photoresist PRO is then coated on the mask layer ML0 and patterned to expose a portion of the mask layer ML0 in the flash memory array region 212 and a portion of the transition region 216 using suitable photolithography techniques. After patterning the photoresist PRO, another portion of the mask layer ML0 in the peripheral circuit region 214 and the scribe line region SL remains covered by the patterned photoresist PRO.

Figure 9A:
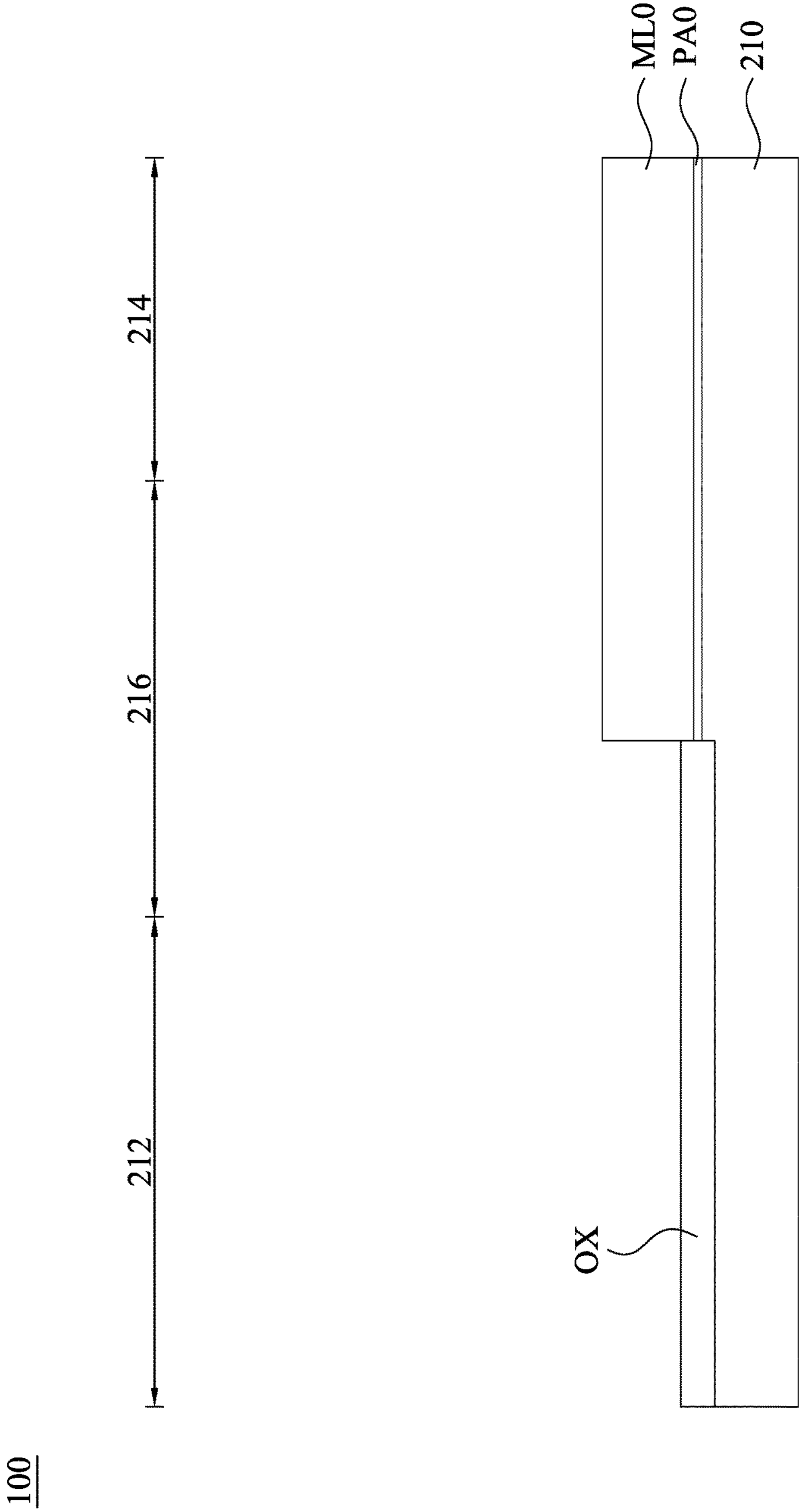
Figure 9B:
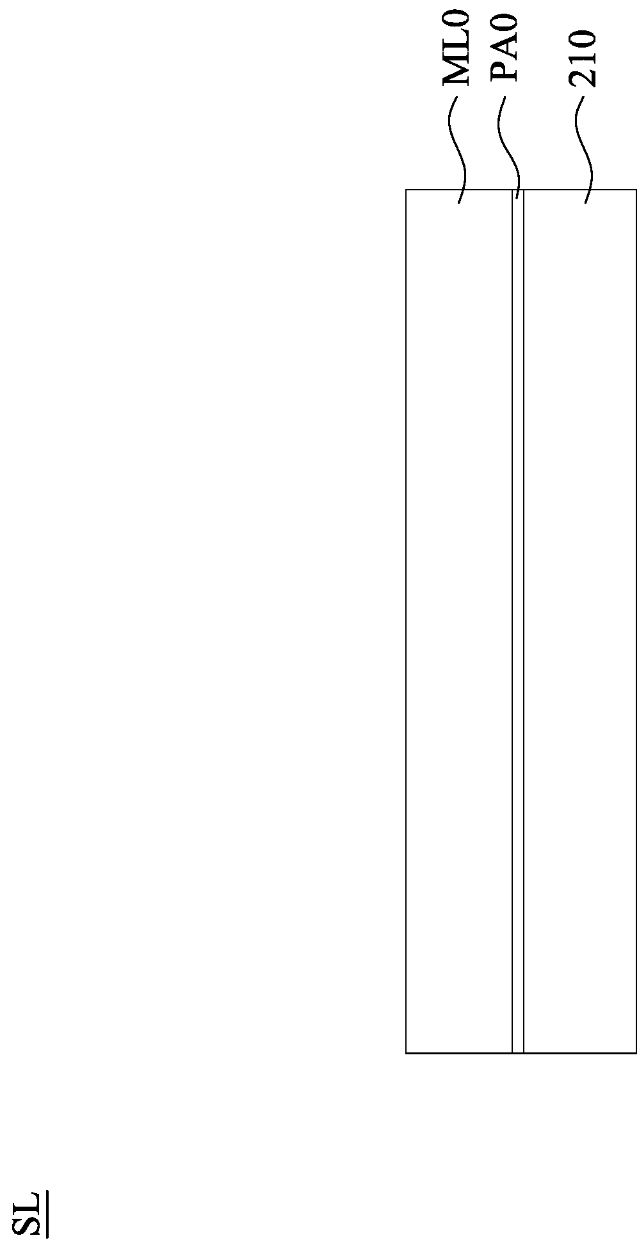

As illustrated in FIGS. 9A and 9B, the exposed portion of the mask layer ML0 and the underlying portion of the pad layer PA0 are removed using one or more etching processes to expose a portion of the substrate 210. After etching the mask layer ML0 and the pad layer PA0, the photoresist PRO is removed, for example, in an ashing step. Thereafter, the exposed portion of the substrate 210 is oxidized to form an oxide layer OX using, for example, wet oxidation. The peripheral circuit region 214 and the scribe line region SL are free from oxidation because they are covered by the mask layer ML0 and the pad layer PA0 during the oxidation process.

Figure 10A:
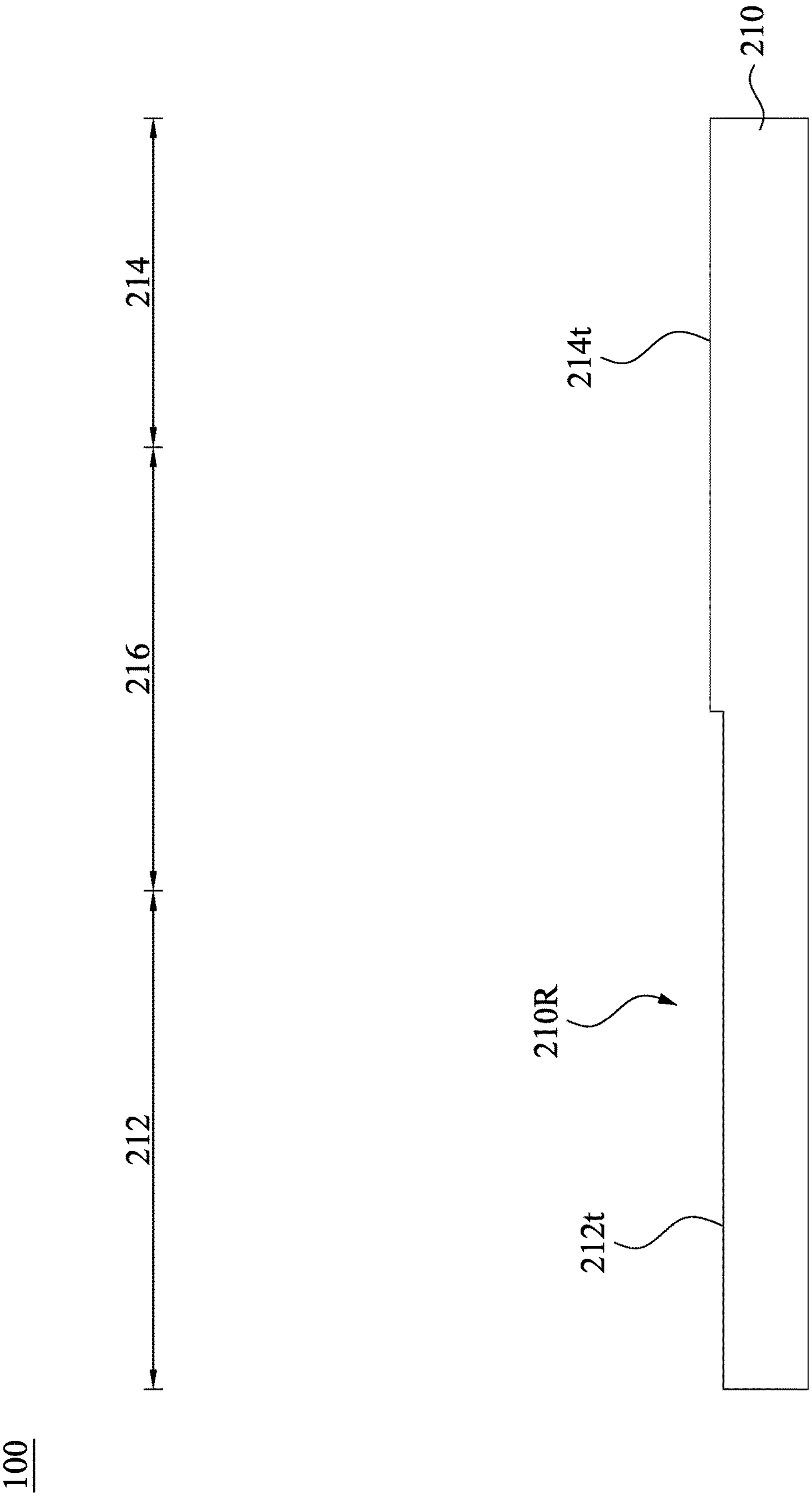
Figure 10B:
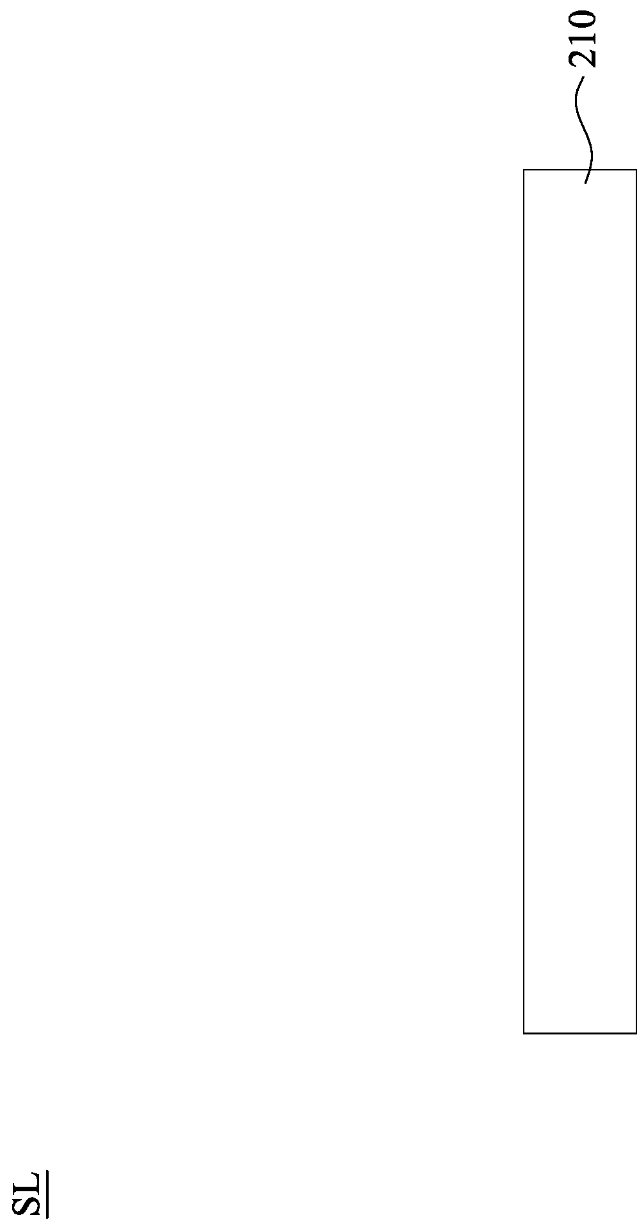

Afterwards, the mask layer ML0, the pad layer PA0 and oxide layer OX are removed from the substrate 210 using one or more etching processes including, for example, wet etching, dry etching, or a combination of wet etching and dry etching. The resultant structure is shown in FIGS. 10A and 10B. The removal of the oxide layer OX results in a recess 210R in the flash memory array region 212. For example, a top surface 212*t* of the flash memory array region 212 is lower than a top surface 214*t* of the peripheral circuit region 214 and a top surface of the scribe line region SL. In some embodiments, the depth of the recess 210R is about 50 Angstroms to about 2000 Angstroms.

Figure 11A:
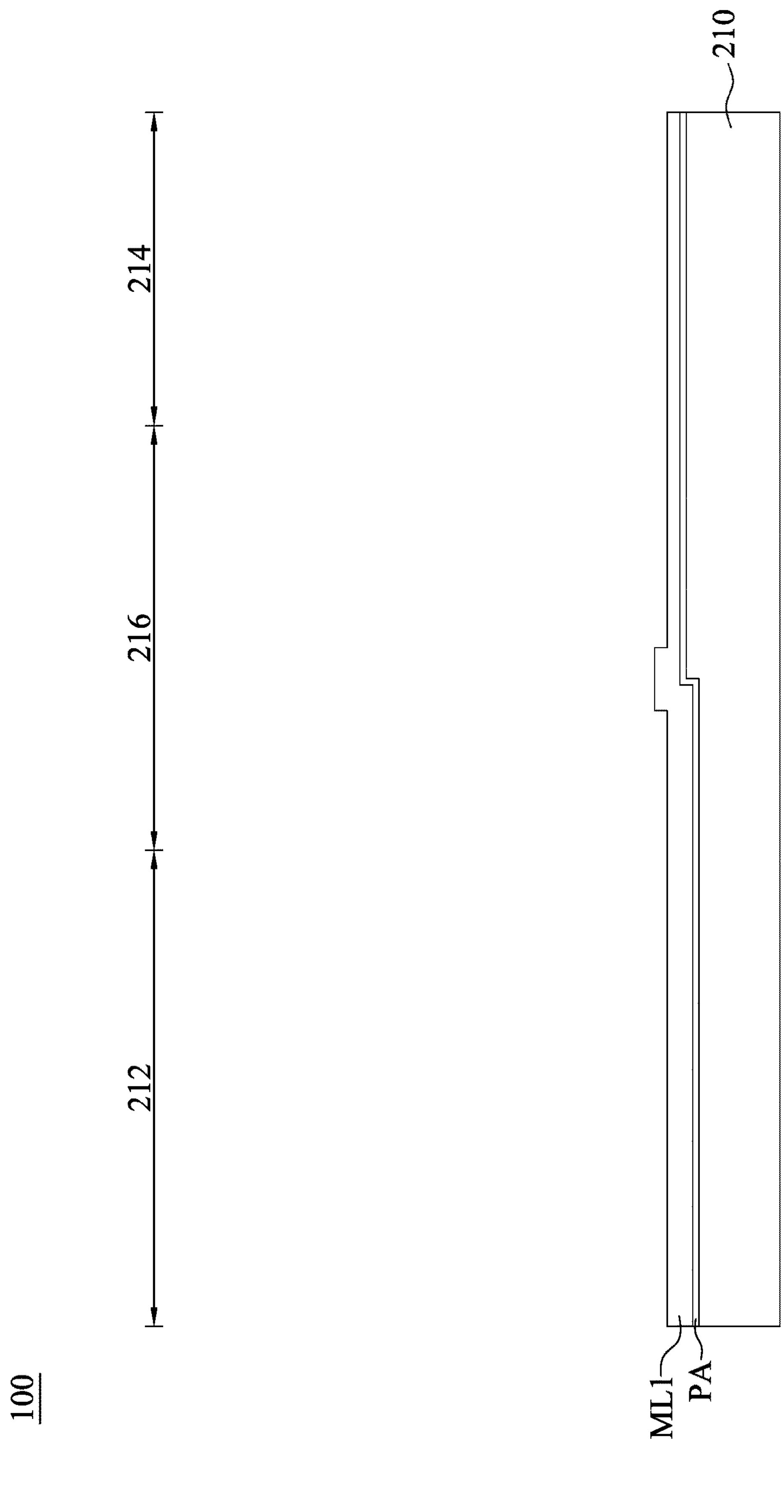
Figure 11B:
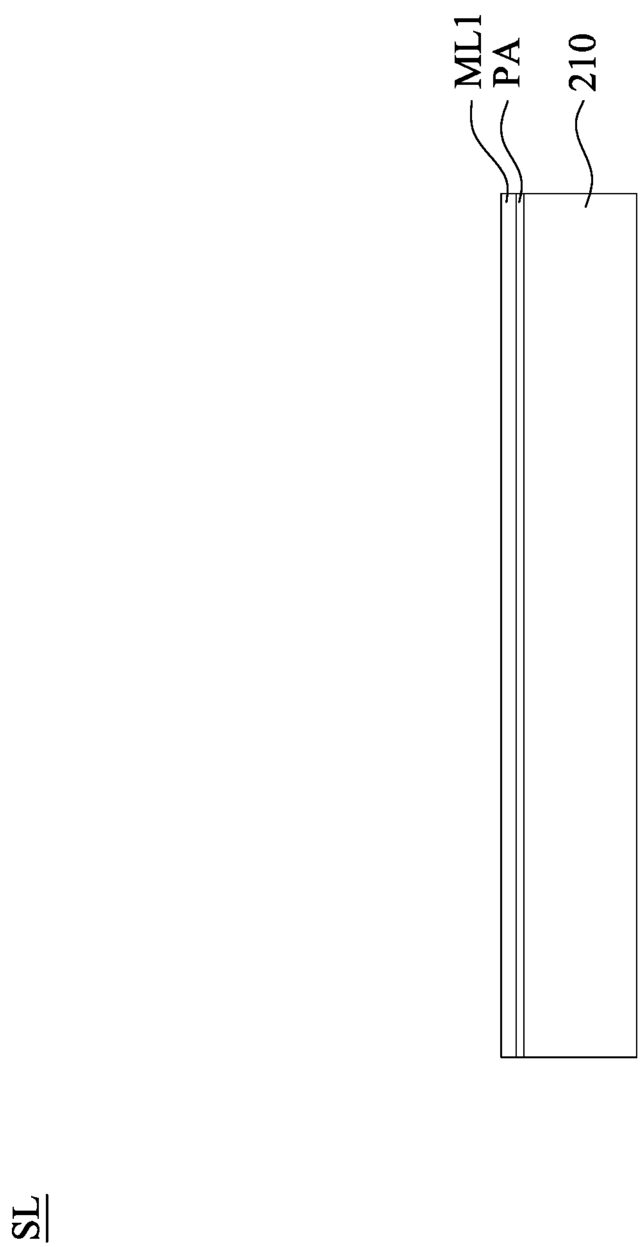

As illustrated in FIGS. 11A and 11B, a pad layer PA and a mask layer ML1 are conformally formed over the semiconductor substrate 210 in sequence. In some embodiments, the pad layer PA may be formed of a dielectric material, such as an oxide layer. The mask layer ML1 may be made of a different dielectric material than the pad layer PA, such as silicon nitride or other suitable materials. In some embodiments, the mask layer ML1 is thicker than the pad layer PA. The mask layer ML1 may include a single layer or multiple layers. In some embodiments, the pad layer PA and the mask layer ML1 may be formed using CVD, PVD, ALD, other suitable processes, or combinations thereof. After depositing the mask layer ML1, an optional etching process can be performed to etch back a portion of the mask layer ML1 in the peripheral circuit region 214 and the scribe line region SL. During the etching process, the flash memory array region 212 can be protected by a patterned photoresist (not shown), and the patterned photoresist can be removed after the etching process using, for example, an ashing process.

Figure 12A:
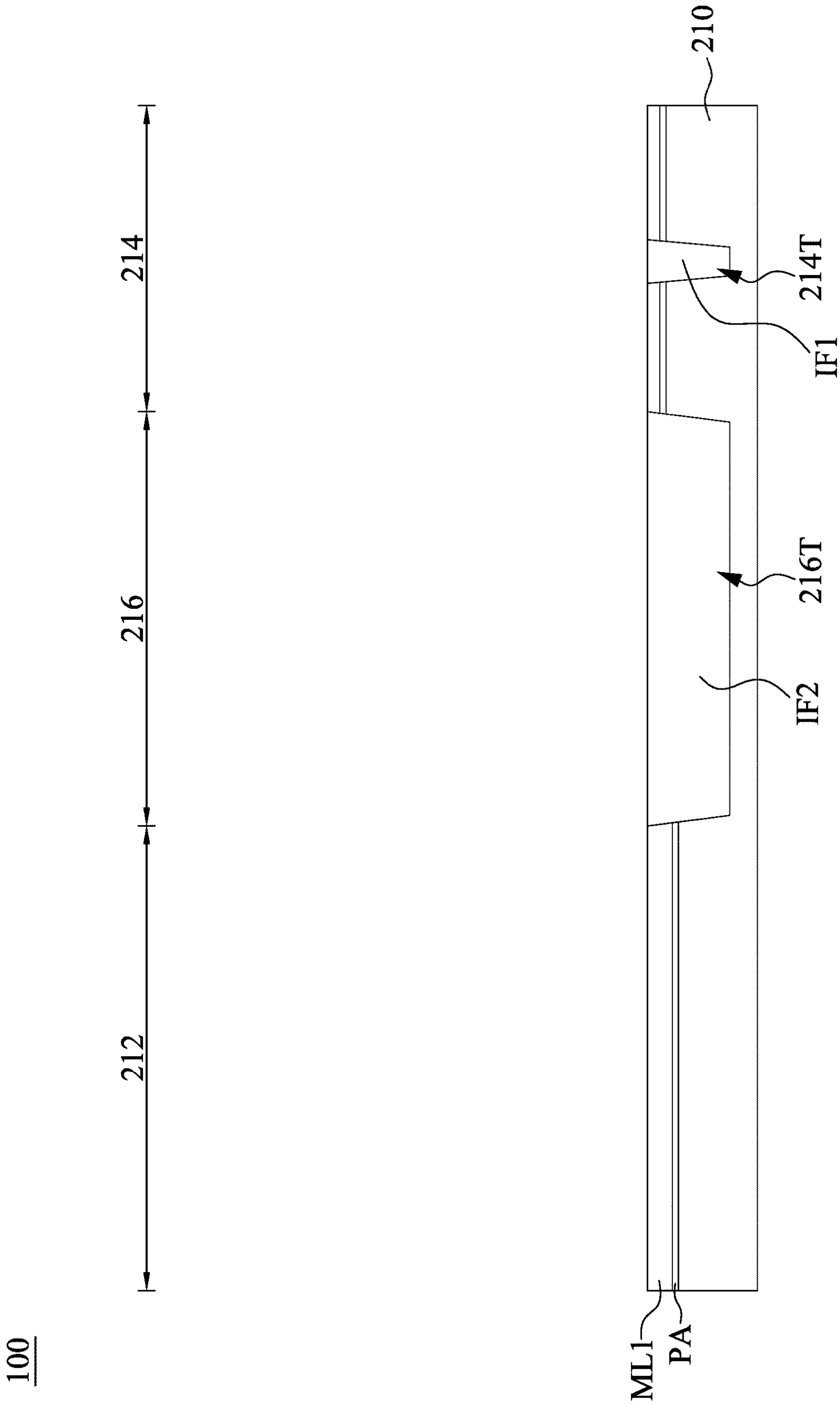
Figure 12B:
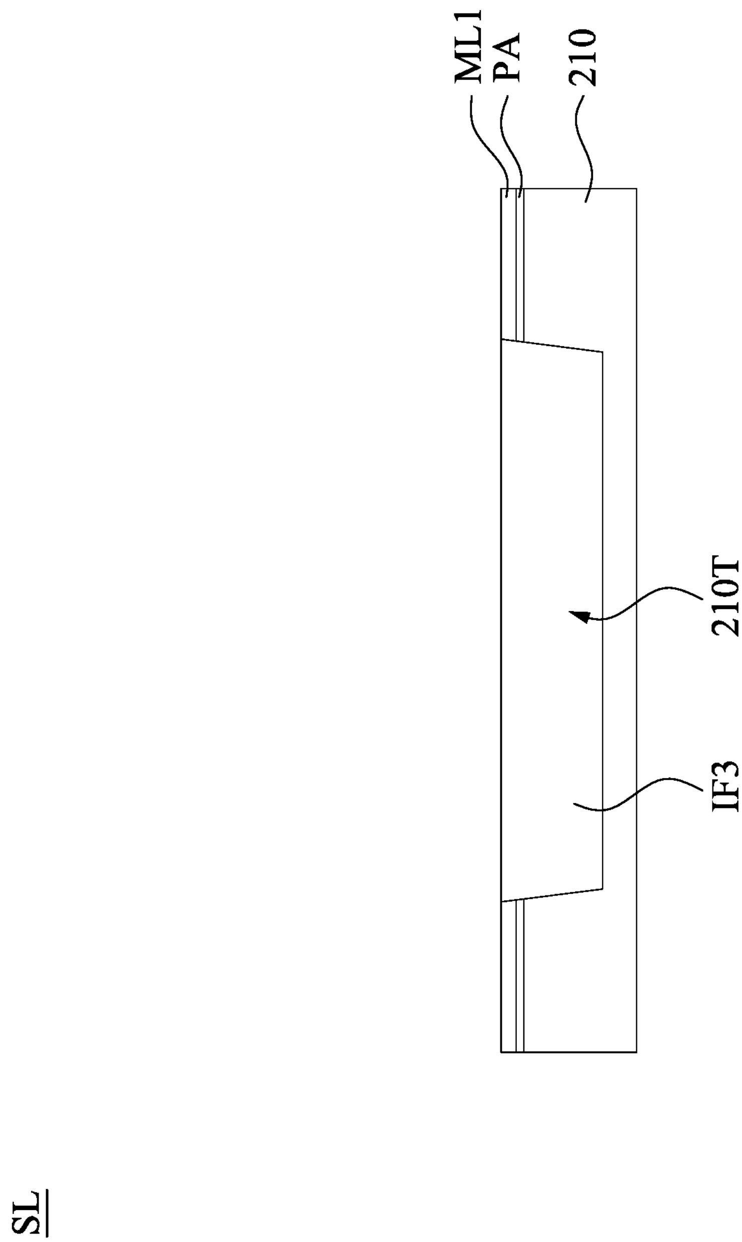

As illustrated in FIGS. 12A and 12B, isolation structures IF1, IF2 and IF3 are formed in the substrate 210 and through the pad layer PA and the mask layer ML1. Specifically, prior to the formation of the isolation structures IF1 and IF2, trenches 214T and 216T are respectively formed in peripheral circuit region 214 and the transition region 216 in the substrate 210, and trenches 210T are formed in the scribe line region SL in the substrate 210. The trenches 210T, 214T and 216T are formed by forming a photoresist over the structure of FIGS. 11A and 11B, the photoresist covering some portions of the mask layer ML1 while leaving other regions of the mask layer ML1 exposed, performing an etch process to remove the exposed portions of the mask layer ML1 so as to pattern the mask layer ML1, and performing an etch process to remove portions of the pad layer PA exposed by the patterned mask ML1 and the corresponding portions of the substrate 210 underneath. As such, trenches 210T, 214T and 216T are formed.

Afterwards, a dielectric material overfills the trenches 210T, 214T and 216T. In some embodiments, the dielectric material includes oxide and/or other dielectric materials. Optionally, a liner oxide (not shown) may be formed in advance. In some embodiments, the liner oxide may be a thermal oxide. In some other embodiments, the liner oxide may be formed using in-situ steam generation (ISSG). In yet some other embodiments, the liner oxide may be formed using selective area chemical vapor deposition (SACVD) or other CVD methods. The formation of the liner oxide reduces the electrical fields and hence improves the performance of the resulting semiconductor device. A chemical mechanical polish (CMP) is then performed to substantially level the top surface of the dielectric material with the top surfaces of the patterned mask ML1 to form isolation structures IF1, IF2 and IF3 in the trenches 214T, 216T and 210T, respectively. The resultant isolation structure IF1 is thus in the peripheral circuit region 214 of the substrate 210, the resultant isolation structure IF2 is thus in the transition region 216 of the substrate 210, and the resultant isolation structure IF3 is thus in the scribe line region SL of the substrate 210.

Notably, the CMP process might result in dishing effect on the resultant isolation structures (e.g., IF1, IF2 and/or IF3), thus leading to concave top surfaces on the resultant isolation structures. The larger the isolation structure, the more severe the dishing effect. However, because the top surface of the isolation structures IF3 in the scribe line region SL has a reduced area as compared to typical contact-to-gate monitor patterns, the dishing effect on the isolation structures IF3 can be alleviated. A top view of the contact-to-gate monitor pattern of FIG. 12B may be similar to, for example, FIG. 4B, 5B or 6B, and thus will not be repeated herein for the sake of brevity.

Figure 13A:
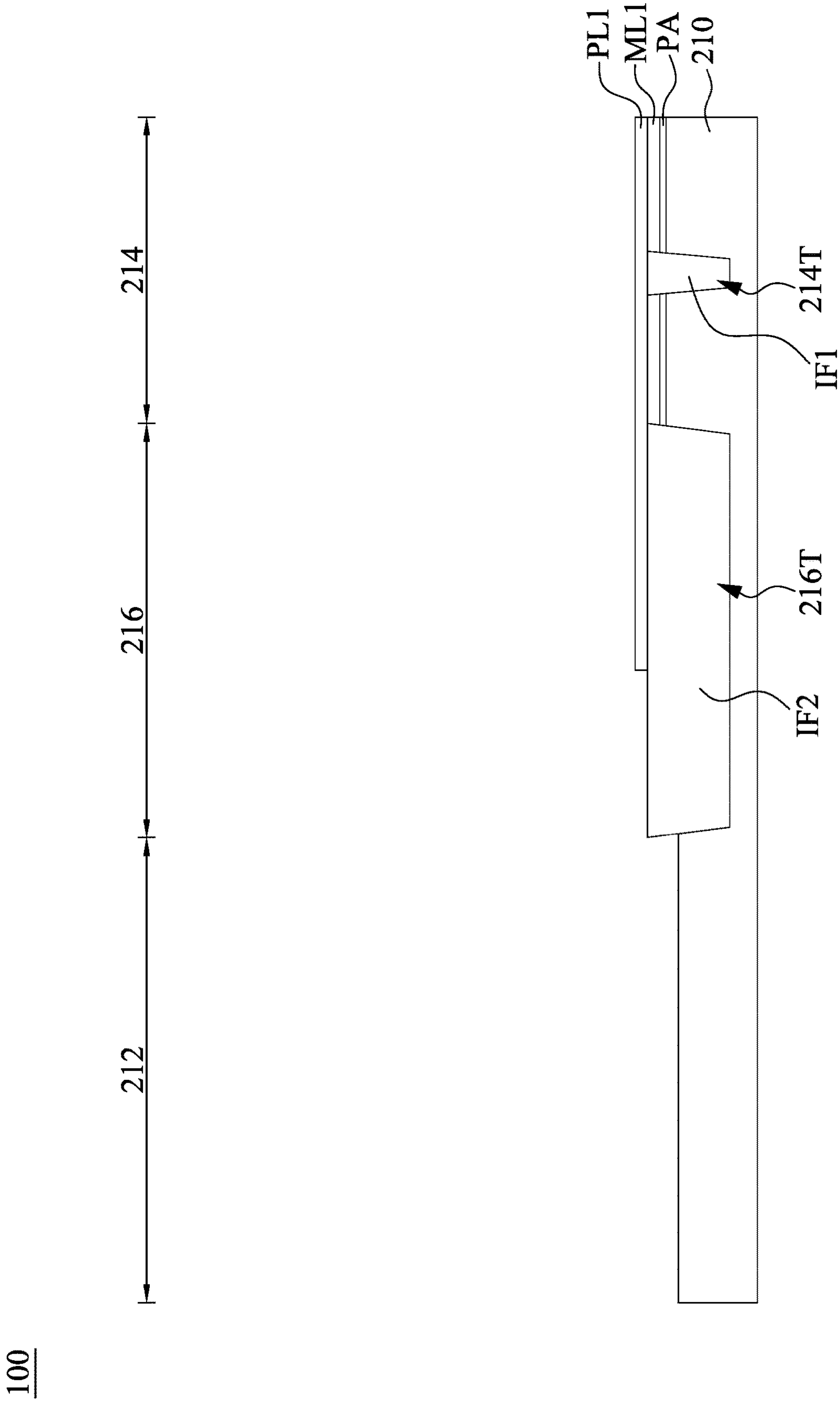
Figure 13B:
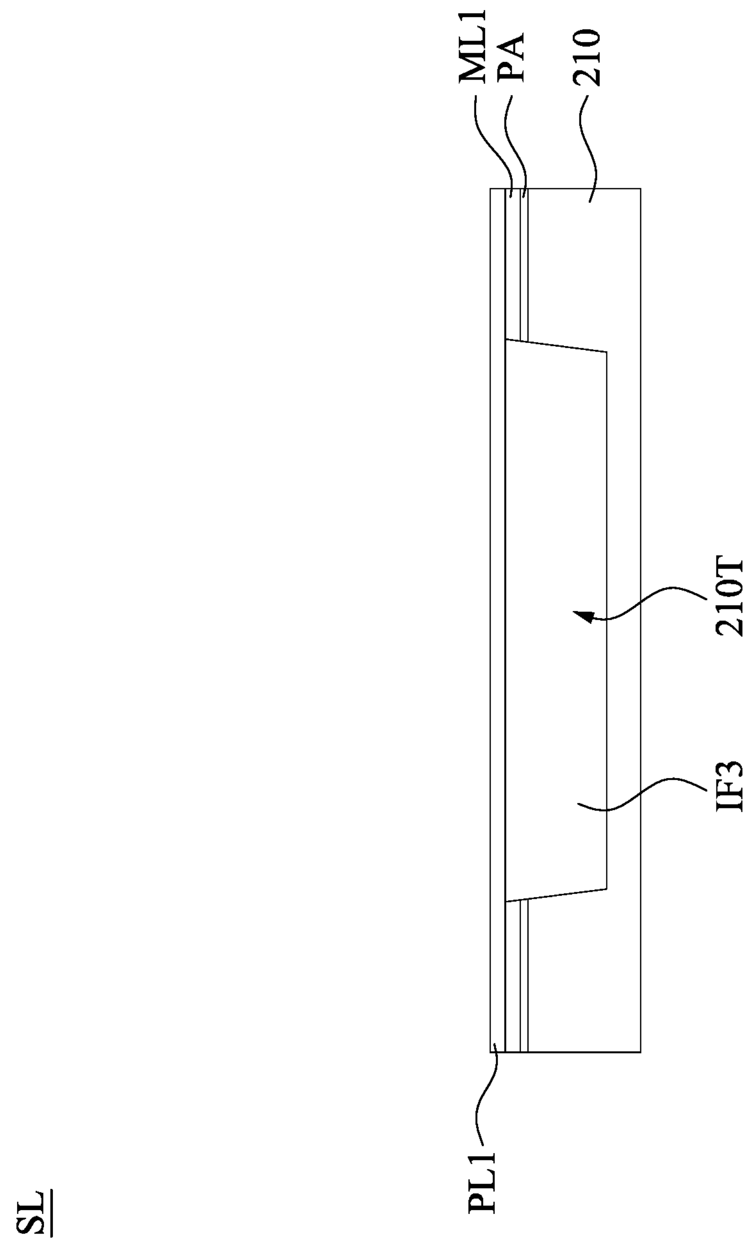

As illustrated in FIGS. 13A and 13B, a protective layer PL1 is formed over the peripheral circuit region 214 and the scribe line region SL of the substrate 210. The protective layer PL1 is, for example, made of silicon oxide, silicon nitride, other suitable material, or the combination thereof. Formation of the protective layer PL1 includes, for example, depositing a blanket layer of protective material over the substrate 210, followed by patterning the blanket layer to form the protective layer PL1 over the peripheral circuit region 214 and the scribe line region SL, but not over the flash memory array region 212. The protective layer PL1 may cover a portion of a top surface of the isolation structure IF2. Afterwards, the pad layer PA and the mask layer ML1 in the flash memory array region 212 exposed by the patterned protective layer PL1 are removed using one or more etching processes.

Figure 14A:
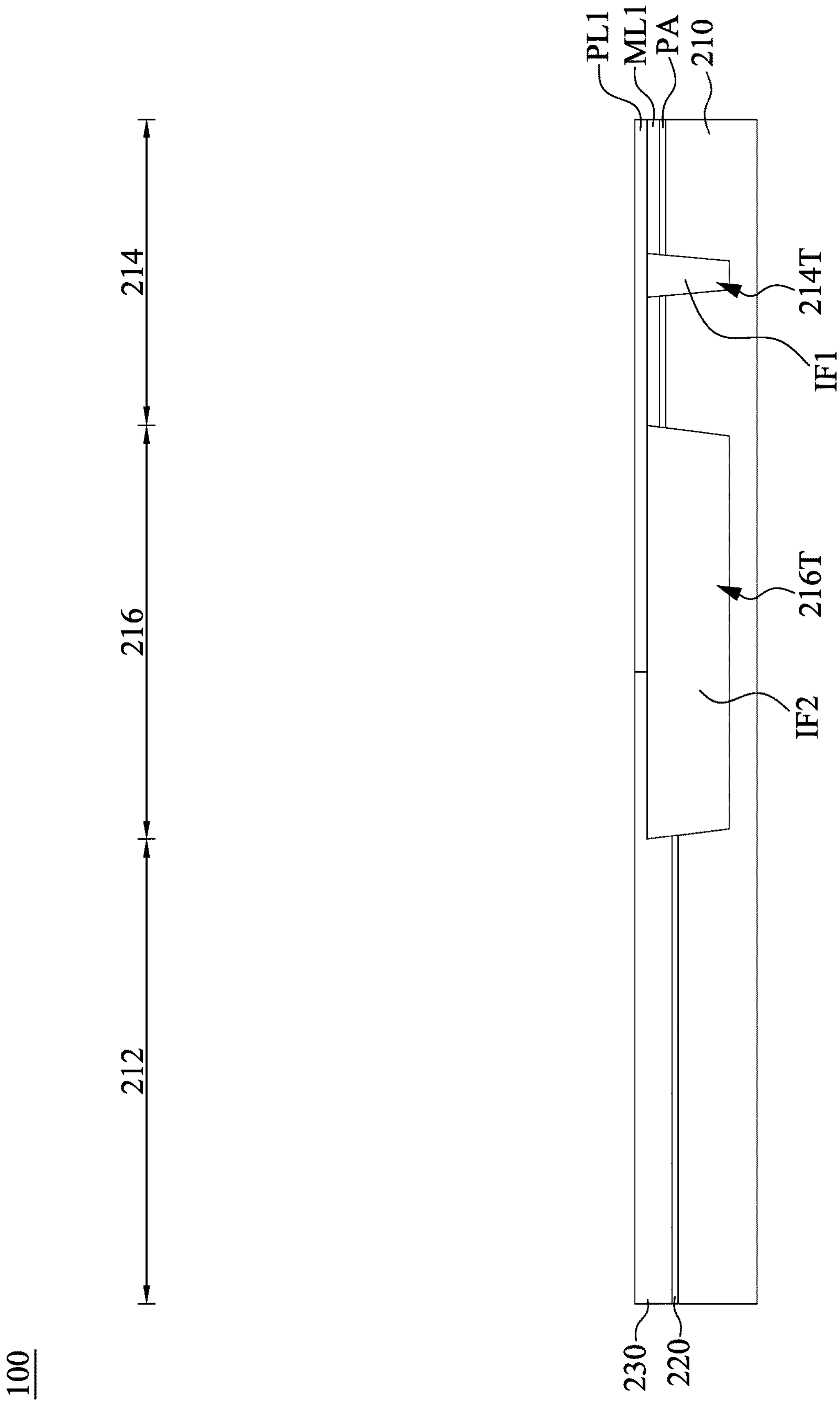
Figure 14B:
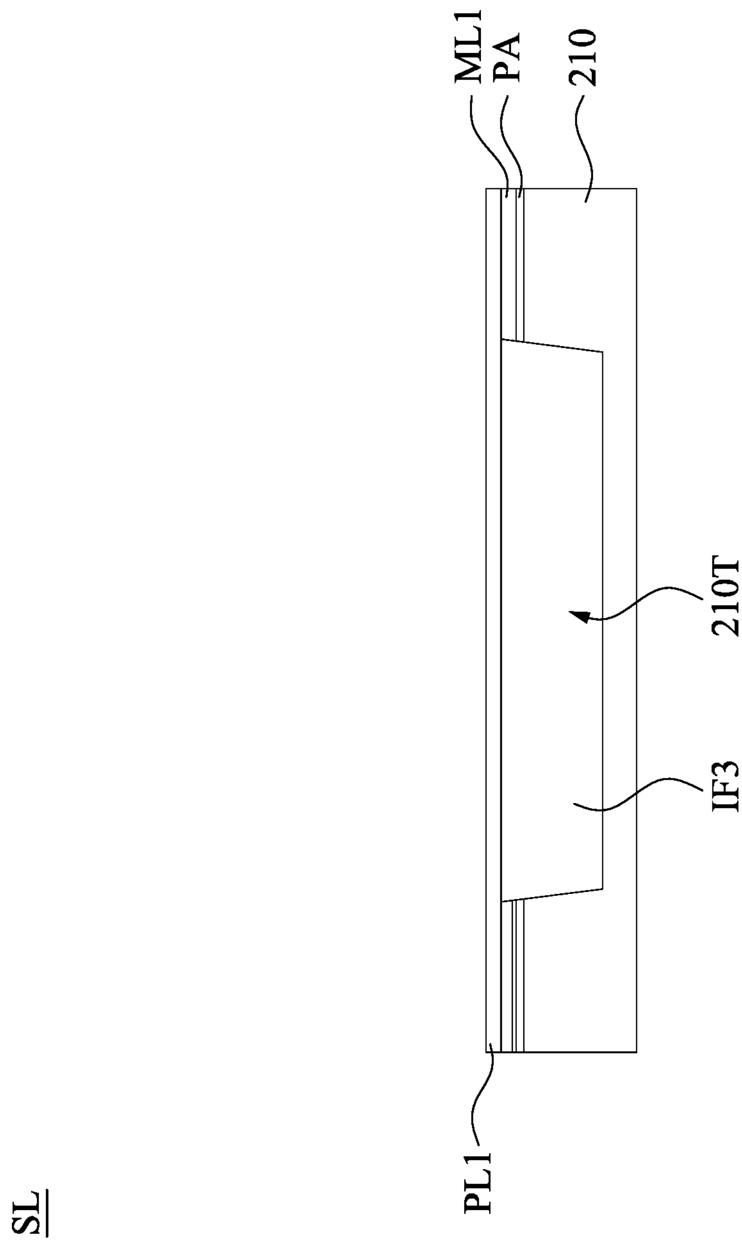

As illustrated in FIGS. 14A and 14B, a tunnel dielectric layer 220 is formed over the substrate 210 exposed by the patterned protective layer PL1, and a floating gate layer 230 is formed over the tunnel dielectric layer 220. The tunnel dielectric layer 220 may include, for example, a dielectric material such as silicon dioxide ($SiO_2$), silicon nitride ($Si_3N_4$), silicon oxynitride (SiON), high-k dielectric materials, other non-conductive materials, or combinations thereof. The tunnel dielectric layer 220 may be formed using thermal oxidation, ozone oxidation, other suitable processes, or combinations thereof. The floating gate layer 230 may include polysilicon formed through, for example low pressure CVD (LPCVD) methods, CVD methods and PVD sputtering methods employing suitable silicon source materials. In some embodiments, the floating gate layer 230 may be ion implanted. In some other embodiments, the floating gate layer 230 may be made of metal, metal alloys, single crystalline silicon, or combinations thereof.

Fabrication of the floating gate layer 230 includes, for example, forming a polysilicon layer is over the entire wafer 210, followed by performing a CMP process on the polysilicon layer until the protective layer PL1 is exposed. The remaining polysilicon layer is referred to as the floating gate layer 230 which is used to form floating gates in the flash memory array region 212. The protective layer PL1 has a higher resistance to the CMP than that of the floating gate layer 230. For example, the protective layer PL1 may serve as a CMP stop layer.

If the isolation structure IF3 in the scribe line region SL has a concave top surface due to dishing effect as discussed previously, a portion of the protective layer PL1 on the isolation structure IF3 would have a concave top surface, because the protective layer PL1 is conformally deposited on the concave top surface of the isolation structure IF3. In this scenario, polysilicon residues might remain on the concave top surface of the protective layer PL1 after performing the CMP on the polysilicon layer, which in turn would result in unacceptable defects in the scribe line region SL. For example, subsequently formed layers in the scribe line region SL might peel from the wafer 210 due to poor adhesion caused by the polysilicon residues.

However, because the isolation structure IF3 has reduced dishing effect as discussed previously, the isolation structure IF3 and the protective layer PL1 have top surfaces with reduced curvature. As a result, the polysilicon residues on the protective layer PL1 on the isolation structure can be decreased, which in turn will reduce the risk of peeling in the scribe line region SL.

Figure 15A:
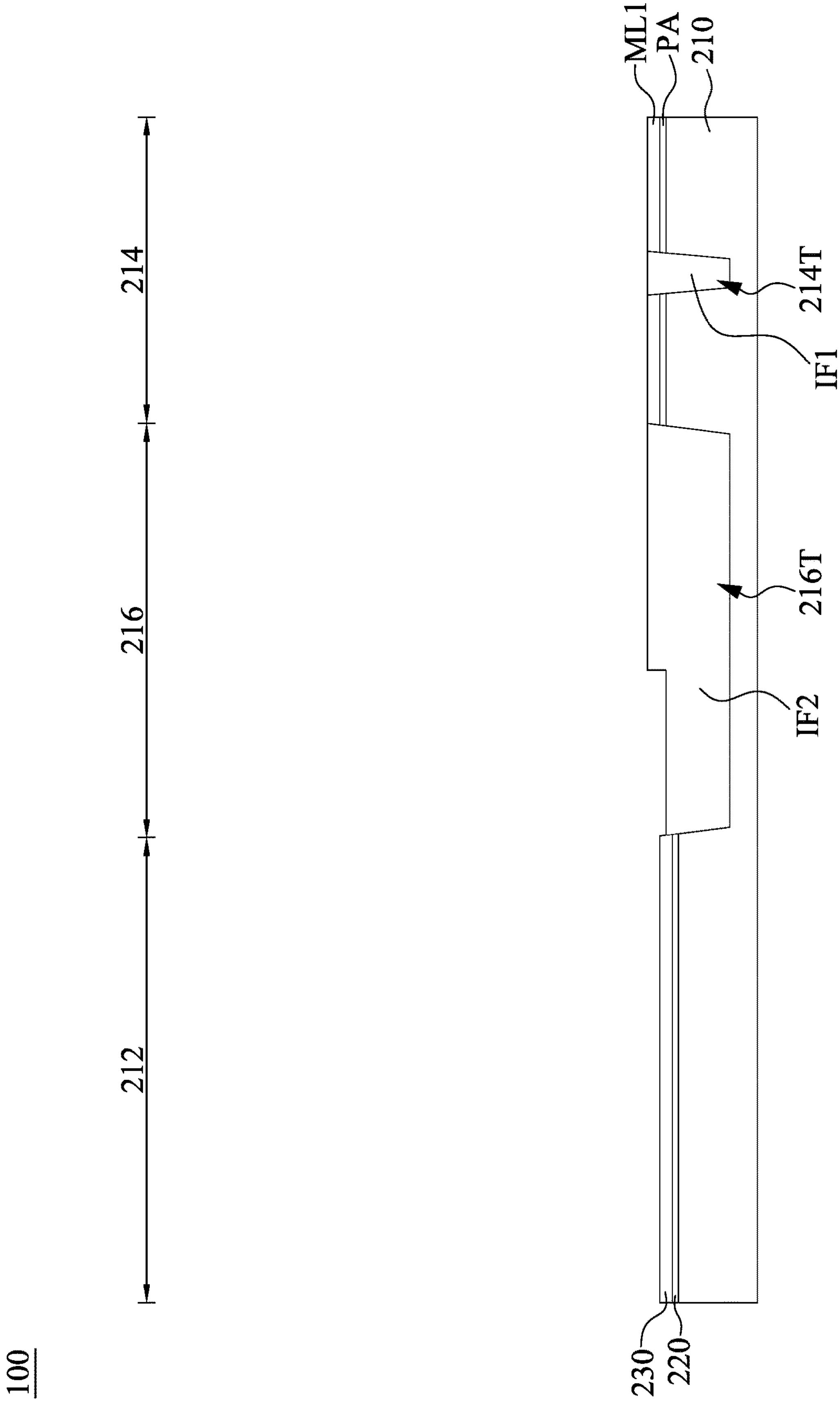
Figure 15B:
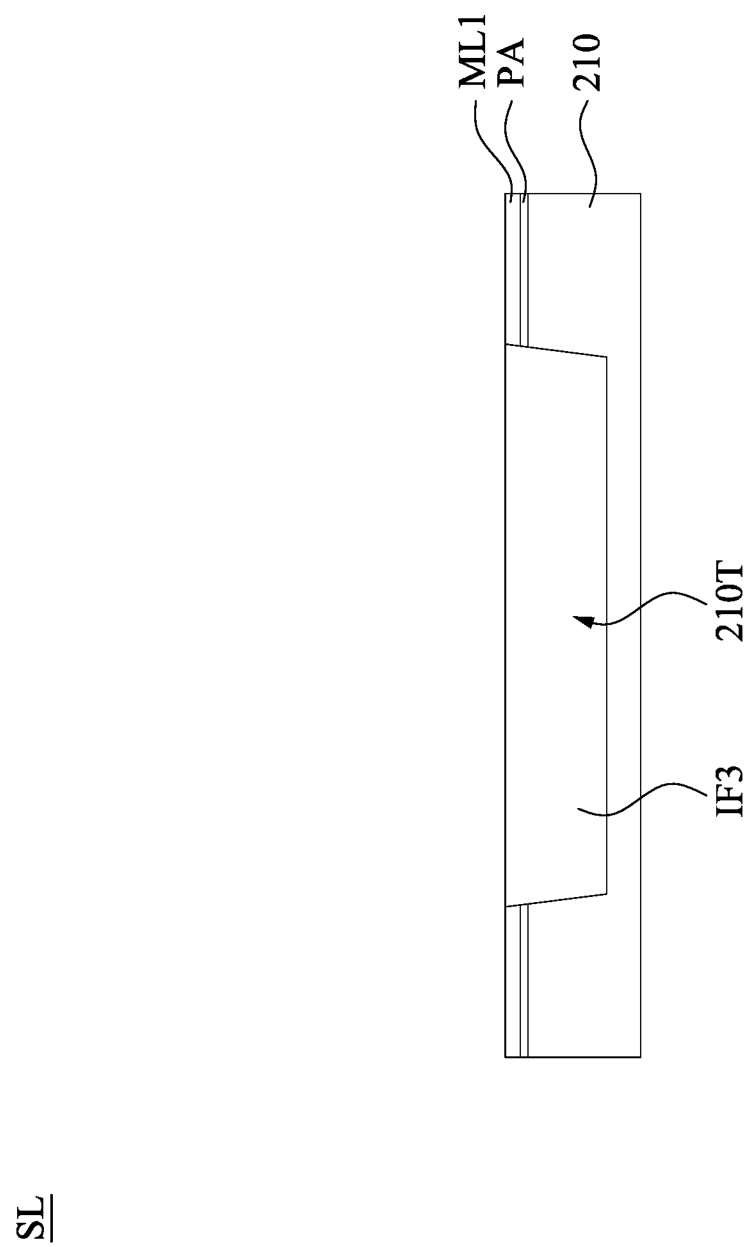

As illustrated in FIGS. 15A and 15B, an etch back process is performed. In some embodiments, the protective layer PL1 (referring to FIGS. 14A and 14B) may have a higher etch resistance to the etch back process than that of the floating gate layer 230 and isolation structures IF1, IF2 and IF3. The floating gate layer 230 and the isolation structure IF2 uncovered by the protective layer PL1 are etched, while the protective layer PL1 remains substantially intact during the etch back process. The etching back may recess a portion of the isolation structure IF2 free from coverage by the protective layer PL1, thus resulting in a notched corner on the isolation structure IF2. In some embodiments, the floating gate layer 230 may have an etch resistance to the etch back process higher than that of the isolation structure IF2, such that after the etching back, the floating gate layer 230 has a top surface higher than that of the recessed portion of the isolation structure IF2. After the etching back, the protective layer PL1 is removed by another etching process using a different etchant than that used in the etch back process.

Figure 16A:
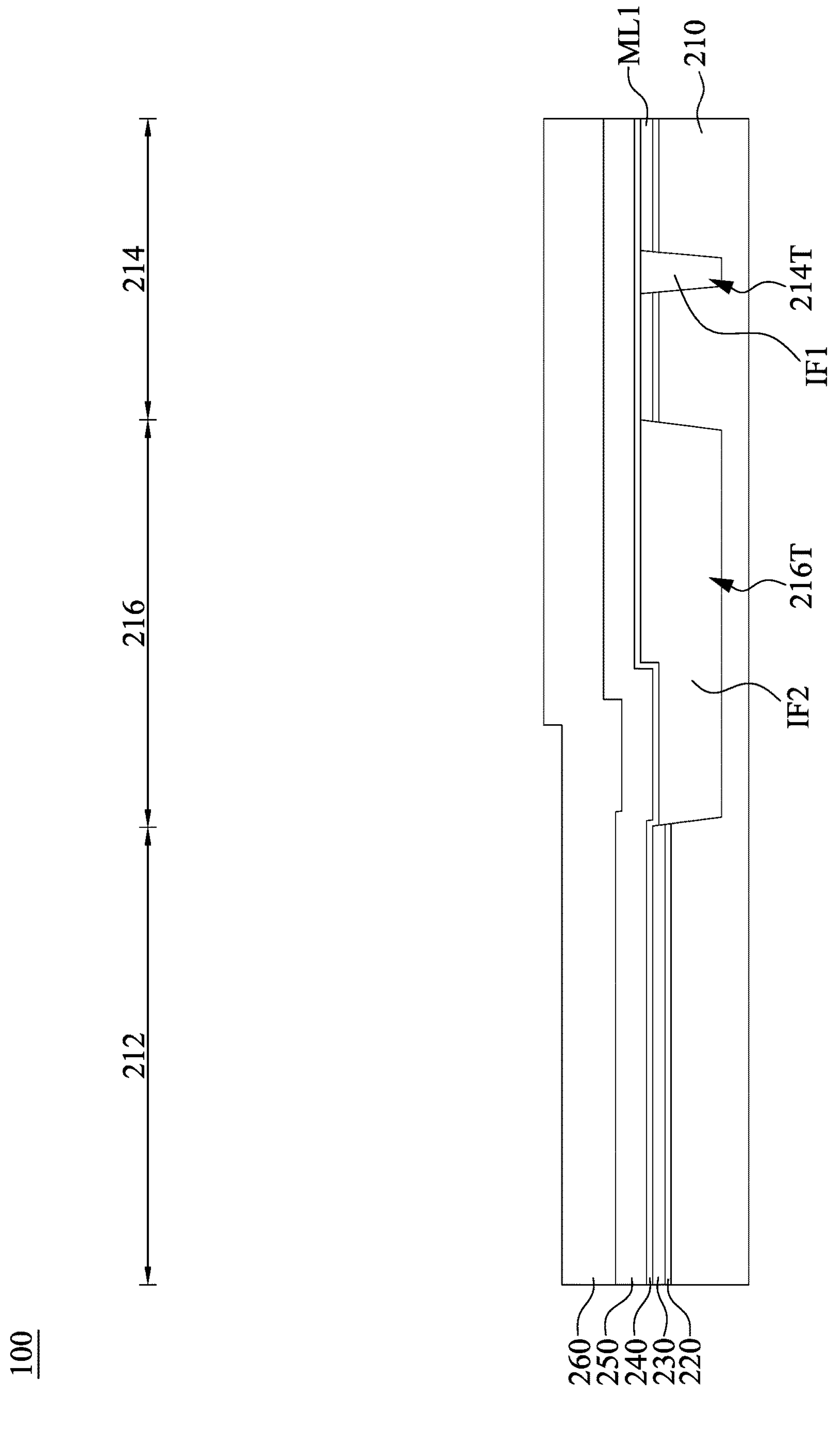
Figure 16B:
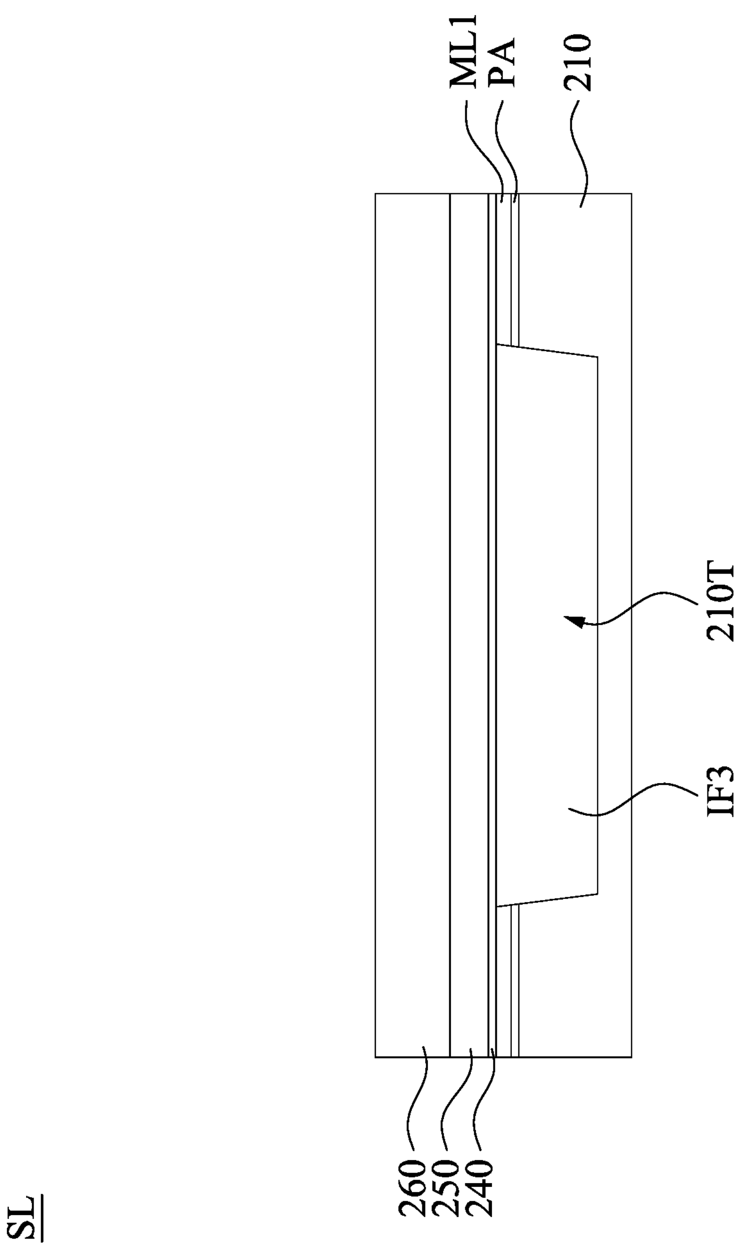

As illustrated in FIGS. 16A and 16B, a blocking layer 240, a control gate layer 250, and a hard mask layer 260 are formed over the substrate 210. The blocking layer 240 is conformally formed over the floating gate layer 230. In some embodiments, the blocking layer 240 and the tunnel dielectric layer 220 may have the same materials. In other embodiments, the blocking layer 240 and the tunnel dielectric layer 220 have different materials. That is, the blocking layer 240 may include, for example, a dielectric material such as silicon dioxide ($SiO_2$), silicon nitride ($Si_3N_4$), oxynitrides (SiON), high-k materials, other non-conductive materials, or combinations thereof. The blocking layer 240 may be formed using chemical vapor deposition (CVD), physical vapor deposition (PVD), atomic layer deposition (ALD), ozone oxidation, other suitable processes, or combinations thereof.

The control gate layer 250 is conformally formed over the blocking layer 240. The control gate layer 250 may include polysilicon formed through, for example low pressure CVD (LPCVD) methods, CVD methods and PVD sputtering methods employing suitable silicon source materials. In some embodiments, the control gate layer 250 may be ion implanted. In some other embodiments, the control gate layer 250 may be made of metal, metal alloys, single crystalline silicon, or combinations thereof. In some embodiments, the control gate layer 250 is thicker than the floating gate layer 230.

The hard mask layer 260 is conformally formed over the control gate layer 250. The hard mask layer 260 may include single layer or multiple layers. In some embodiments, the hard mask layer 260 includes $SiN/SiO_2/SiN$ stacked layers or other suitable materials. In some embodiments, the hard mask layer 260 may be formed using chemical vapor deposition (CVD), physical vapor deposition (PVD), atomic layer deposition (ALD), ozone oxidation, other suitable processes, or combinations thereof.

Figure 17A:
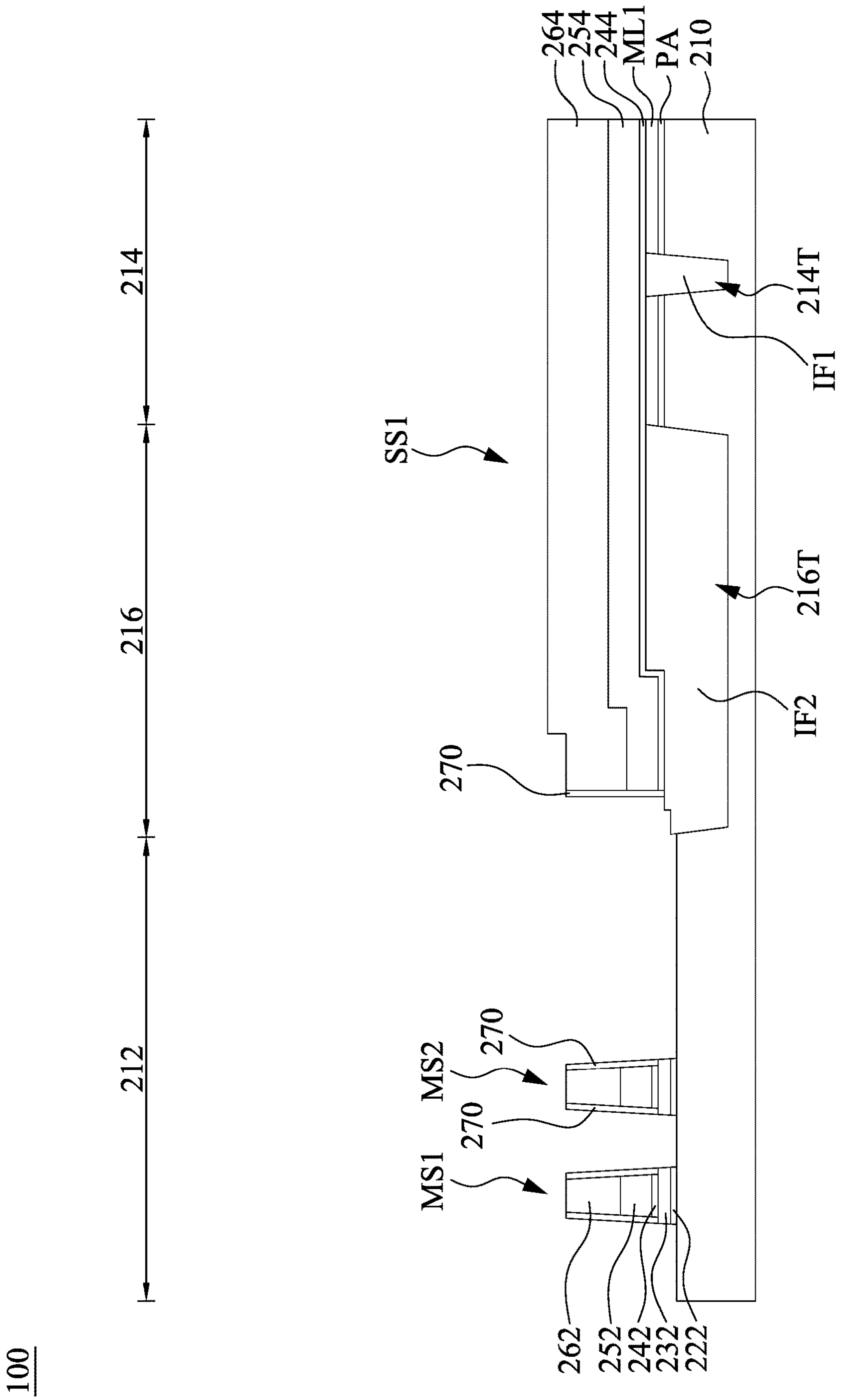
Figure 17B:
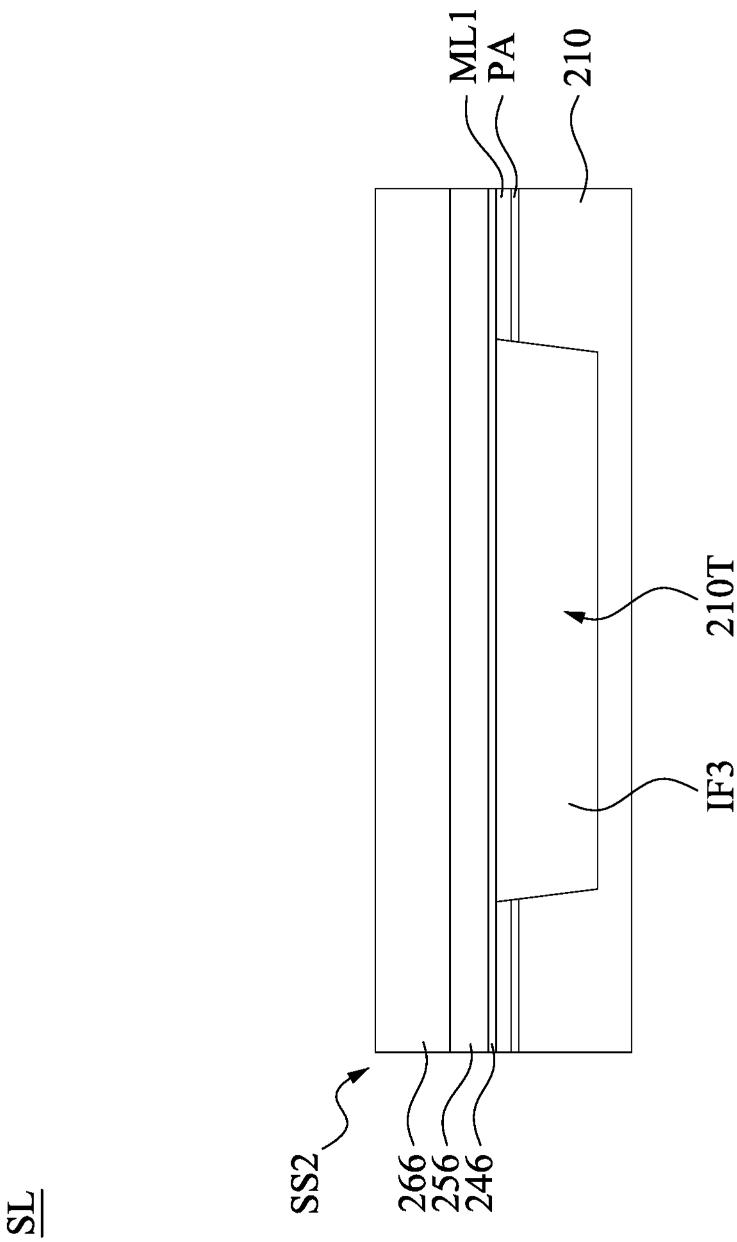

As illustrated in FIGS. 17A and 17B, the hard mask layer 260, the control gate layer 250, the blocking layer 240, the floating gate layer 230, and the tunnel dielectric layer 220 are patterned to form gate stacks MS1 and MS2 in the flash memory array region 212 of the substrate 210, a stack SS1 in the peripheral circuit region 214 and the transition region 216, and a stack SS2 in the scribe line region SL. In the present embodiments, the gate stacks MS1 and MS2 each include a tunnel dielectric layer 222, a floating gate 232, a blocking layer 242, a control gate 252, and a hard mask 262. The stack SS1 includes a blocking layer 244, a control gate 254 over the blocking layer 244, and a hard mask 264 over the control gate 254. The stack SS2 includes a blocking layer 246 over the isolation structure IF3, a control gate 256 over the blocking layer 246, and a hard mask 266 over the control gate 256.

Specifically, the hard mask layer 260, the control gate layer 250, the blocking layer 240 are initially patterned to form the hard masks 262, 264 and 266, the control gates 252, 254 and 256, and the blocking layers 242, 244 and 246, respectively. Subsequently, spacers 270 are disposed on sidewalls of the gate stacks MS1 and of the stacks SS1 and SS2. In some embodiments, the spacers 270 are made of silicon oxide, silicon nitride, or the combination thereof. Formation of the spacers 270 includes, for example, forming a blanket layer of dielectric material over the substrate 210 and then performing an anisotropic etching process to remove the horizontal portions of the blanket layer, while vertical portions of the blanket layer remain to form the spacers 270.

After formation of the spacers 270, the floating gate layer 230 and the tunnel dielectric layer 220 are etched using the spacers 270 and hard masks 262, 264 and 266 as etch masks and thus patterned into the floating gates 232 and the tunnel dielectric layers 222, respectively. Through the above operations, the gate stacks MS1 and MS2 and the stacks SS1 and SS2 are formed. In some embodiments, at least one of the gate stacks MS1 and MS2 includes a pair of the spacers 270 over the floating gate 232, and the stack SS1 includes a spacer 270 over the isolation structure IF2.

Figure 18A:
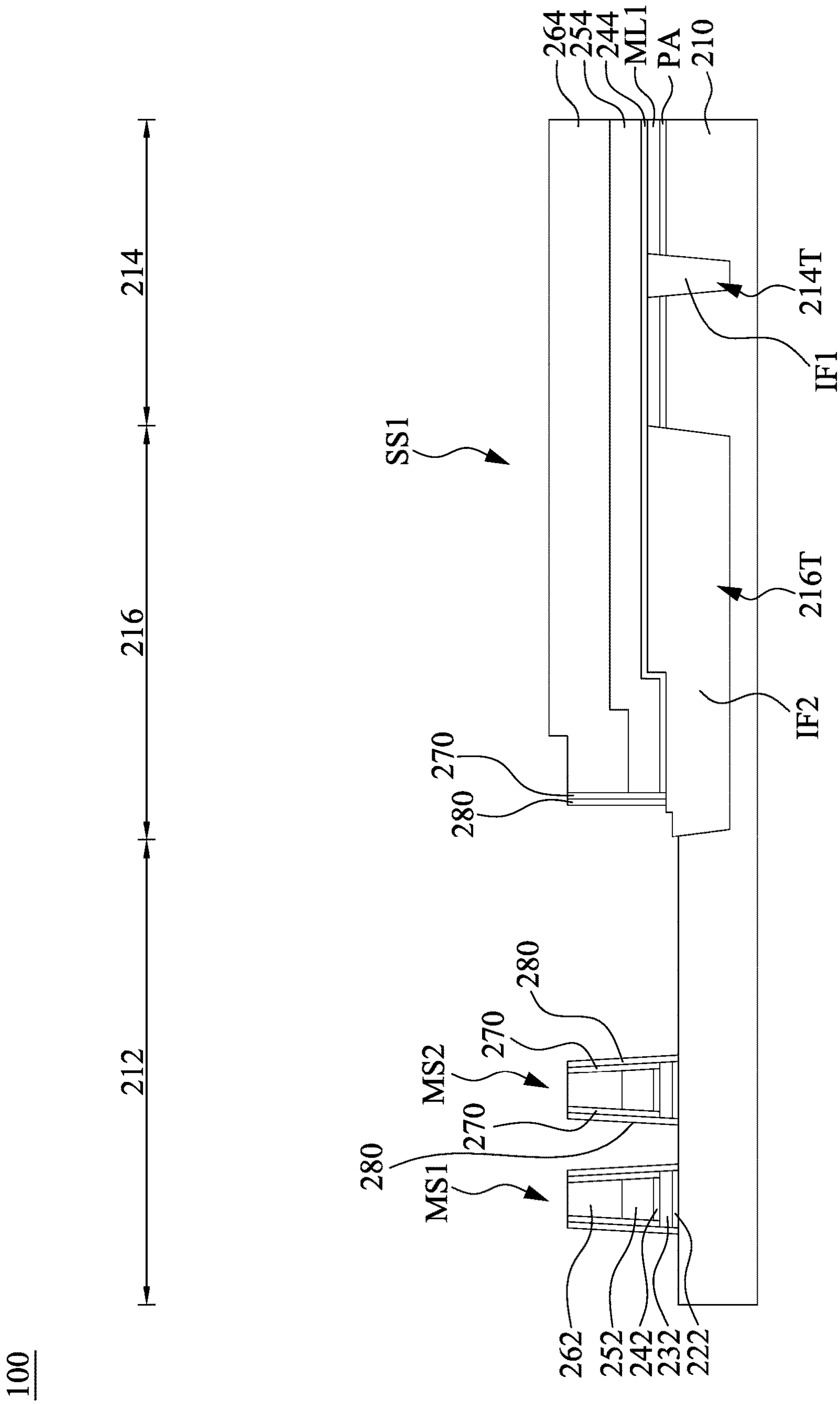
Figure 18B:
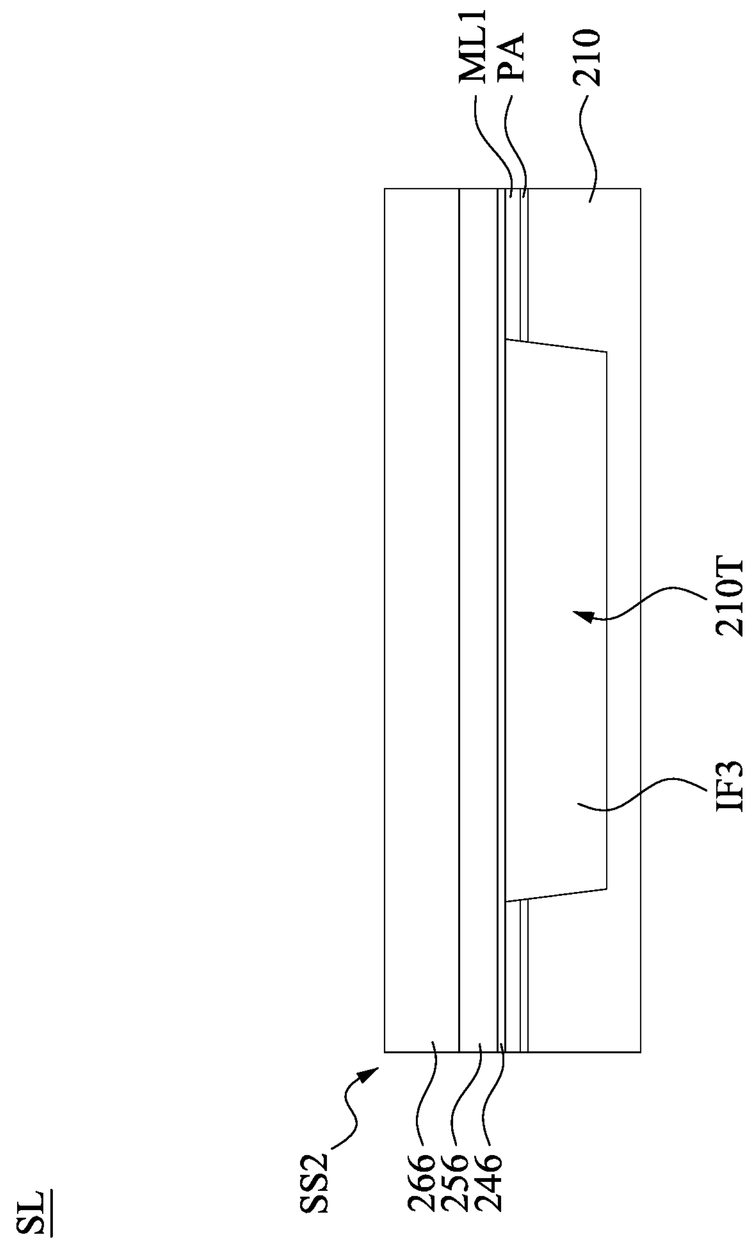

As illustrated in FIGS. 18A and 18B, inter-gate dielectric layers 280 are formed on sidewalls of the spacers 270. The inter-gate dielectric layers 280 expose a portion of the semiconductor substrate 210 between the gate stacks MS1 and MS2. In some embodiments, the inter-gate dielectric layers 280 are made of oxide, the combination of oxide, nitride and oxide (ONO), and/or other dielectric materials. In some embodiments, formation of the inter-gate dielectric layers 280 includes, for example, depositing a blanket layer of dielectric material over the substrate 210 and then performing an anisotropic etching process to remove the horizontal portions of the blanket layer, while remaining vertical portions of the blanket layer to serve as the inter-gate dielectric layers 280.

Figure 19A:
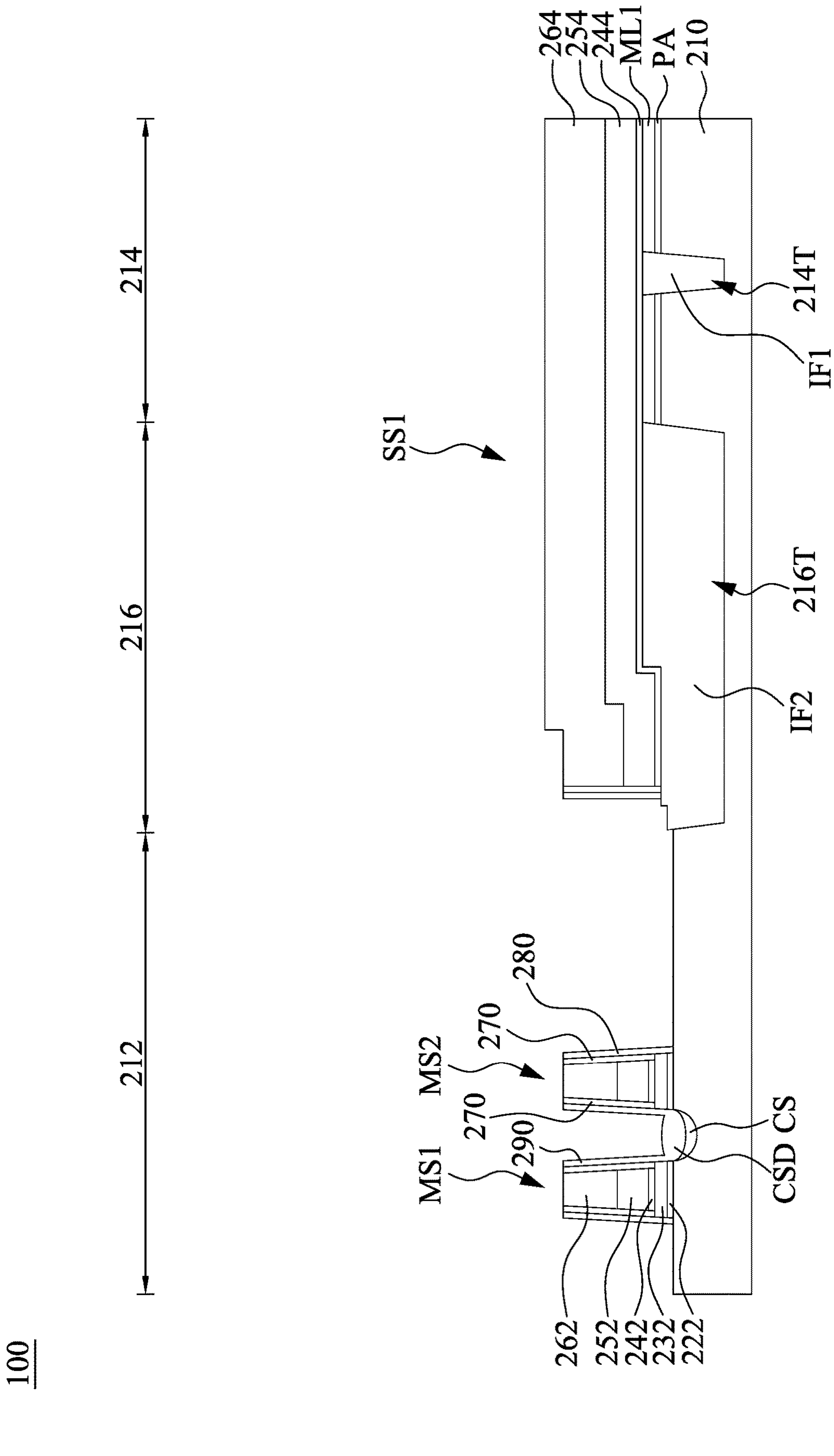
Figure 19B:
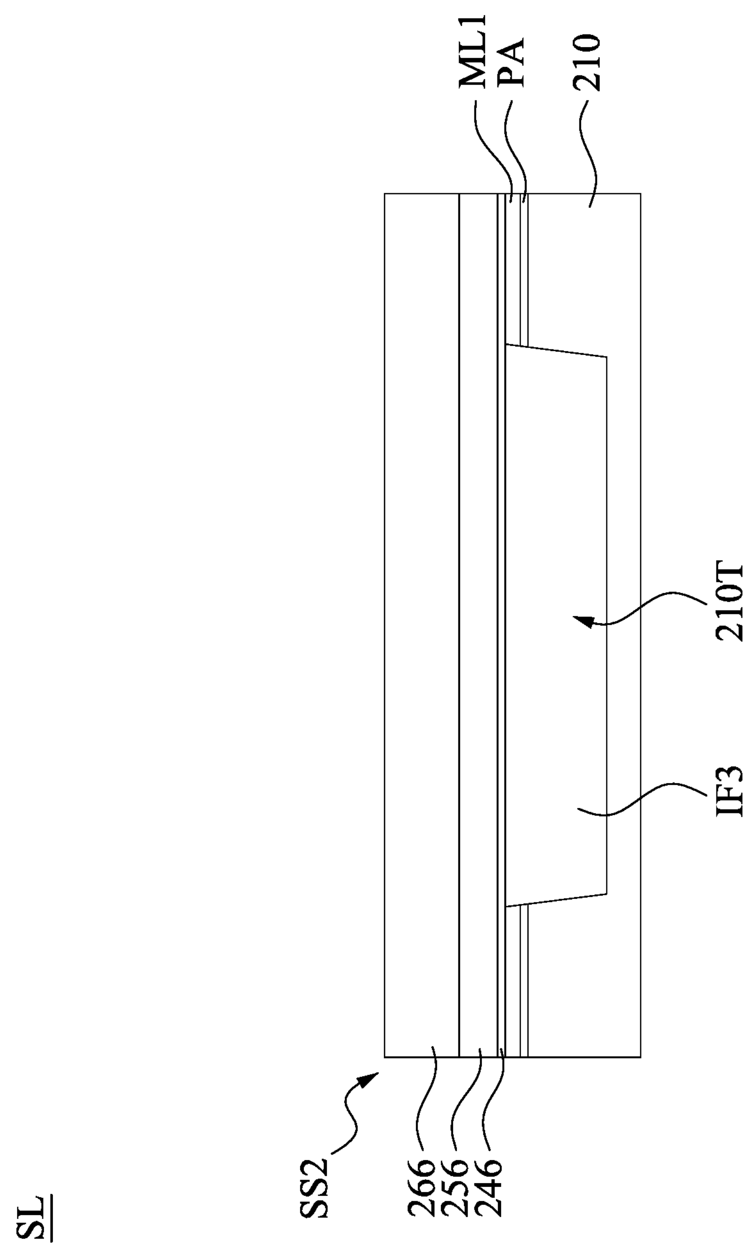

As illustrated in FIGS. 19A and 19B, a common source region CS is formed in the exposed portion of the semiconductor substrate 210 between the gate stacks MS1 and MS2. For example, ions are implanted into an exposed portion of the semiconductor substrate 210 to form the common source region CS. The gate stacks MS1 and MS2 share the common source region CS.

After the implantation, a removal process or thinning process may be performed to the dielectric layers 280 between the gate stacks MS1 and MS2, such that the dielectric layers 280 between the gate stacks MS1 and MS2 are thinned or removed. Then, a common source dielectric layer CSD and tunnel dielectric layers 290 are formed over the common source region CS using, for example, oxidation, CVD, other suitable deposition, or the like. In some embodiments, formation of the common source dielectric layer (e.g., oxidation or deposition) includes depositing a dielectric layer and etching a portion of the dielectric layer that is not between the gate stacks MS1 and MS2, such that the remaining portion of the dielectric layer forms the common source dielectric layer CSD over the common source region CS and the tunnel dielectric layers 290 alongside the gate stacks MS1 and MS2. The common source dielectric layer CSD and the tunnel dielectric layers 290 may be made of silicon oxide.

During the ion implantation, the removal (or thinning) process of the dielectric layers 280, and formation of the common source dielectric layer CSD and the tunnel dielectric layers 290, other regions of the substrate 210 (except for the region between gate stacks MS1 and MS2) can be protected by a patterned photoresist (not shown), and the patterned photoresist can be removed after formation of the common source dielectric layer CSD and the tunnel dielectric layers 290 using, for example, an ashing process.

Figure 20A:
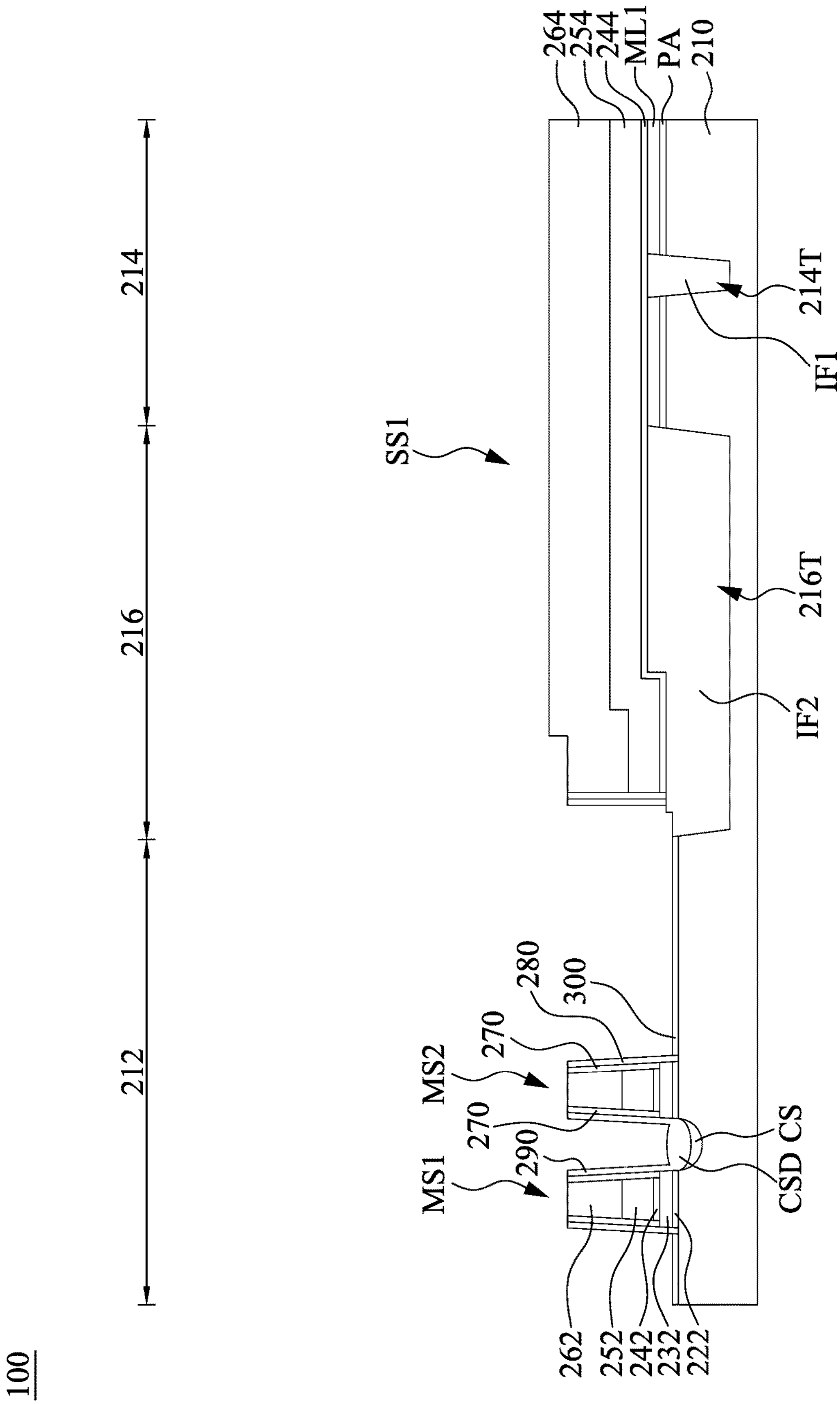
Figure 20B:
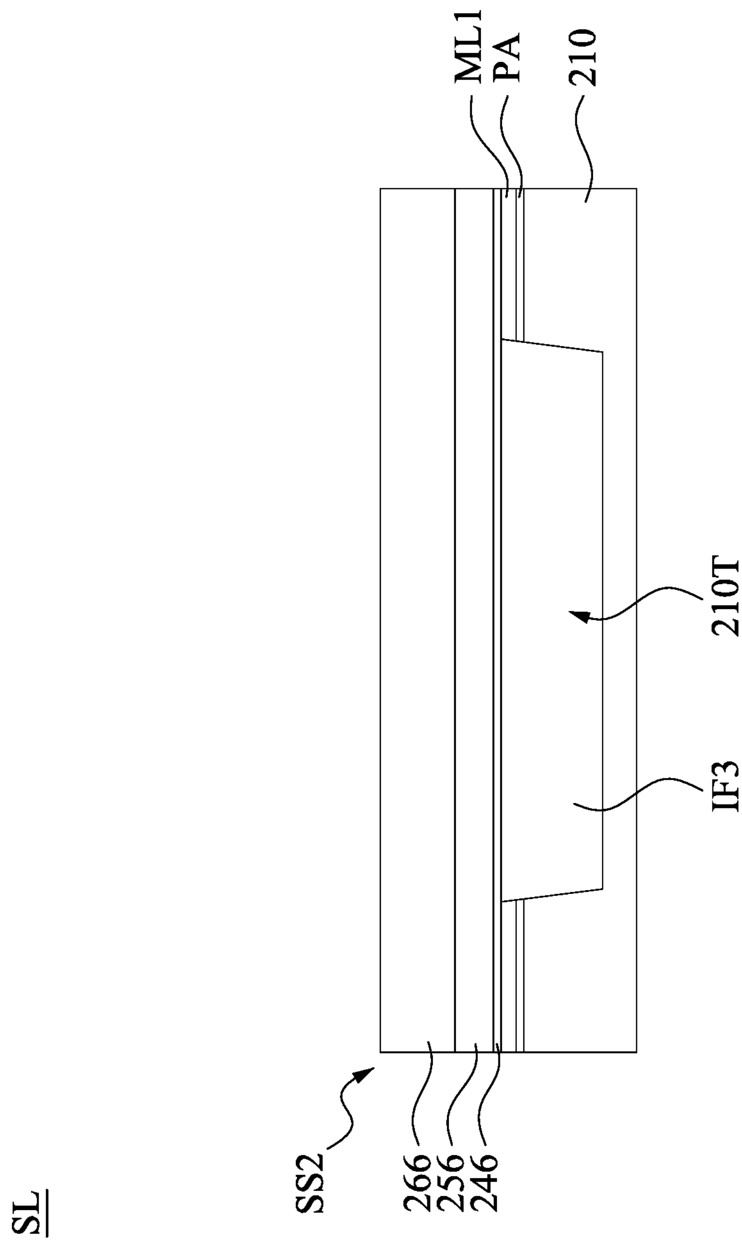

As illustrated in FIGS. 20A and 20B, select gate dielectric layers 300 are formed. The select gate dielectric layer 300 may be an oxide layer or other suitable dielectric layers. For example, the select gate dielectric layer 300 is made of silicon oxide, silicon nitride, silicon oxynitride, other non-conductive materials, or the combinations thereof. In some embodiments, a thermal oxidation process is performed, such that portions of the substrate 210 uncovered by the gate stacks MS1, MS2, and the common source dielectric layer CSD are oxidized to form the select gate dielectric layers 300. A thickness of the select gate dielectric layers 300 may be in a range of about 5 angstroms to about 500 angstroms for providing suitable electrical isolation between the substrate 210 and select gates formed later. In some embodiments, the thickness of the select gate dielectric layers 300 may be smaller than that of the tunnel dielectric layers 290 and the common source dielectric layer CSD.

Figure 21A:
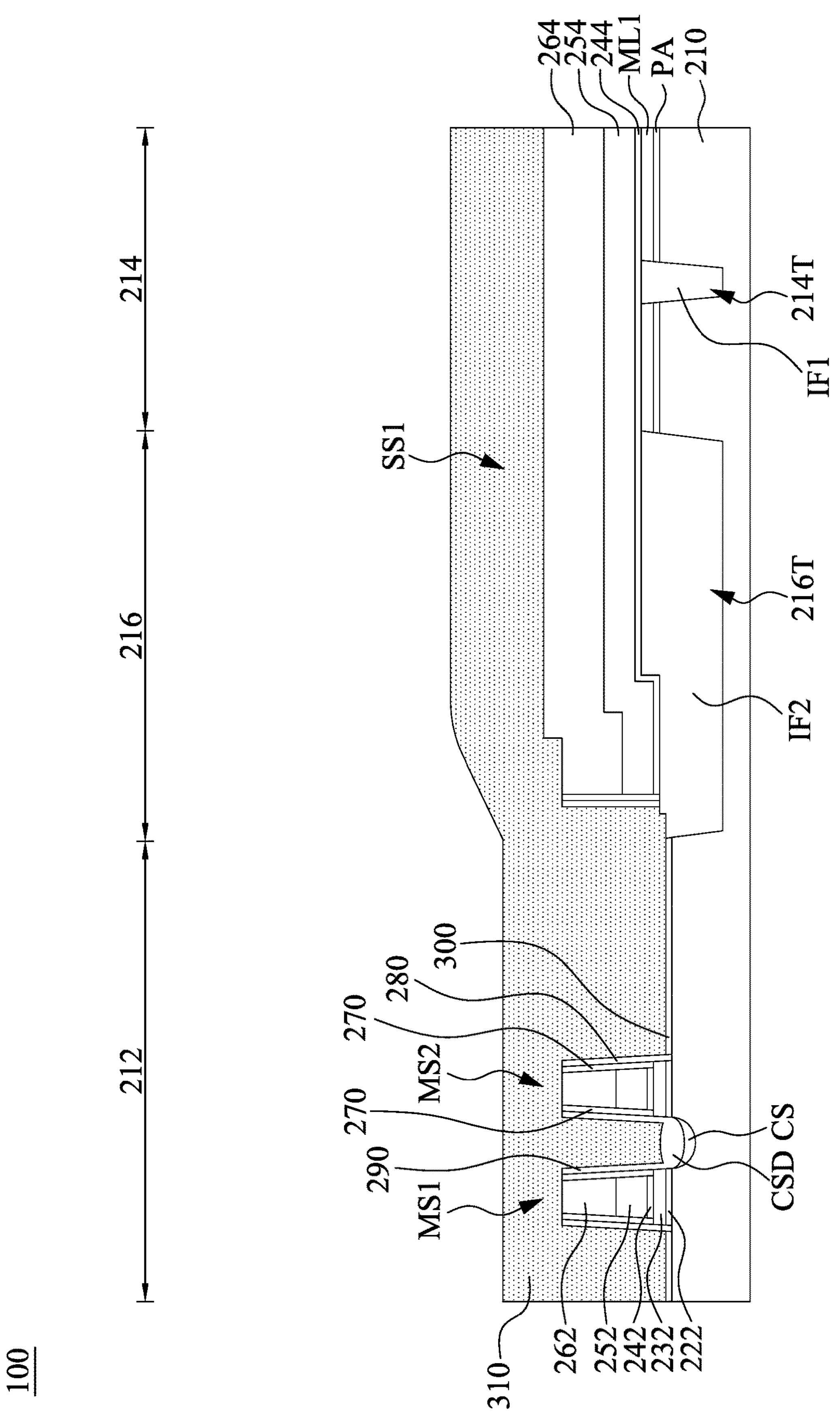
Figure 21B:
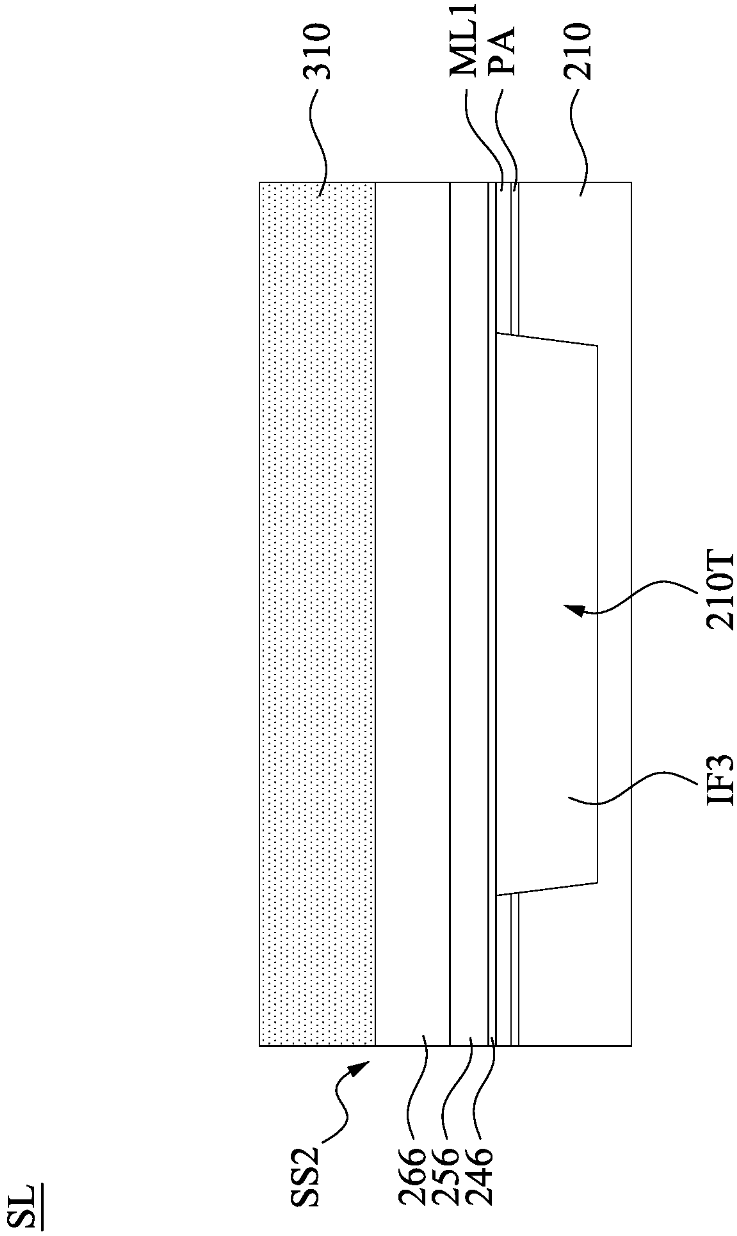

As illustrated in FIGS. 21A and 21B, a conductive layer 310 is formed on the structure of FIGS. 20A and 20B. In some embodiments, the conductive layer 310 is made of polysilicon, other suitable conductive materials, or combinations thereof. For example, the conductive layer 310 may include doped polysilicon or amorphous silicon. The conductive layer 310 may be formed by CVD, plasma-enhanced chemical vapor deposition (PECVD), LPCVD, or other proper processes.

Figure 22A:
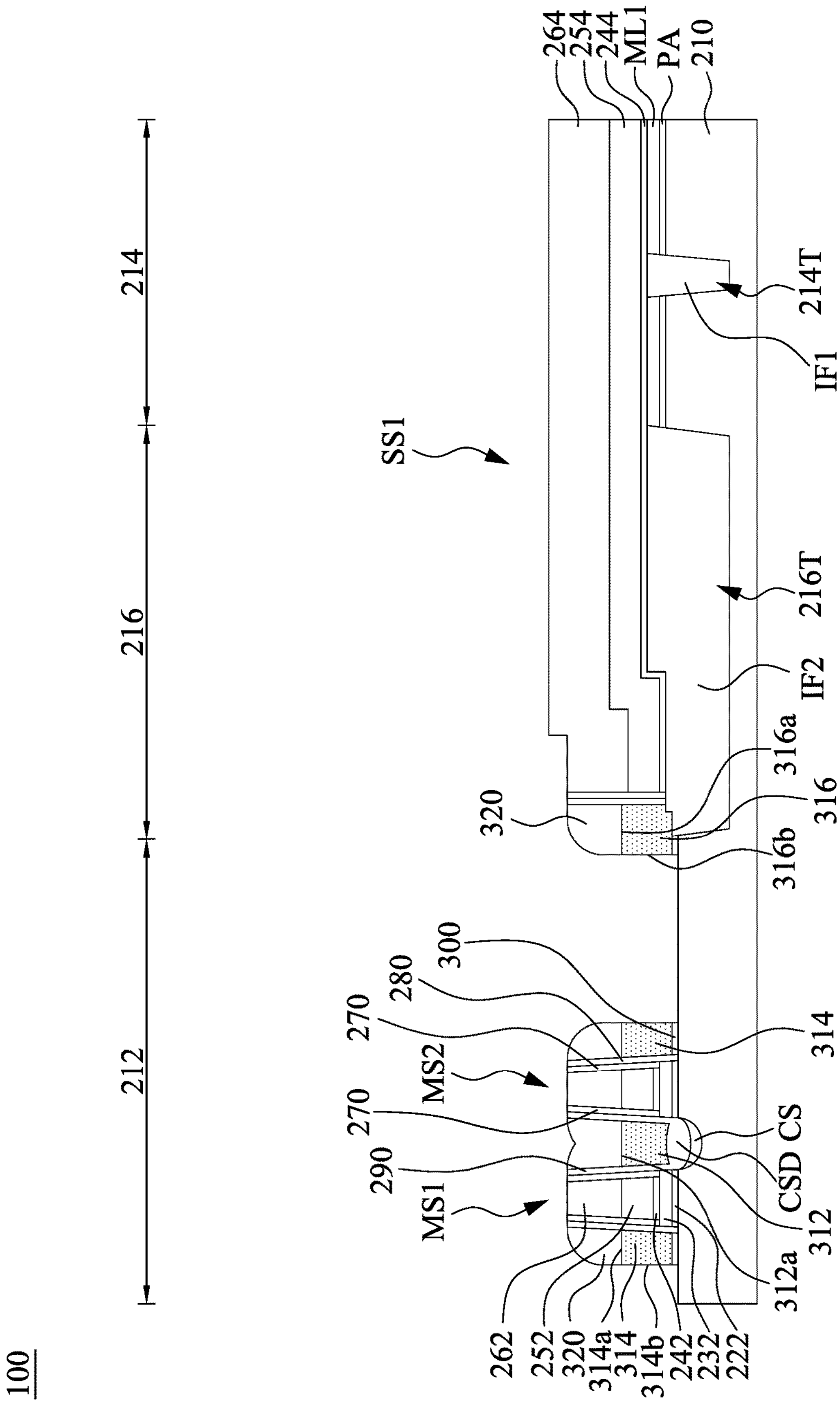
Figure 22B:
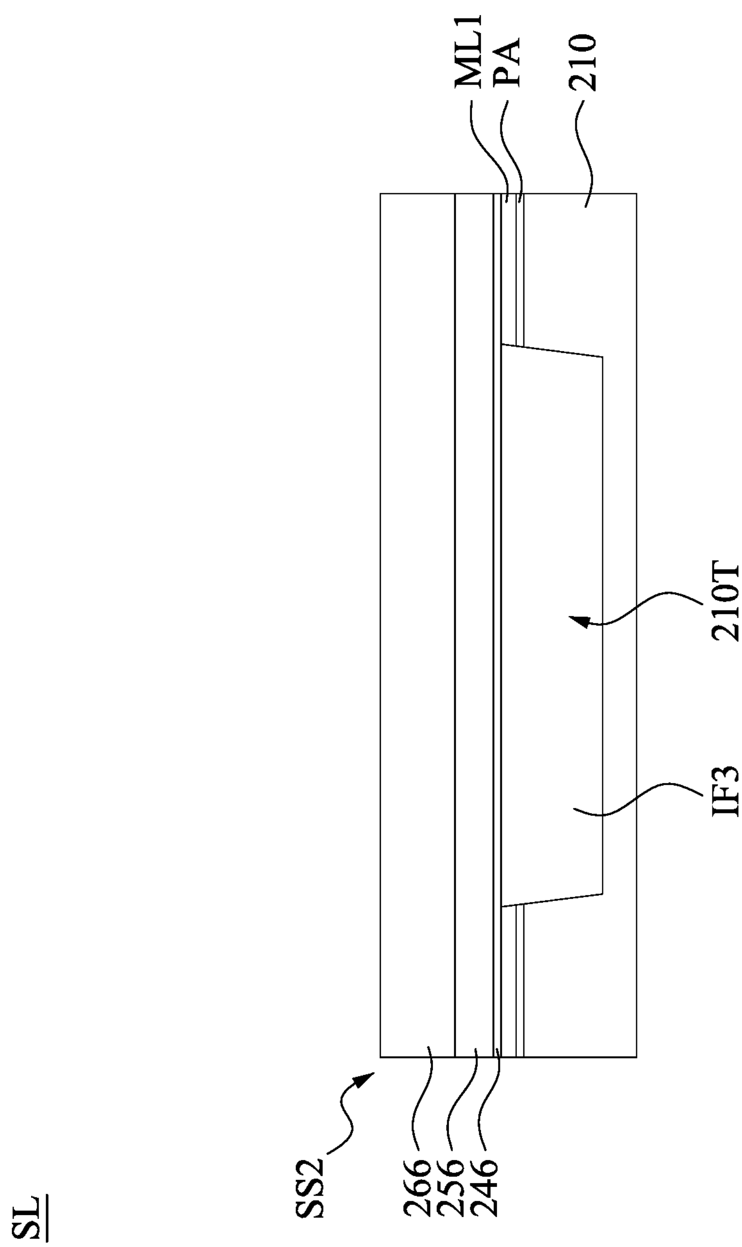

As illustrated in FIGS. 22A and 22B, the conductive layer 310 (referring to FIGS. 21A and 21B) is patterned to form an erase gate 312 between the gate stacks MS1 and MS2, select gates 314 on sides of the gate stacks MS1 and MS2, and dummy gates 316 on sides of the stacks SS1 and SS2. In some embodiments, the select gates 314 may be referred to as word lines. For example, referring to FIGS. 21A and 22A, the conductive layer 310 is etched back first, then, plural hard masks 320 are formed over the conductive layer 310, and an etching process is performed to pattern the conductive layer 310 using the hard masks 320 as etching masks to form the erase gates 312, the select gates 314, and the dummy gates 316. In some embodiments, the erase gates 312 are formed over the common source dielectric layer CSD, and the select gates 314 and the dummy gate 316 are formed over the select gate dielectric layers 300. Arranged between the select gates 314 and the semiconductor substrate 210, the select gate dielectric layer 300 provides electrical isolation therebetween. In some embodiments, the configuration of the dummy gates 316 can improve the cell uniformity.

In some embodiments, a top surface 312*a* of the erase gate 312, top surfaces 314*a* of the select gates 314, and a top surface 316*a* of the dummy gate 316 are covered by the hard masks 320, and side surfaces 314*b* of the select gates 314 and a side surface 316*b* of the dummy gate 316 are exposed by the hard masks 320.

Figure 23A:
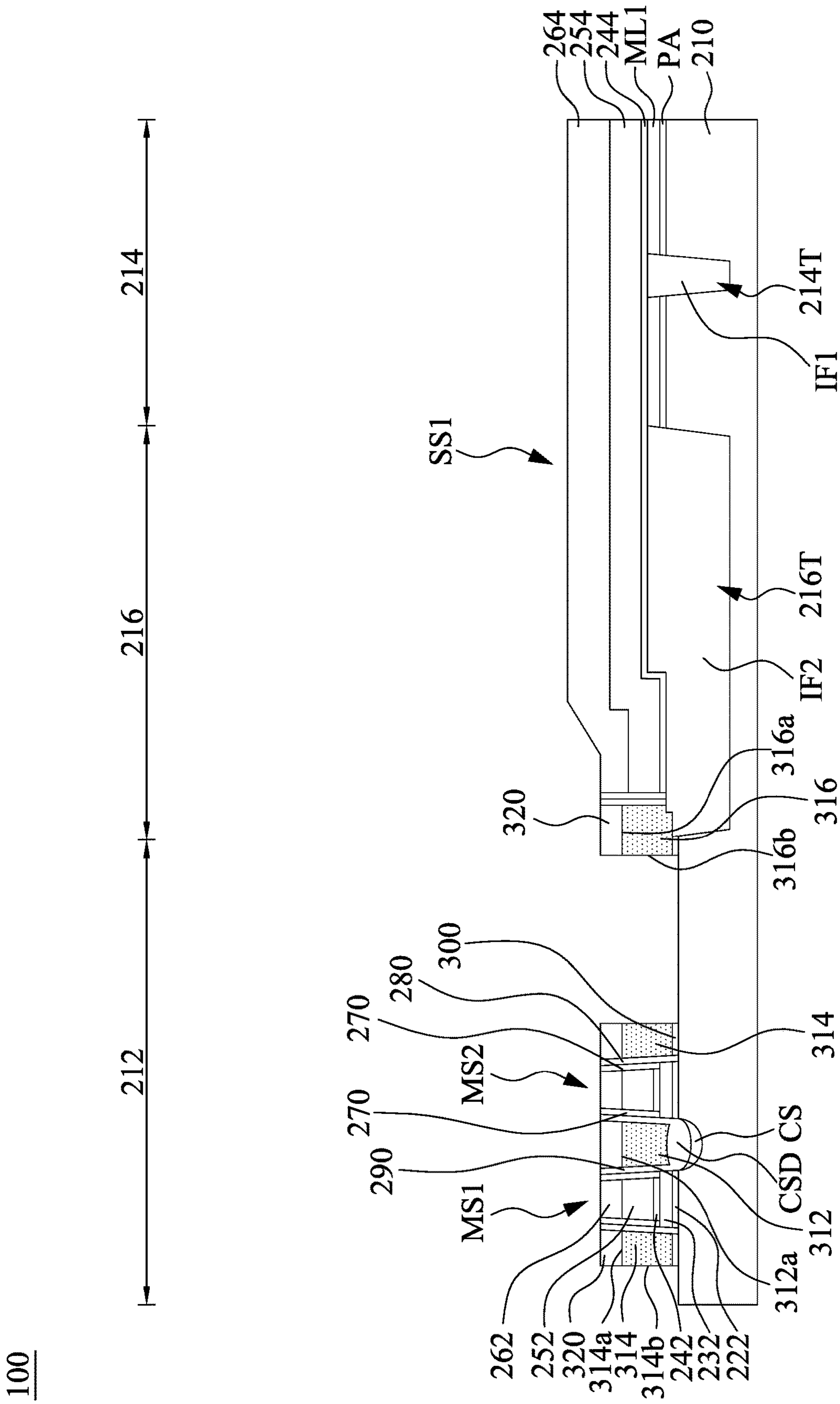
Figure 23B:
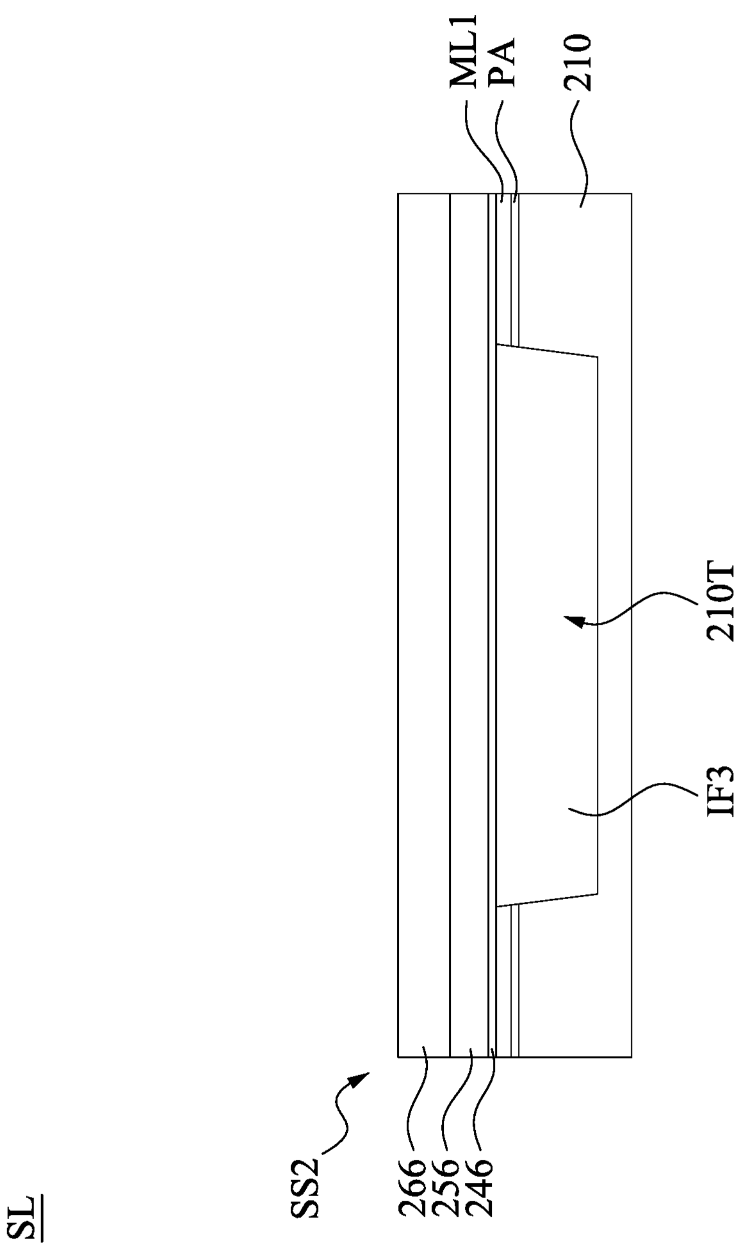

As illustrated in FIGS. 23A and 23B, the hard masks 262, 264, 266, and 320 are etched back, and the height of the gate stacks in the flash memory array region 212 is reduced. In some embodiments, prior to the etching back, a flowable material (i.e., an organic material) is formed on the structure of FIGS. 22A and 22B. Due to the flowability of the flowable material, the substrate 210 uncovered by the hard masks 262, 264, 266, and 320 are covered by a thicker flowable material, thereby the substrate 210 uncovered by the hard masks 262, 264, 266, and 320 are prevented from being damaged during the etch back process. In some embodiments, the etch back process may also remove the flowable material.

Figure 24A:
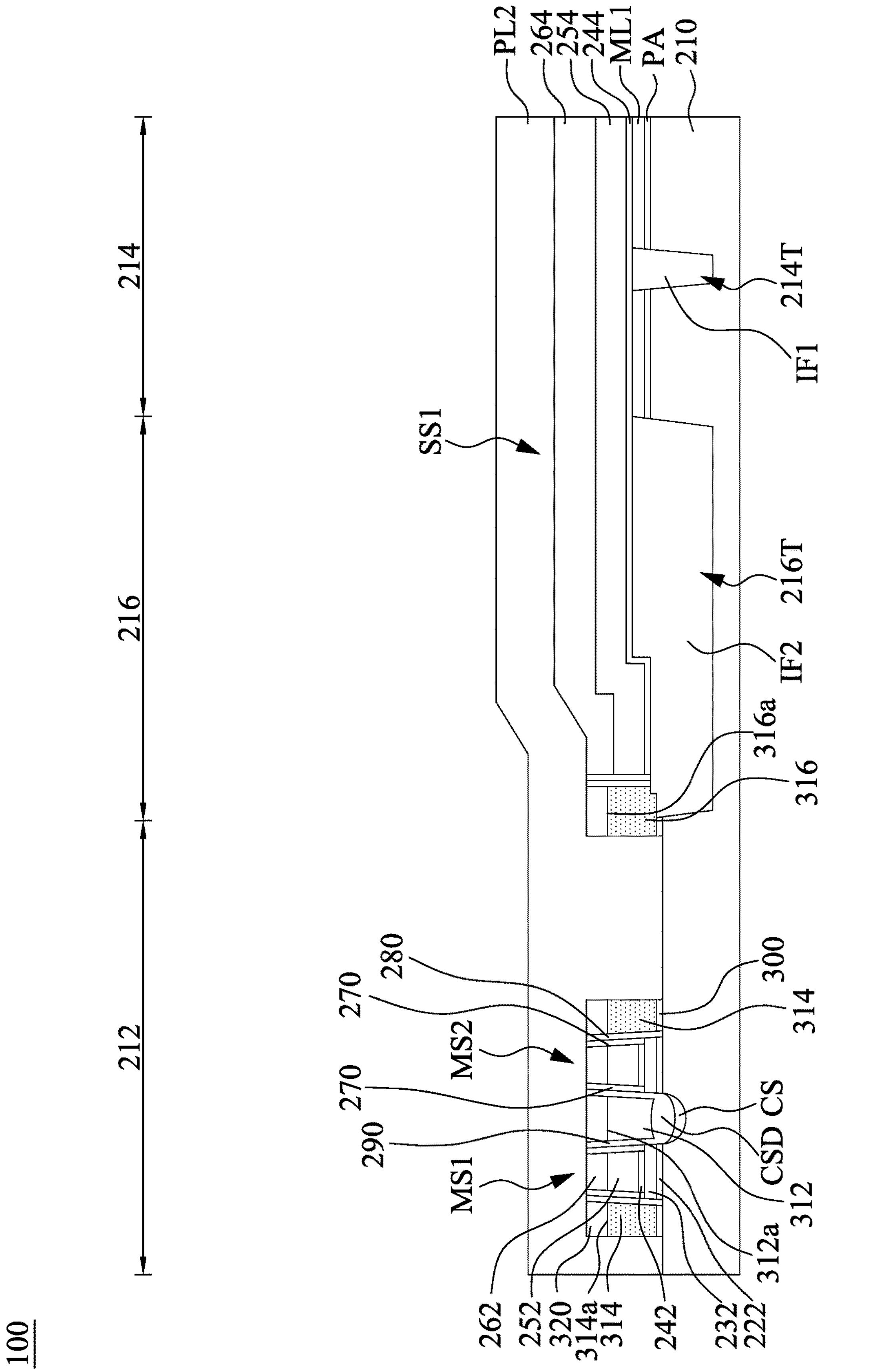
Figure 24B:
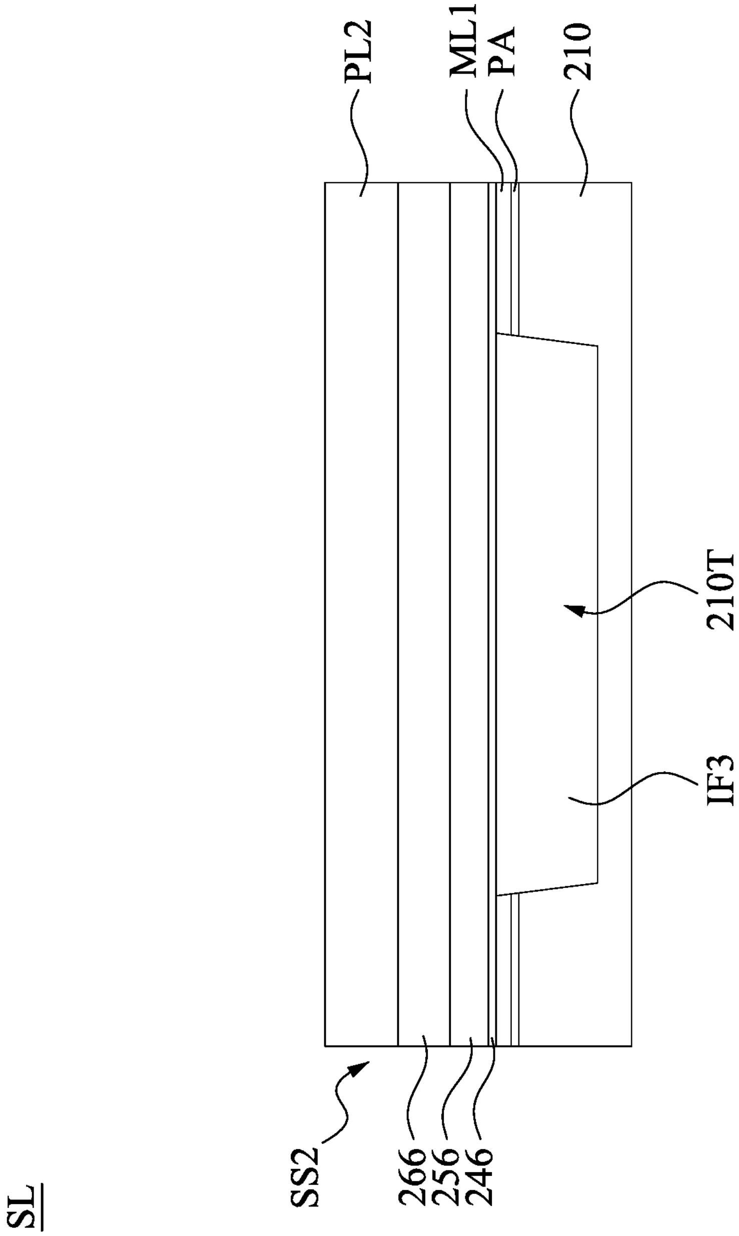

As illustrated in FIGS. 24A and 24B, a protective layer PL2 is formed over the stacks SS1 and SS2 and the gate stacks MS1 and MS2. In some embodiments, the protective layer PL2 is, for example, made of amorphous silicon, polysilicon, silicon oxide, silicon nitride, silicon oxynitride, other suitable materials, or the combinations thereof. The protective layer PL2 may be formed by suitable deposition methods, such as CVD or the like.

Figure 25A:
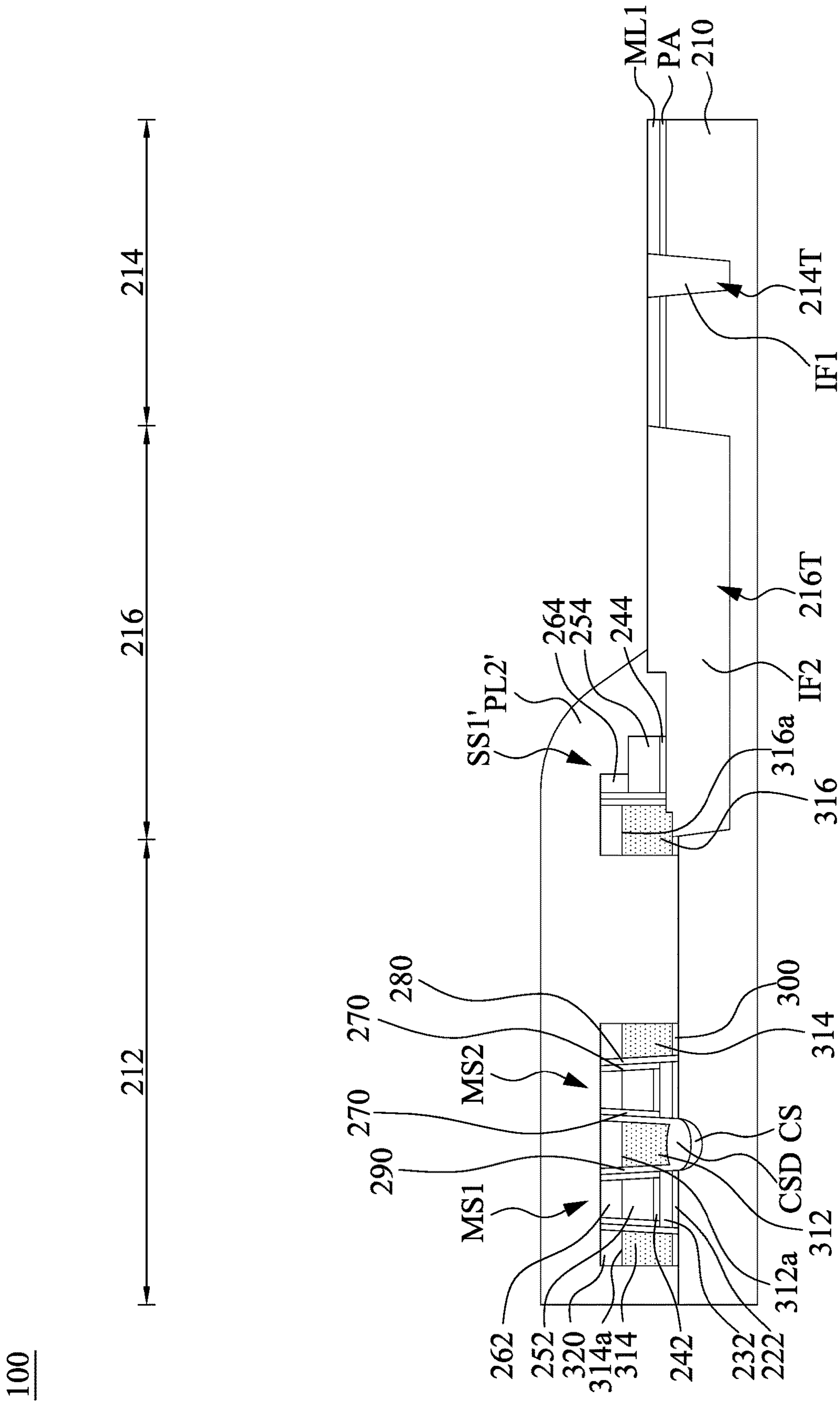
Figure 25B:
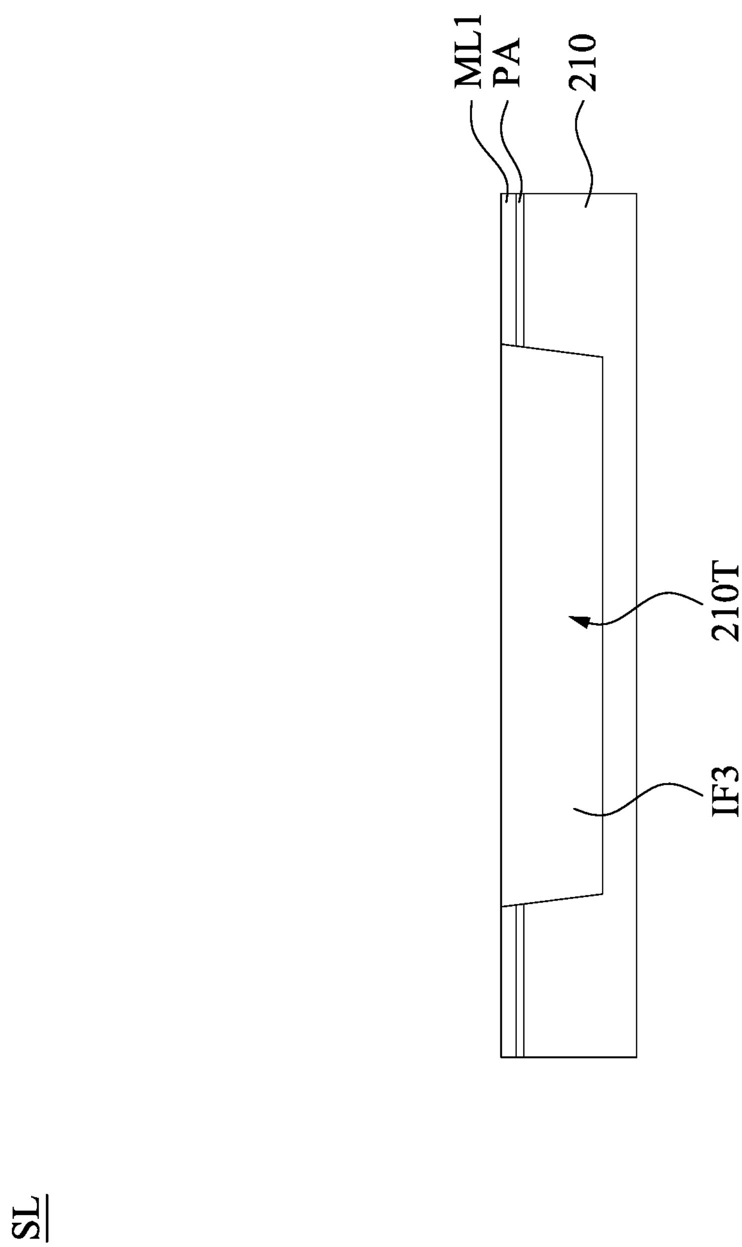

As illustrated in FIGS. 25A and 25B, an etching process is performed to remove the stack SS2 in the scribe line region SL and a portion of the stack SS1 in the peripheral circuit region 214 and the transition region 216, while remaining a portion of the stack SS1 in the transition region 216. This remaining portion is referred to as a stack SS1' hereinafter. In some embodiments, a photoresist mask is formed on a portion of the protective layer PL2 in the flash memory array region 212 and a portion of the transition region 216, and a remaining portion of the protective layer PL2 in another portion of the transition region 216, the peripheral circuit region 214 and the scribe line region SL is exposed from the photoresist mask. Then, an etching process is performed to remove the exposed portion of the protective layer PL2 and the underlying portions of the hard mask 264, 266, the control gate 254, 256, and the blocking layer 244, 246. After the etching process, the stack SS1' remains in the transition region 216, and a portion of the protective layer PL2 remains covering the stack SS1'.

After the etching process, a protective material (e.g., amorphous silicon, polysilicon, silicon oxide, silicon nitride, silicon oxynitride, other suitable materials, or the combinations thereof) is blanket formed over the substrate 210, and an etching back process is performed to the protective material to form the protective layer PL2' including the remaining portion of the protective layer PL2. The protective layer PL2' may have a tapered profile and cover the stack SS1' and the gate stacks MS1 and MS2 for protecting the stack SS1', and the protective layer PL2' exposes the portion of the transition region 216 and an entirety of the peripheral circuit region 214 and the scribe line region SL.

Figure 26A:
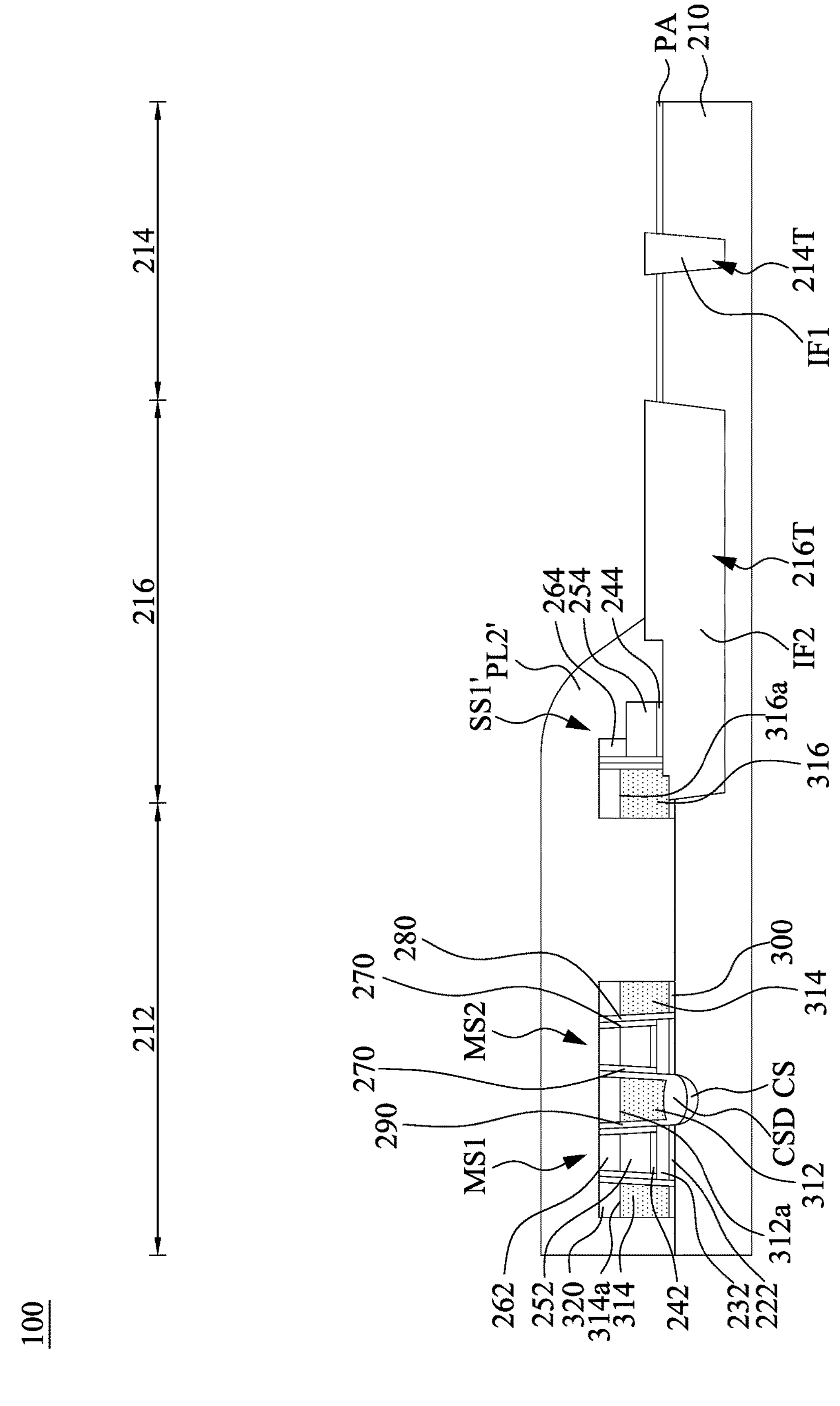
Figure 26B:
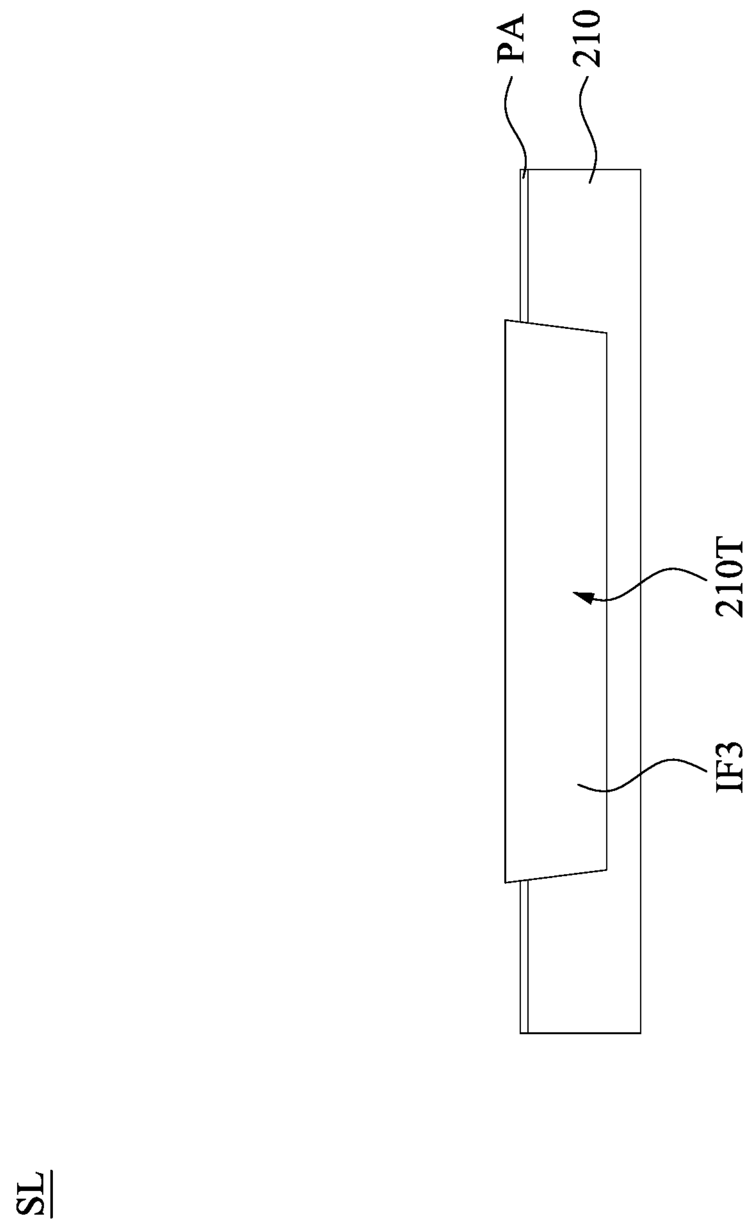

As illustrated in FIGS. 26A and 26B, the mask layer ML1 in the peripheral circuit region 214 and the scribe line region SL is removed through a suitable etching process, while the stack SS1' and the gate stacks MS1 and MS2 remain intact because of the protection of the protective layer PL2'. For example, an etch process is performed on the structure as shown in FIGS. 25A and 25B, and the protective layer PL2' has a higher etch resistance to the etch process than that of the mask layer ML1, such that the mask layer ML1 is removed while the protective layer PL2' and underlying structures remain intact.

Figure 27A:
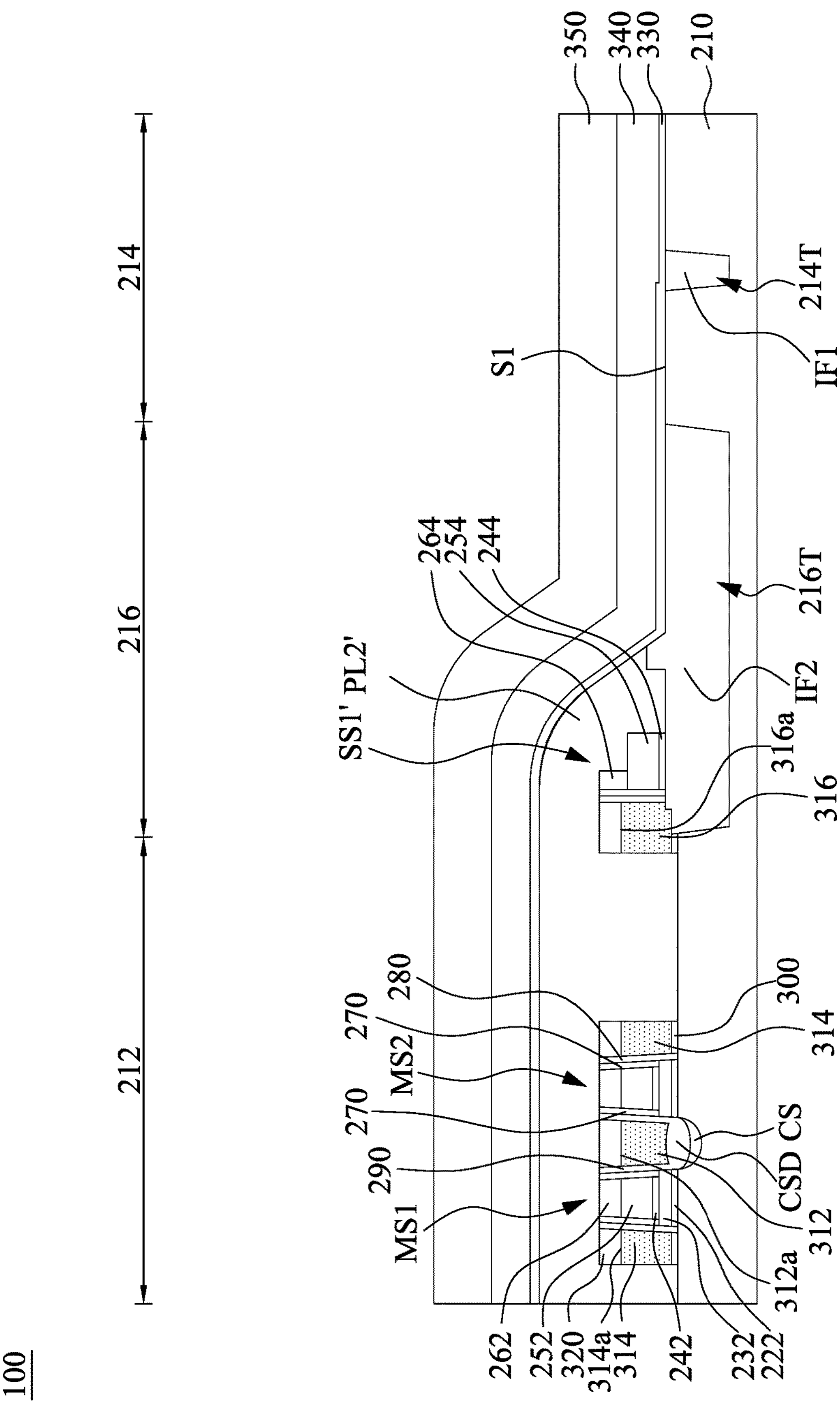
Figure 27B:
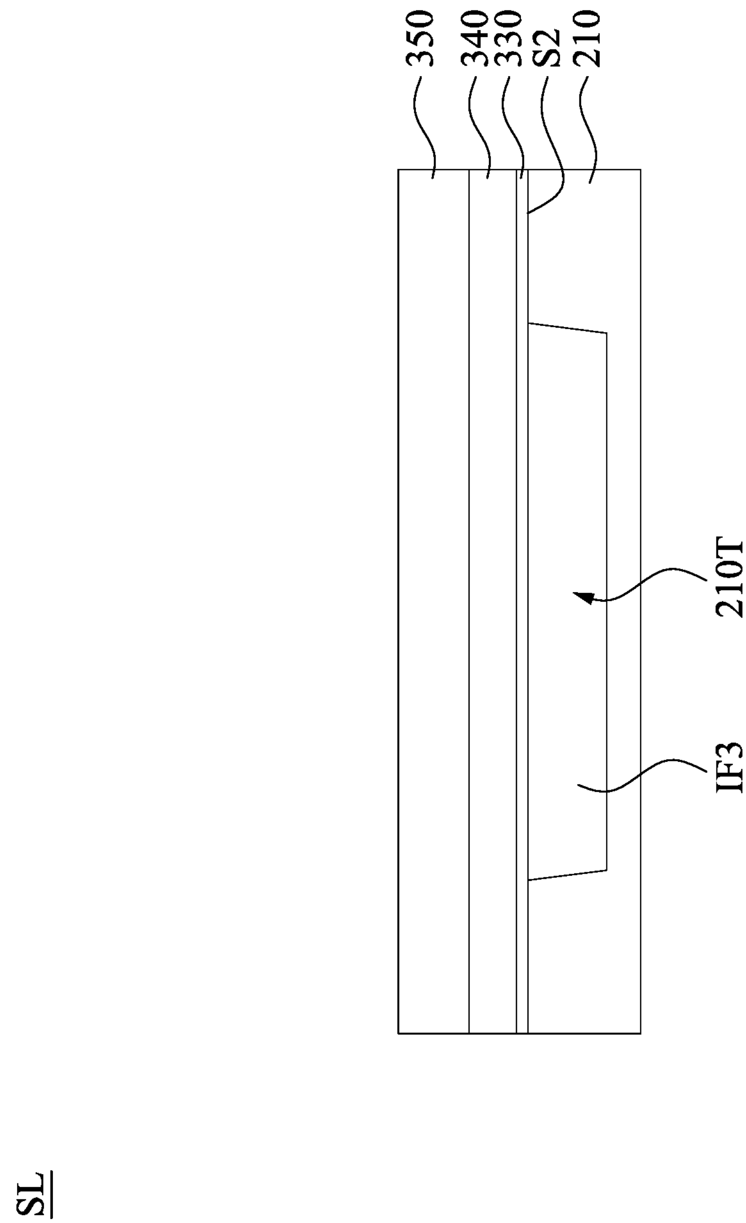

As illustrated in FIGS. 27A and 27B, a gate dielectric layer 330, a gate electrode layer 340, and a hard mask layer 350 are formed. In some embodiments, one or more etching processes are initially performed to remove protruding portions of the isolation structures IF1, IF2 and IF3, such that a substantially planar surface Si is yielded in the peripheral circuit region 214 and a portion of the transition region 216, and a substantially planar surface S2 is yielded in the scribe line region SL. In some embodiments, the pad layer PA in the peripheral circuit region 214, the transition region 216 and the scribe line region SL are also removed by the one or more etching processes. Subsequently, the gate dielectric layer 330, the gate electrode layer 340, and the hard mask layer 350 are formed in sequence over the protective layer PL2' and the planar surfaces S and S2. The gate dielectric layer 330 may be made of suitable high-k materials, other non-conductive materials, or combinations thereof. Examples of the high-k material include, but are not limited to, hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, hafnium dioxide-alumina ($HfO_2$—$Al_2O_3$) alloy, or other applicable dielectric materials. The gate electrode layer 340 may be made of conductive materials, such as a polysilicon layer. The hard mask layer 350 may be made of silicon nitride, silicon oxide, other suitable materials, or the combinations thereof.

In some embodiments, the gate dielectric layer 330 may be thicker in a region where high voltage devices are to be formed, and be thinner in a region where low voltage devices are to be formed. Therefore, the gate dielectric layer 300 has a thick region and a thin region thinner than the thick region. Exemplary method for achieving the difference thicknesses may include conformally forming a gate dielectric layer, masking a first region of the gate dielectric layer while unmasking a second region of the gate dielectric layer, and thinning (e.g., etching) the second region of the gate dielectric layer. The resulting second region is thus thinner than the first region.

Figure 28A:
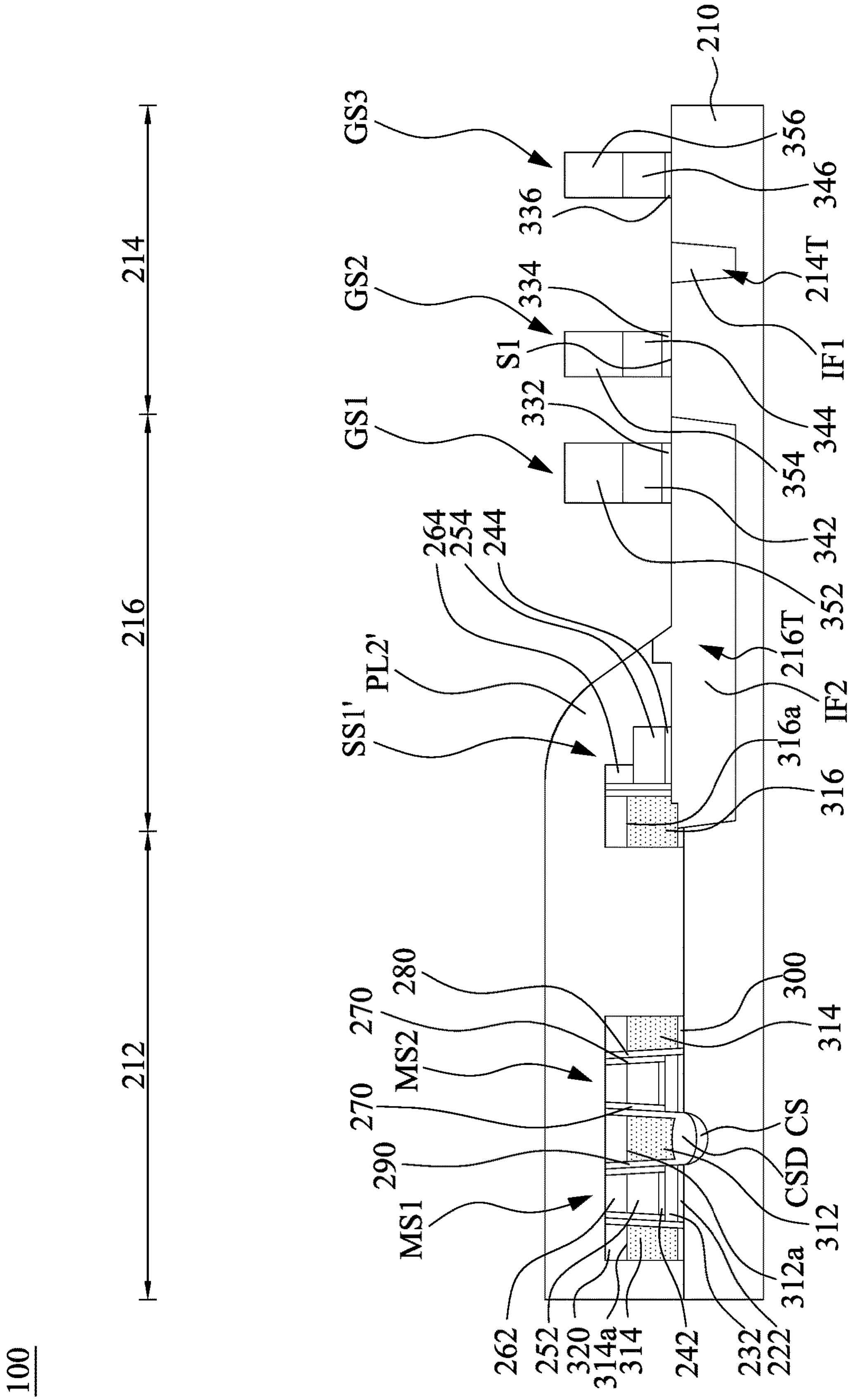
Figure 28B:
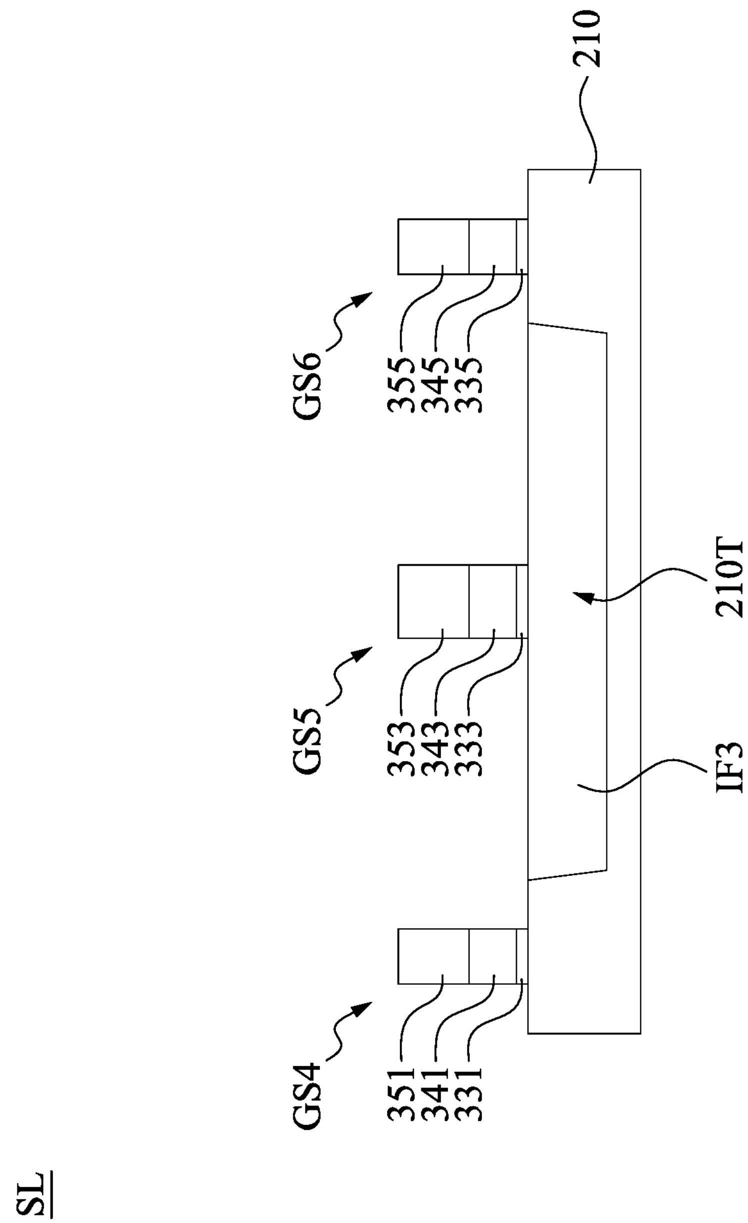

As illustrated in FIGS. 28A and 28B, the gate electrode layer 340 is patterned into gate electrodes 342, 344, and 346 in the peripheral circuit region 214 and gate electrodes 341, 343 and 345 in the scribe line region SL, the hard mask layer 350 is patterned into hard masks 352, 354, and 356 respectively over the gate electrodes 342, 344, and 346 and hard masks 351, 353 and 355 respectively over the gate electrodes 341, 343 and 345, and the gate dielectric layer 330 is patterned into gate dielectrics 332, 334, and 336 respectively under the gate electrodes 342, 344, and 346, and gate dielectrics 331, 333, and 335 respectively under the gate electrodes 341, 343, and 345. The patterning involves, for example, suitable lithography and etching processes.

Through the configuration, a dummy gate stack GS1 is formed in the transition region 216, a high voltage gate stack GS2 and a logic gate stack GS3 are formed in the peripheral circuit region 214, dummy gate stacks GS4 and GS6 are formed over active regions in the scribe line region SL, and a gate stack GS5 is formed over the isolation structure IF3 in the scribe line region SL. The dummy gate stack GS1 has a gate dielectric 332, a gate electrode 342 over the gate dielectric 332, and a hard mask 352 over the gate electrode 342. The high voltage gate stack GS2 has a gate dielectric 334, a gate electrode 344 over the gate dielectric 334, and a hard mask 354 over the gate electrode 344. The logic gate stack GS3 has a gate dielectric 336, a gate electrode 346 over the gate dielectric 336, and a hard mask 356 over the gate electrode 346. The dummy gate stack GS4 has a gate dielectric 331, a gate electrode 341 over the gate dielectric 331, and a hard mask 351 over the gate electrode 341. The gate stack GS5 has a gate dielectric 333, a gate electrode 343 over the gate dielectric 333, and a hard mask 353 over the gate electrode 343. The gate stack GS6 has a gate dielectric 335, a gate electrode 345 over the gate dielectric 335, and a hard mask 355 over the gate electrode 345.

In some embodiments, the gate dielectric layer 330 may have a thick region and a thin region thinner than the thick region. An example method of forming thick and thin regions in the gate dielectric layer 330 includes suitable deposition, lithography and etching techniques as discussed previously with respect to the description of the gate dielectric layer 330. After patterning the gate dielectric layer 330, the thick region of the gate dielectric layer 330 remains and serves as the gate dielectric 334 of the high voltage gate stack GS2, and the thin region of the gate dielectric layer 330 remains and serves as the gate dielectric 336 of logic gate stack GS3. As a result, the gate dielectric 334 is thicker than the gate dielectric 336. Through the configuration, compared with the logic gate stack GS3 that operates in a relative low voltage, the gate dielectric 334 can withstand a high voltage operation of the high voltage gate stack GS2.

Figure 29A:
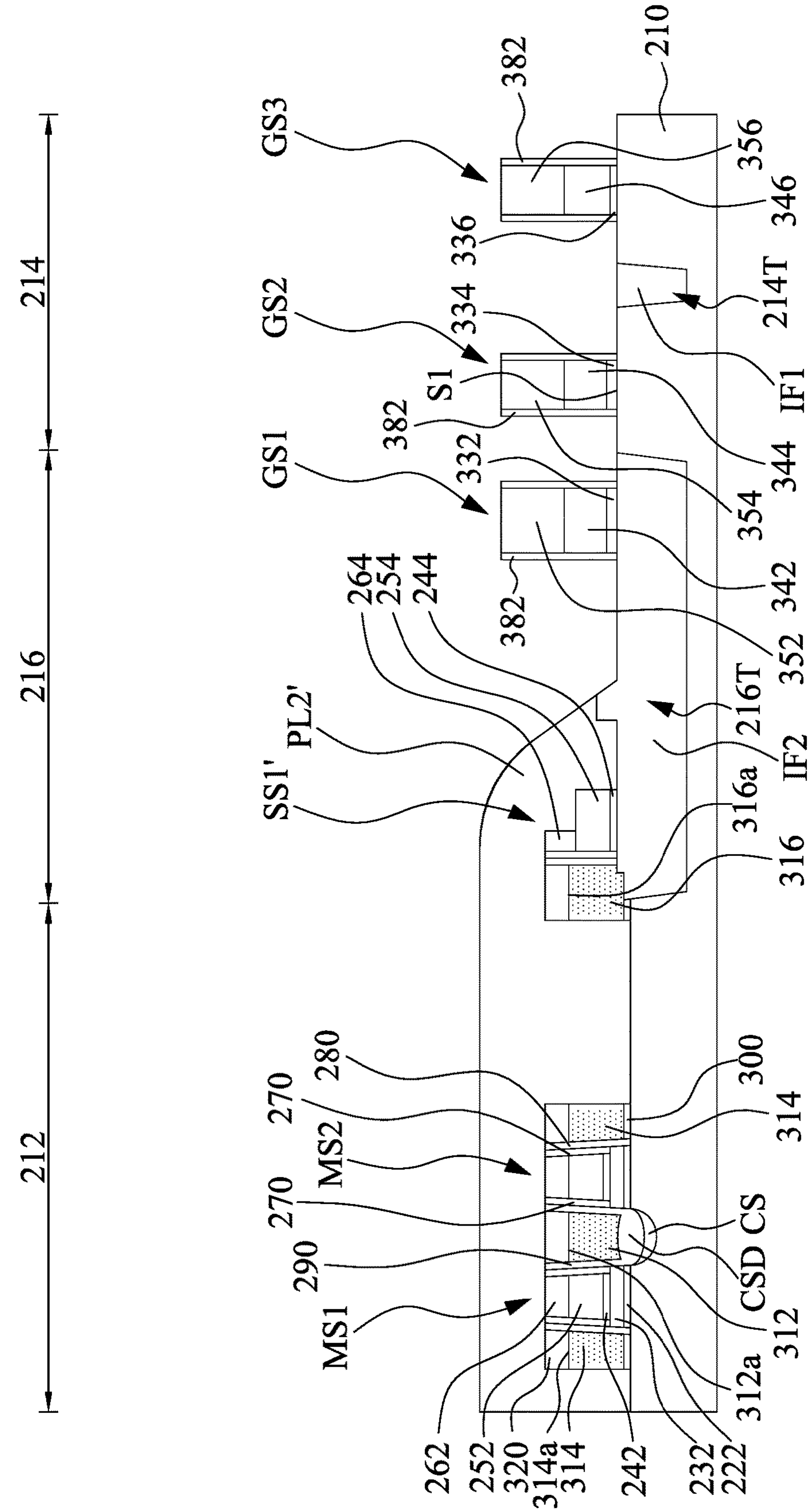
Figure 29B:
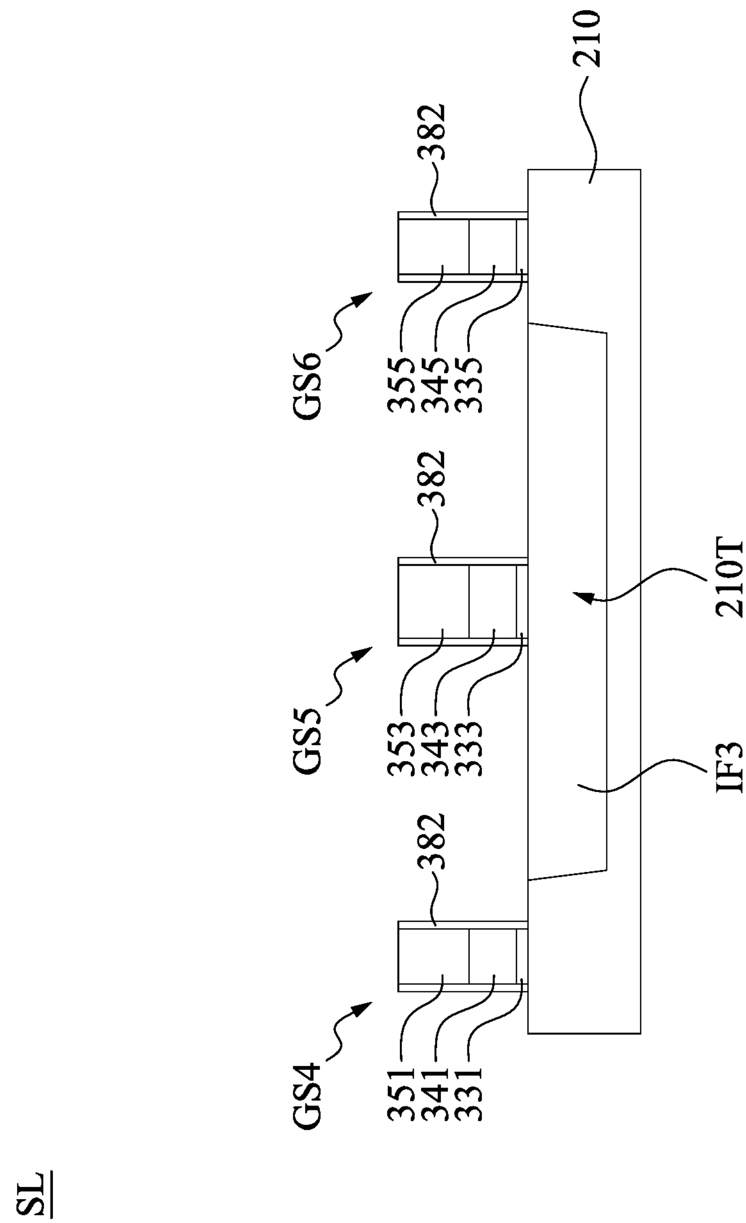

As illustrated in FIGS. 29A and 29B, seal layers 382 are formed on opposite sidewalls of the dummy gate stack GS1, the high voltage gate stack GS2, the logic gate stack GS3 in the die region 100, and the dummy gate stacks GS4, GS6 and the gate stack GS5 in the scribe line region SL. For example, a dielectric seal layer may be conformally formed over the structure of FIGS. 28A and 28B, and an etching process (e.g. anisotropic etching process) is performed to remove horizontal portions of the dielectric seal layer, and vertical portions of the dielectric spacer layer remain to form the seal layers 382. The seal layers 382 may be made of silicon nitride or other suitable materials.

Figure 30A:
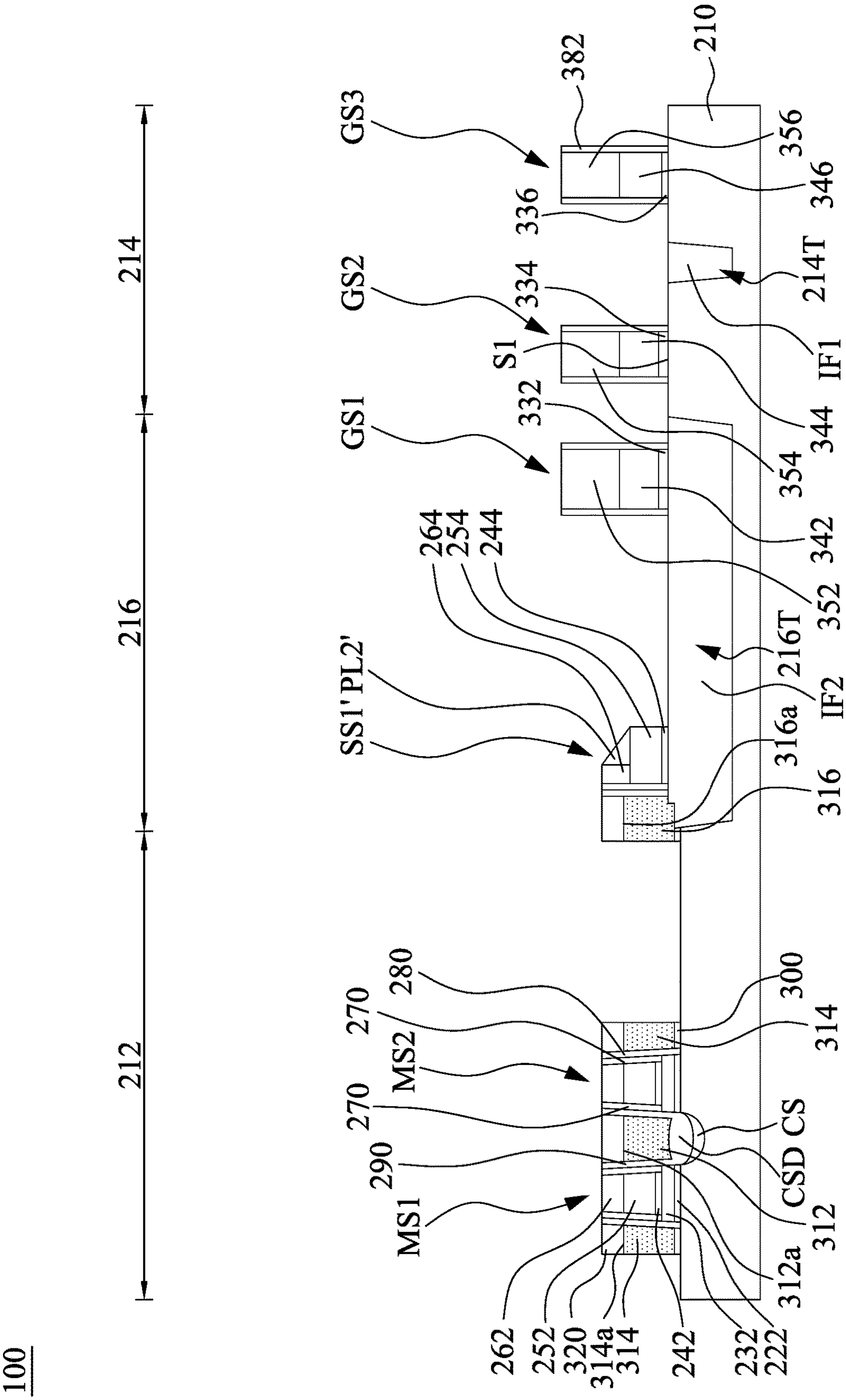
Figure 30B:
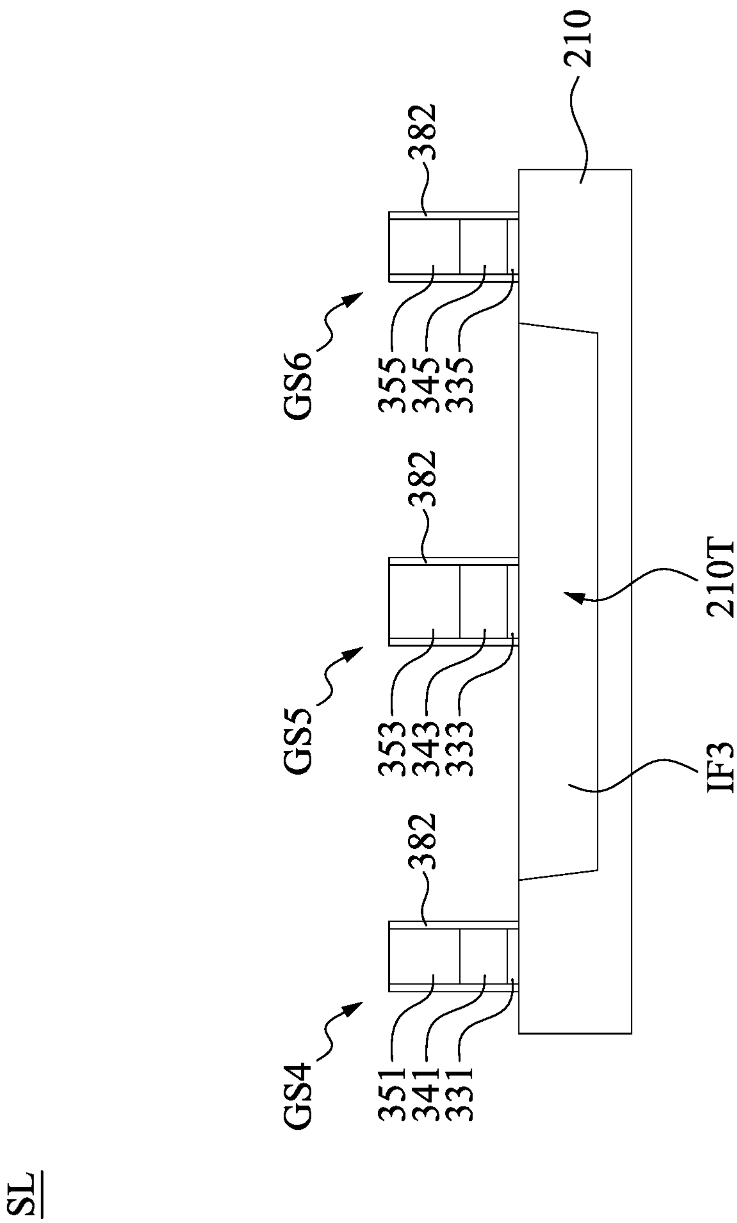

As illustrated in FIGS. 30A and 30B, the protective layer PL2' over the flash memory array region 212 and the transition region 216 are removed, such that the gate stacks MS1 and MS2 and the stack SS1' are exposed. Herein, one or more suitable etching processes are performed to remove the protective layer PL2'. In some embodiments, a portion of the protective layer PL2' may remain on a side of the stack SS1'.

Figure 31A:
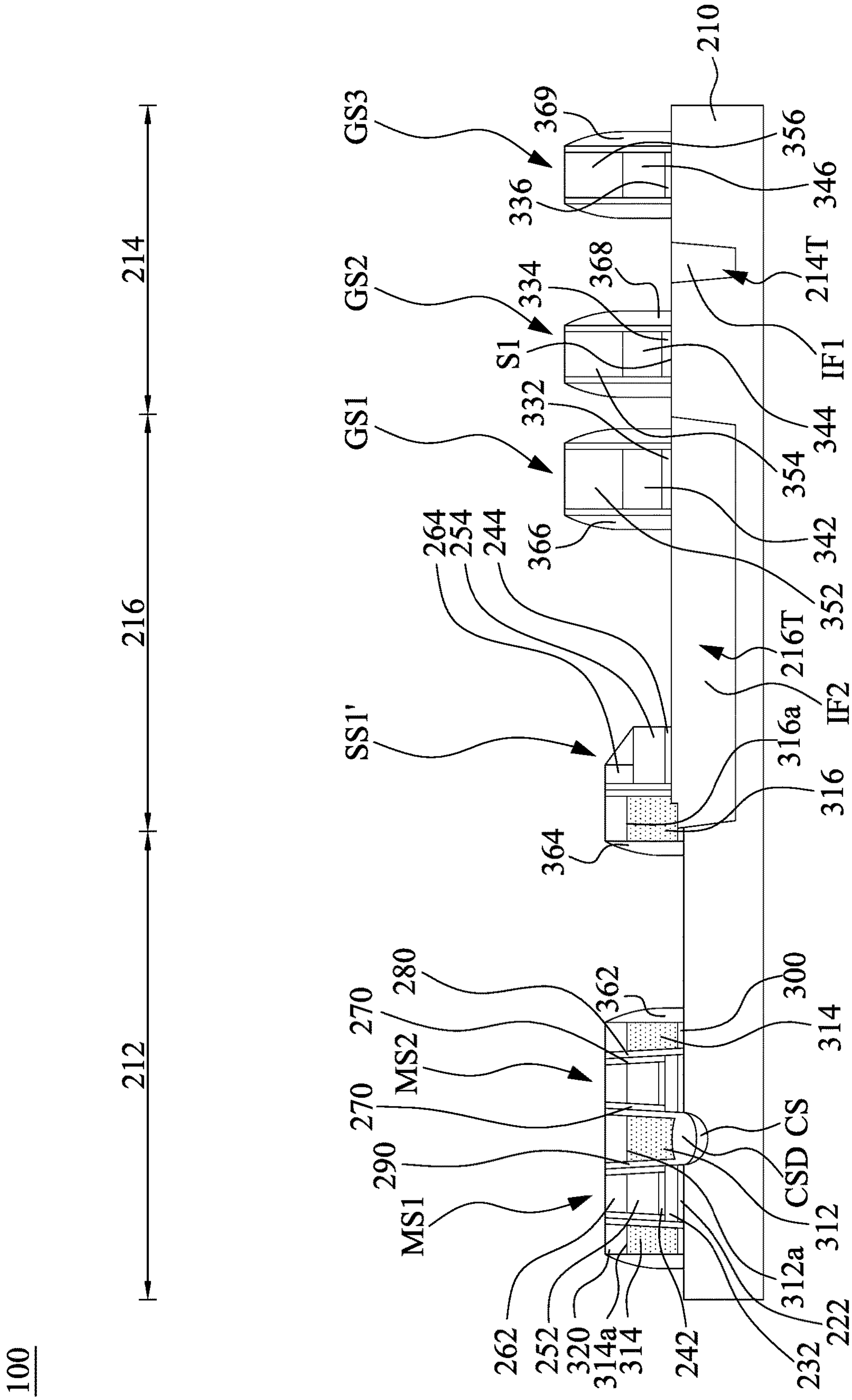
Figure 31B:
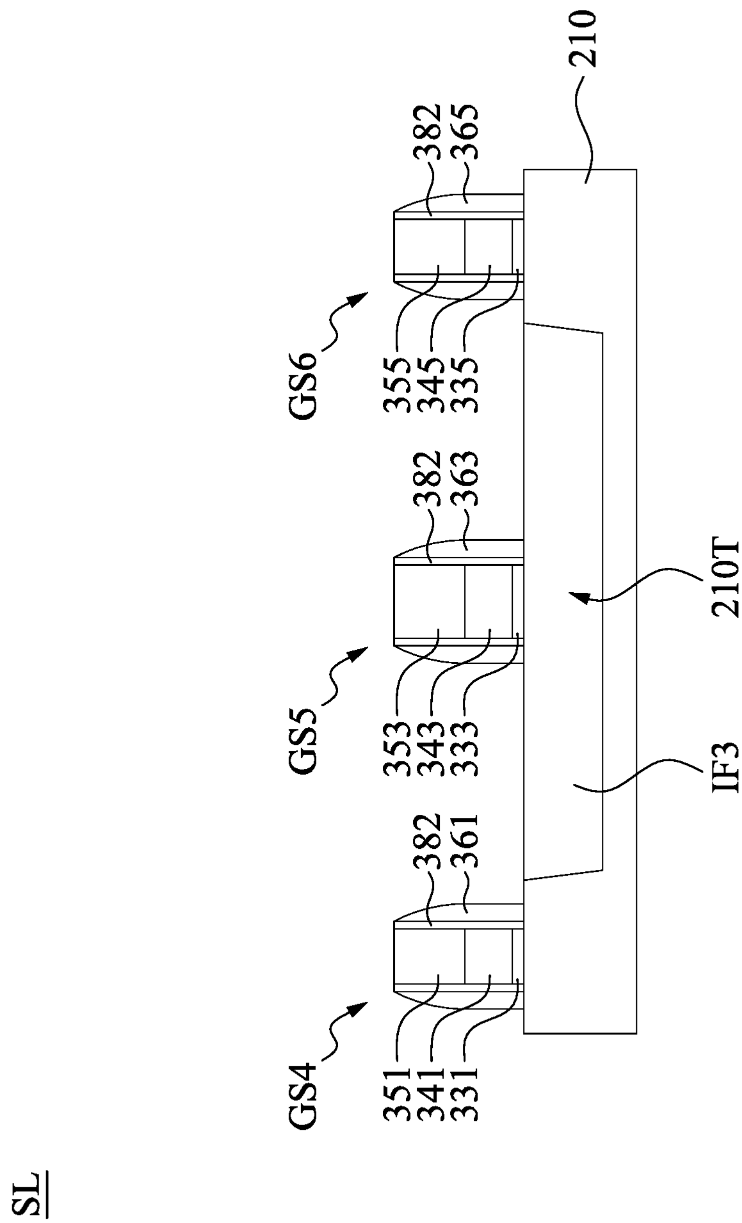

As illustrated in FIGS. 31A and 31B, spacers 361, 362, 363, 364, 365, 366, 368, and 369 are formed. To be specific, the spacers 362 are formed on the sidewalls of the select gates 314 away from the gate stacks MS1 and MS2. The spacer 364 is formed on a sidewall of the dummy gate 316 away from the stack SS1'. The spacers 366 are formed on opposite sidewalls of the gate stack GS1. Spacers 368 are formed on opposite sidewalls of the gate stack GS2. Spacers 369 are formed on opposite sidewalls of the gate stack GS3. Spacers 361 are formed on opposite sidewalls of the dummy gate stack GS4. Spacers 363 are formed on opposite sidewalls of the gate stack GS5. Spacers 365 are formed on opposite sidewalls of the dummy gate stack GS6.

For example, a dielectric spacer layer may be conformally formed over the structure of FIGS. 30A and 30B, and an etching process (e.g. anisotropic etching process) is performed to remove horizontal portions of the dielectric spacer layer, and vertical portions of the dielectric spacer layer remain to form the spacers 361, 362, 363, 364, 365, 366, 368, and 369. The spacers 361, 362, 363, 364, 365, 366, 368, and 369 may be made of silicon nitride, silicon oxide, and/or other dielectric materials, or the combinations thereof.

Figure 32A:
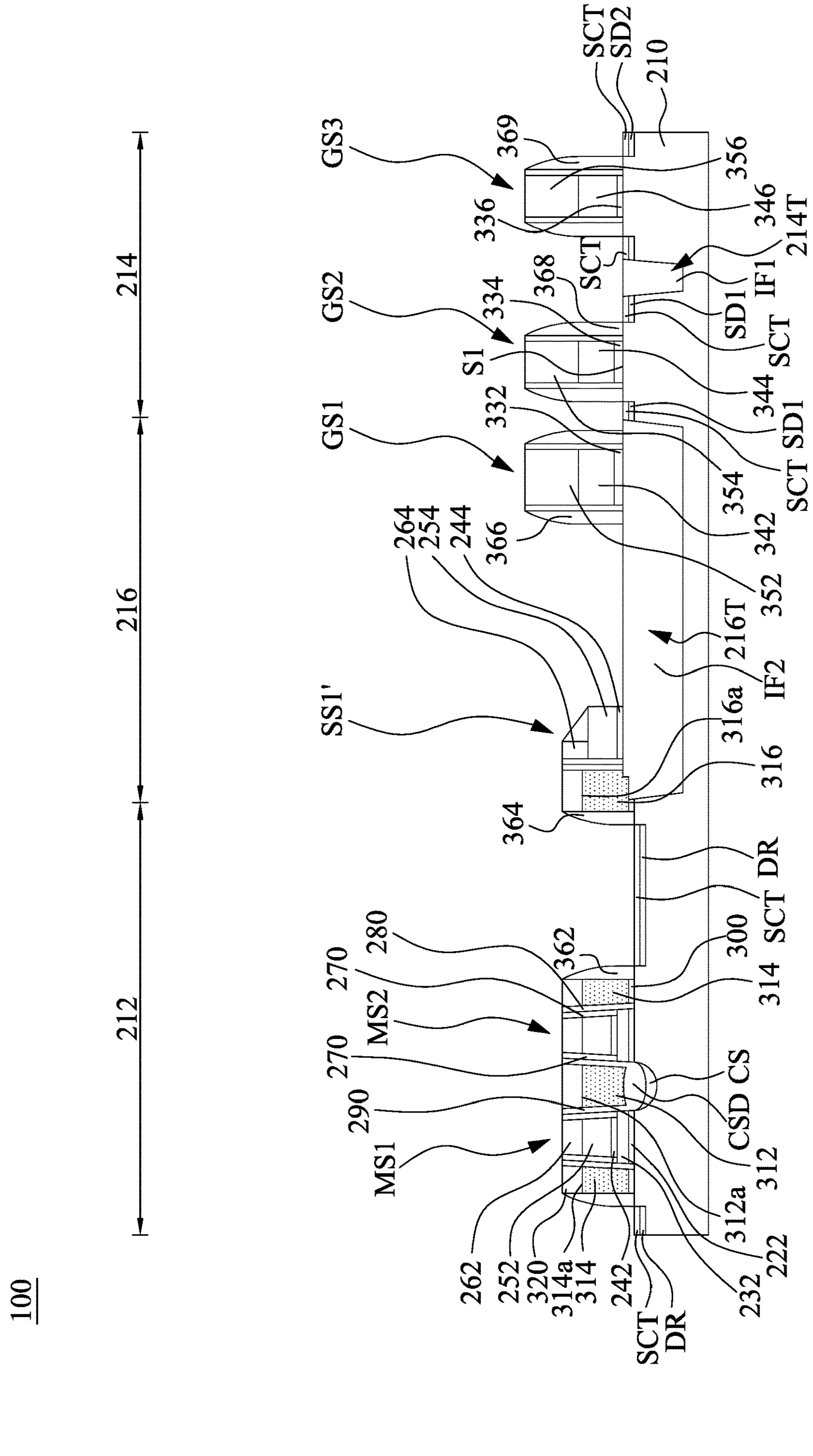
Figure 32B:
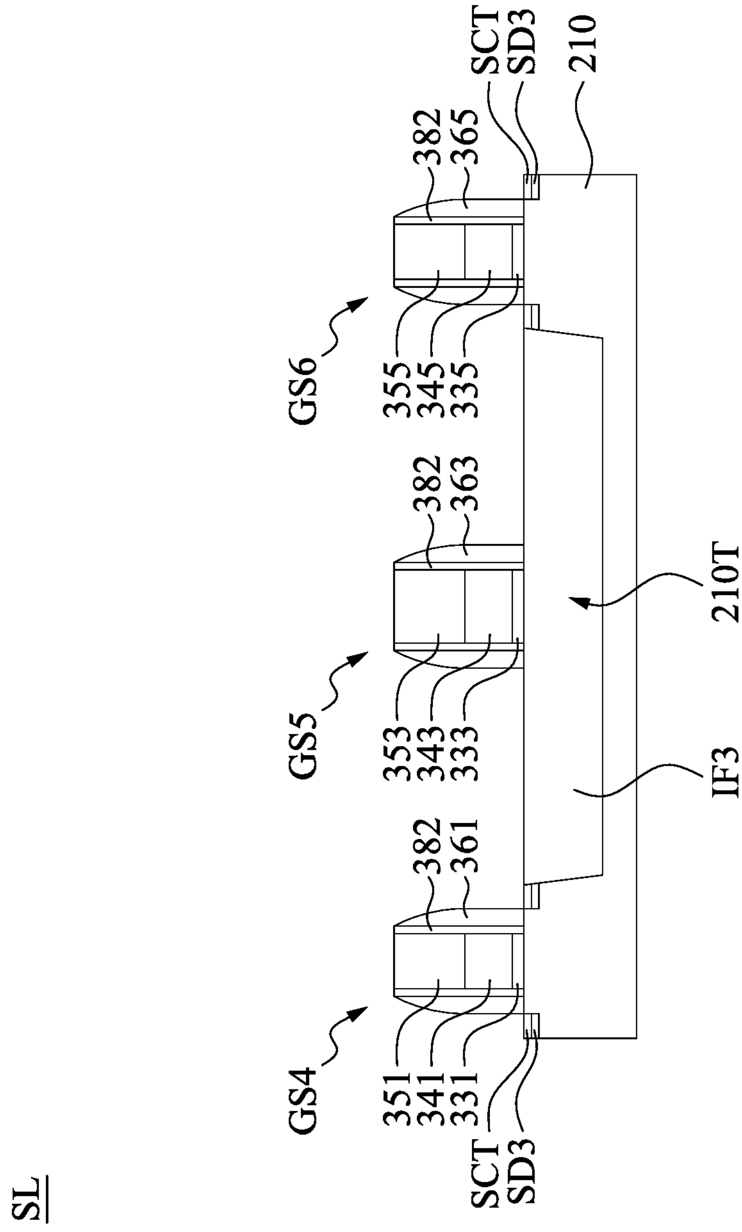

As illustrated in FIGS. 32A and 32B, drain regions DR are formed in the flash memory array region 212 of the semiconductor substrate 210, source/drain regions SD1 and SD2 are formed in the peripheral circuit region 214 of the semiconductor substrate 210, and source/drain regions SD3 are formed in the scribe line region SL of the semiconductor substrate 210. In some embodiments, the drain regions DR and the source/drain regions SD1, SD2 and SD3 are formed by performing an ion implantation process to the substrate 210. The select gates 314 and the dummy gate 316 are protected by the spacers 362 and 364 during the ion implantation process. In some embodiments, silicide contact terminals SCT are formed on the drain regions DR and the source/drain regions SD1, SD2 and SD3 using for example, reacting metal with the drain regions DR and the source/drain regions SD1, SD2 and SD3.

Figure 33A:
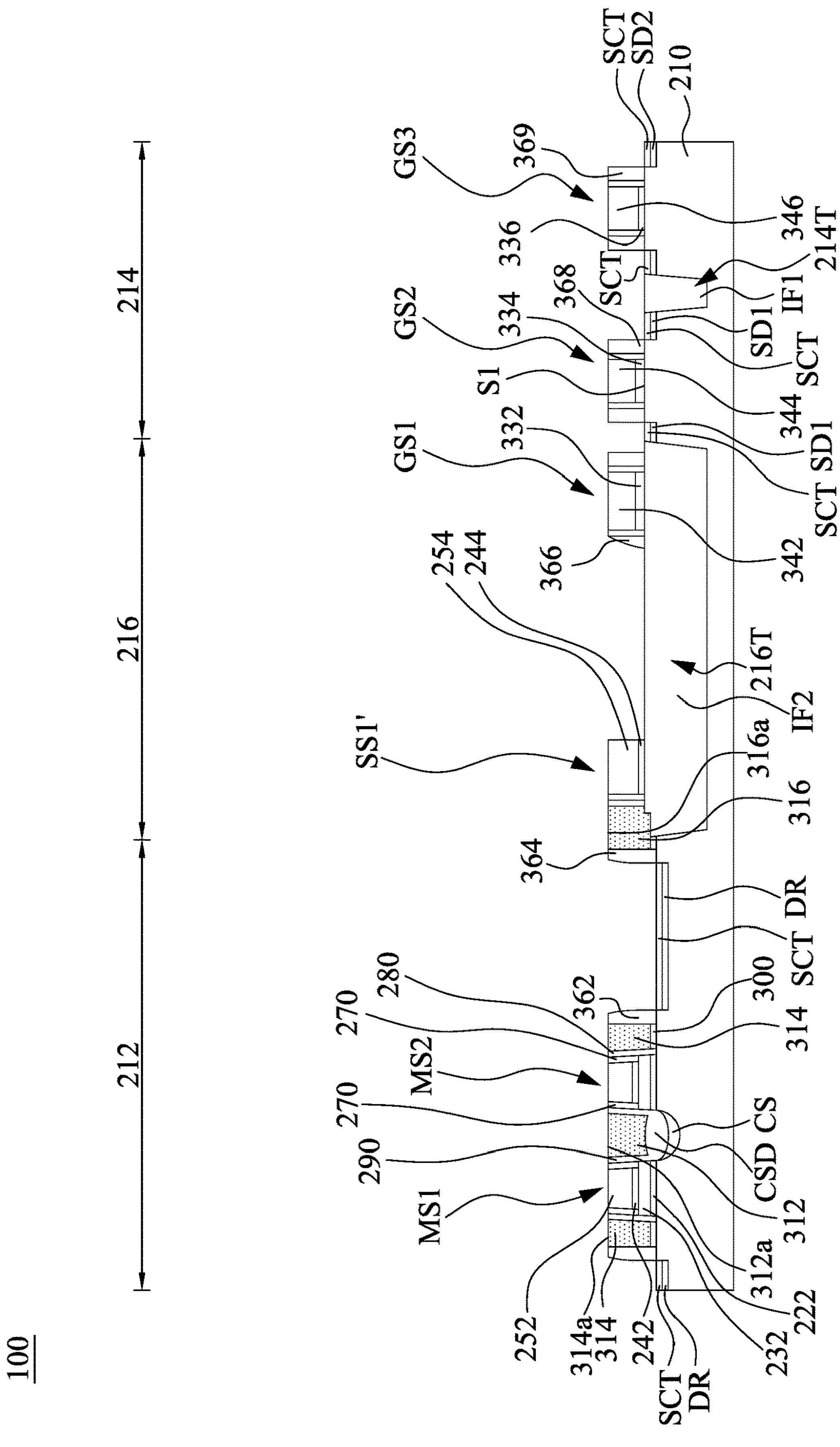
Figure 33B:
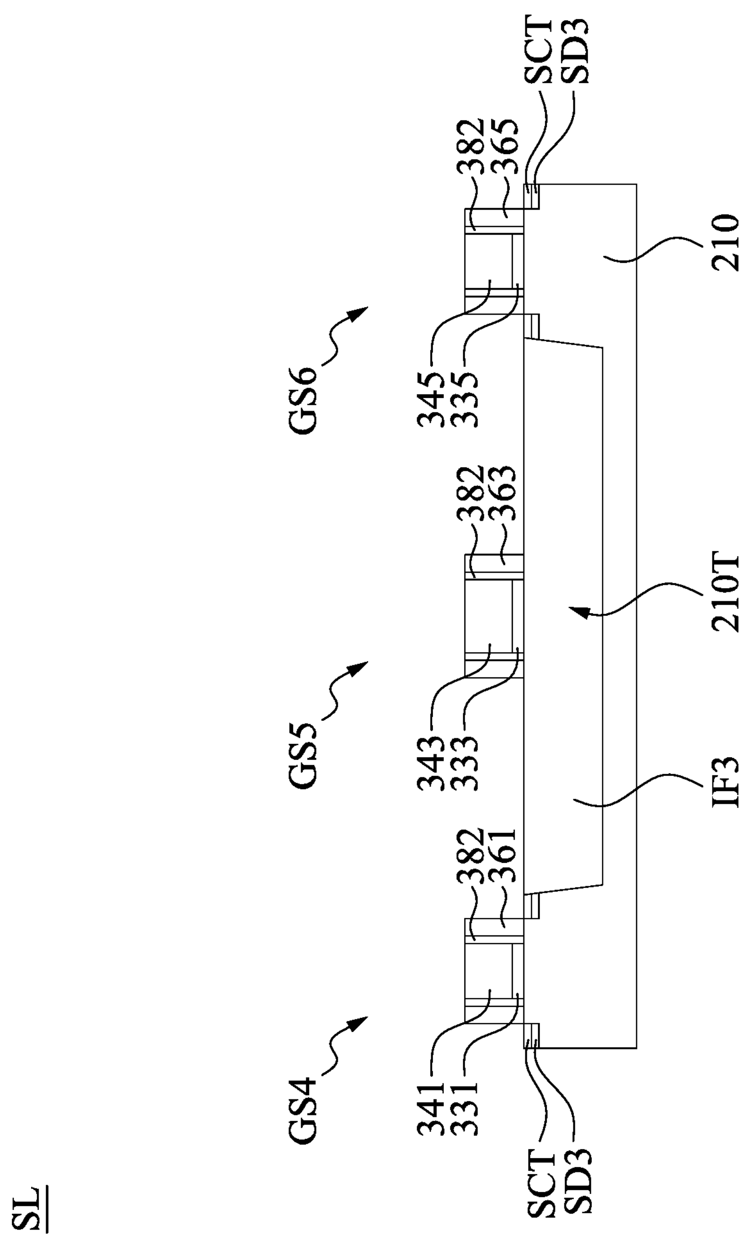

As illustrated in FIGS. 33A and 33B, a planarization process is optionally performed to remove the hard masks 262, 264, 351-356. For example, the planarization process is an etch back process. After the etch back process, the top surfaces 312*a* of the erase gates 312, the top surfaces of the control gates 252 and 254, the top surfaces 314*a* of the select gates 314, a top surface 316*a* of the dummy gate 316 and top surfaces of the gate electrodes 341-346 are exposed.

Figure 34A:
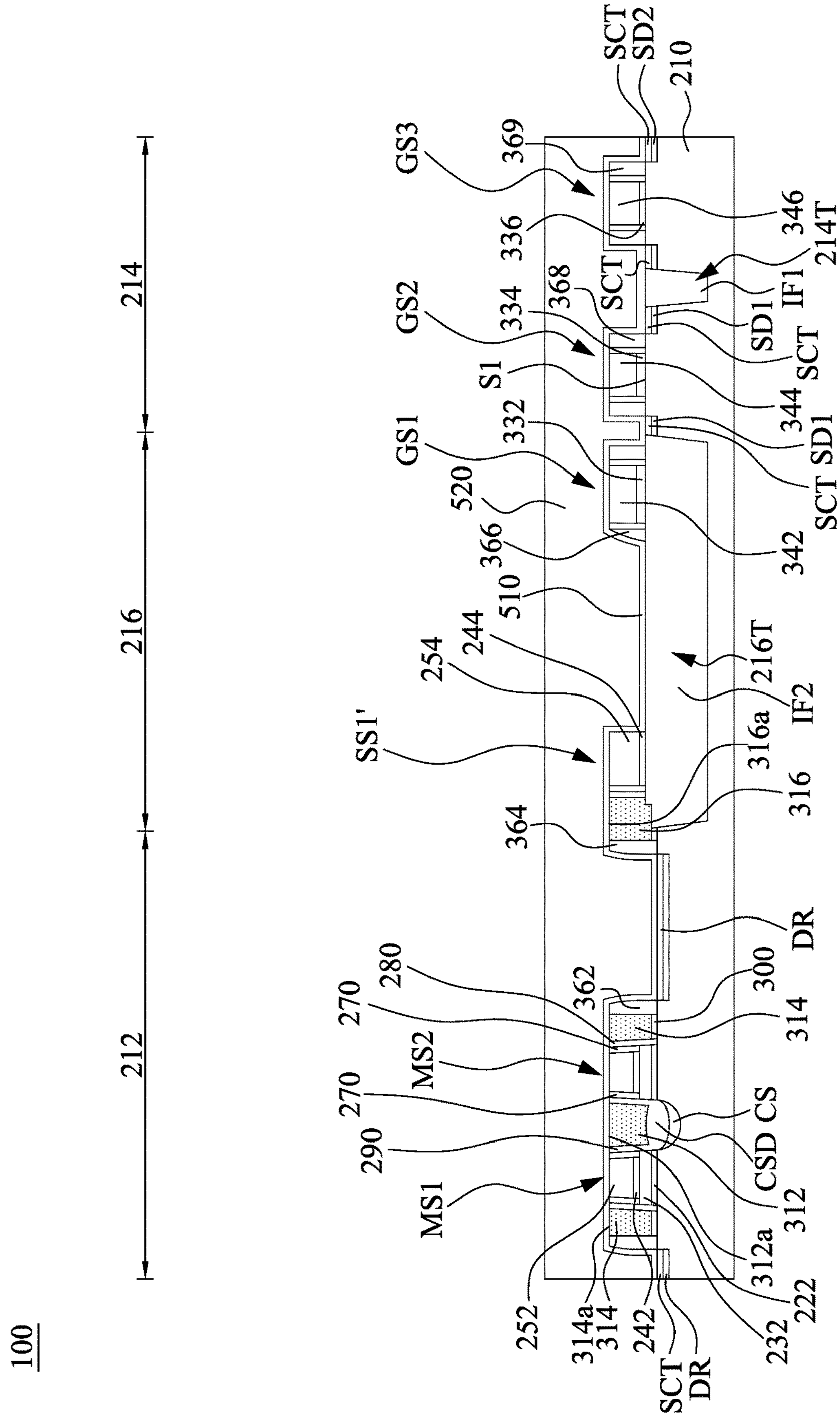
Figure 34B:
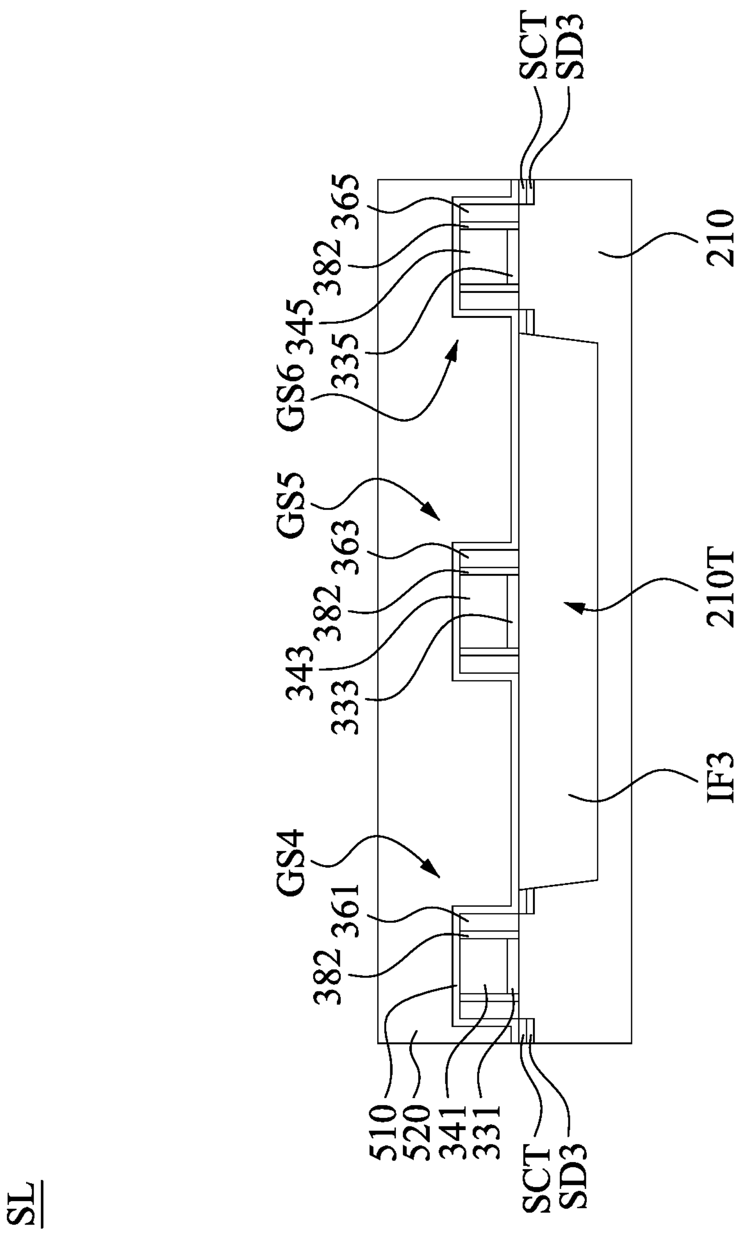

As illustrated in FIGS. 34A and 34B, an etch stop layer 510 is conformally formed over the gate stack MS1, MS2, the stack SS1', the dummy gate stack GS1, the high voltage gate stack GS2, and the logic gate stack GS3, the dummy gate stacks GS4 and GS6 and the gate stack GS5, followed by forming an ILD layer 520 over the etching stop layer 510.

The etch stop layer 510 is, for example, a nitrogen-containing layer or a carbon-containing layer, such as SiN, SiC or SiCN. The ILD layer 520 can contain one or more than one dielectric layers, which may be formed by a chemical vapor deposition (CVD) process, a spin coating process, or other suitable process that can form any dielectric materials. The ILD layer 520 includes, for example, an extreme low-K dielectric (i.e., a dielectric with a dielectric constant K less than 2).

Figure 35A:
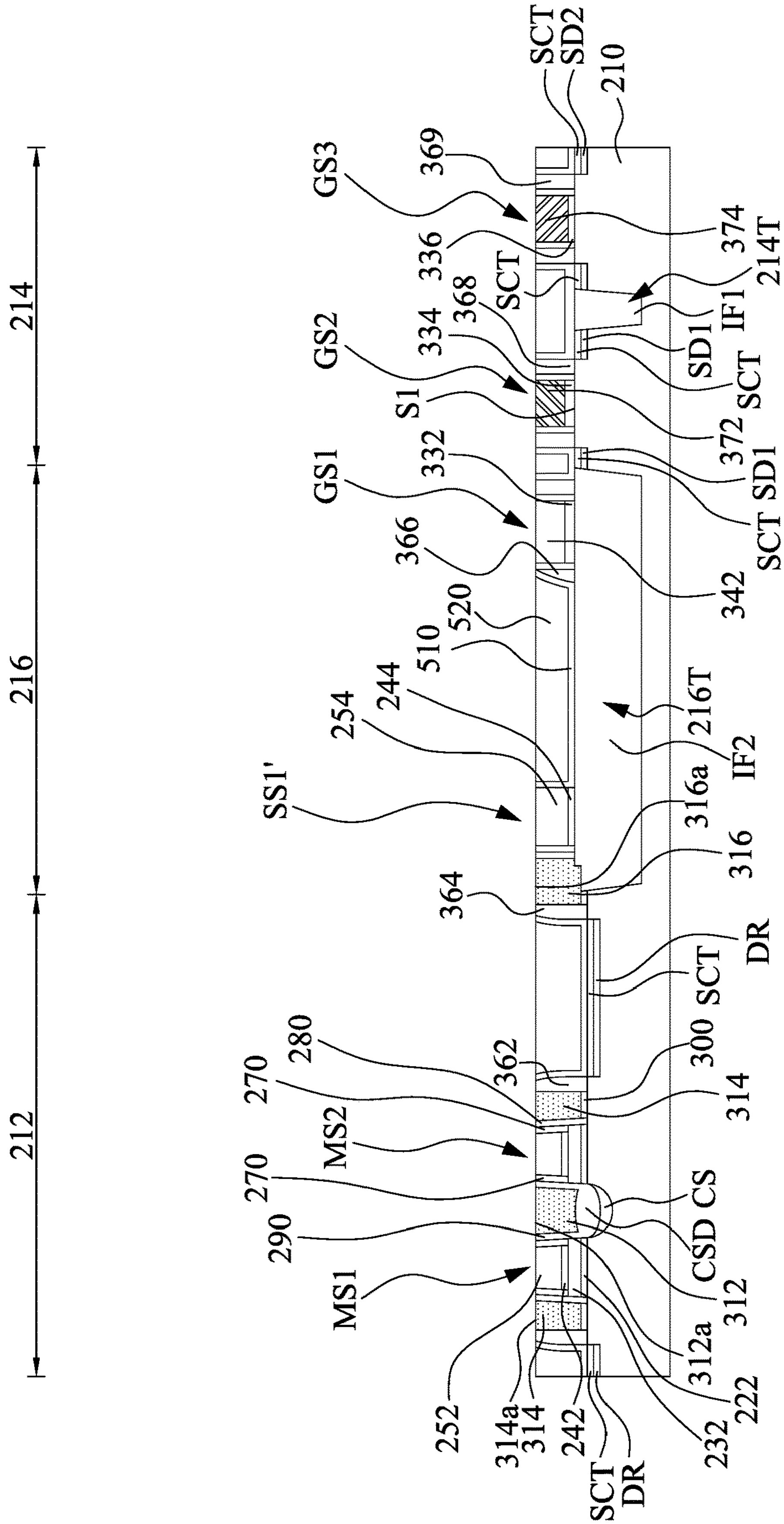
Figure 35B:
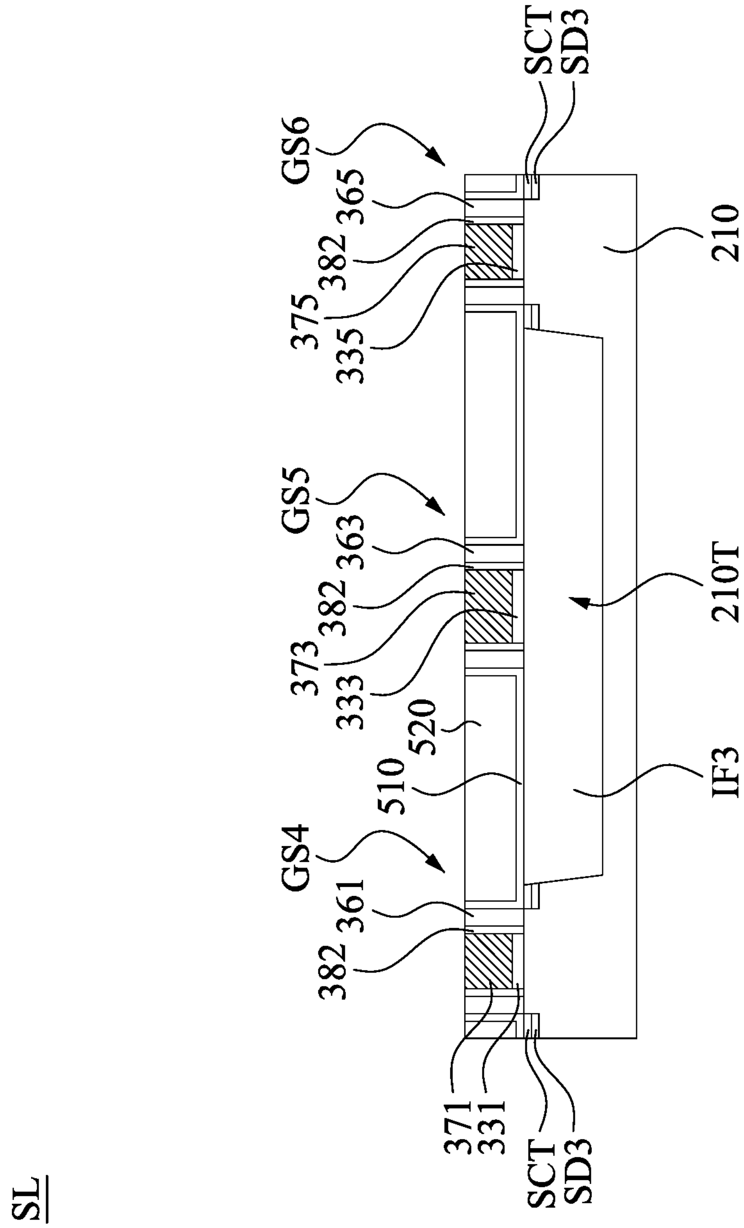

As illustrated in FIGS. 35A and 35B, a planarization process and a replacement gate (RPG) process is performed. For example, the planarization process includes a chemical mechanical polish (CMP) process. The CMP process substantially levels a top surface of the ILD layer 520 with top surfaces of the gate stacks MS1 and MS2, the stack SS1', the dummy gate stack GS1, the high voltage gate stack GS2 and the logic gate stack GS3, the dummy gate stacks GS4, GS6 and the gate stack GS5. After the CMP process, the top surfaces 314*a* of the select gates 314, the top surface 316*a* of the dummy gate 316 and the top surface 312*a* of the erase gate 312 are exposed, and the top surfaces of the gate stacks MS1 and MS2, the dummy gate stack GS1, the high voltage gate stack GS2, the logic gate stack GS3, the dummy gate stacks GS4 and GS6 and the gate stack GS5 are exposed as well.

In some embodiments, the RPG process is performed to the high voltage gate stack GS2, the logic gate stack GS3, the dummy gate stacks GS4, GS6 and the gate tack GS5. For example, the polysilicon gate electrodes 341, 343-346 (referring to FIGS. 34A and 34B) are removed, such that a gate trench is formed between the spacers 368, a gate trench is formed between the spacers 369, a gate trench is formed between the spacers 361, a gate trench is formed between the spacers 363, and a gate trench is formed between the spacers 365. Then, one or more metal layers are deposited to overfill the gate trenches, followed by performing a CMP process to remove excess portions of the one or more metal layers outside the gate trenches. In this way, metal gate structures 371, 372, 373, 374 and 375 are formed. In greater detail, the metal gate structures 371 and 375 are formed in the respective dummy gate stacks GS4 and GS6 in the scribe line region SL, the metal gate structure 373 is formed in the gate stack GS5 in the scribe line region SL, the metal gate structure 372 is formed in the high voltage gate stack GS2 in the peripheral circuit region 214 in the die region 100, and the metal gate structure 374 is formed in the logic gate stack GS3 in the peripheral circuit region 214 in the die region 100.

Figure 36A:
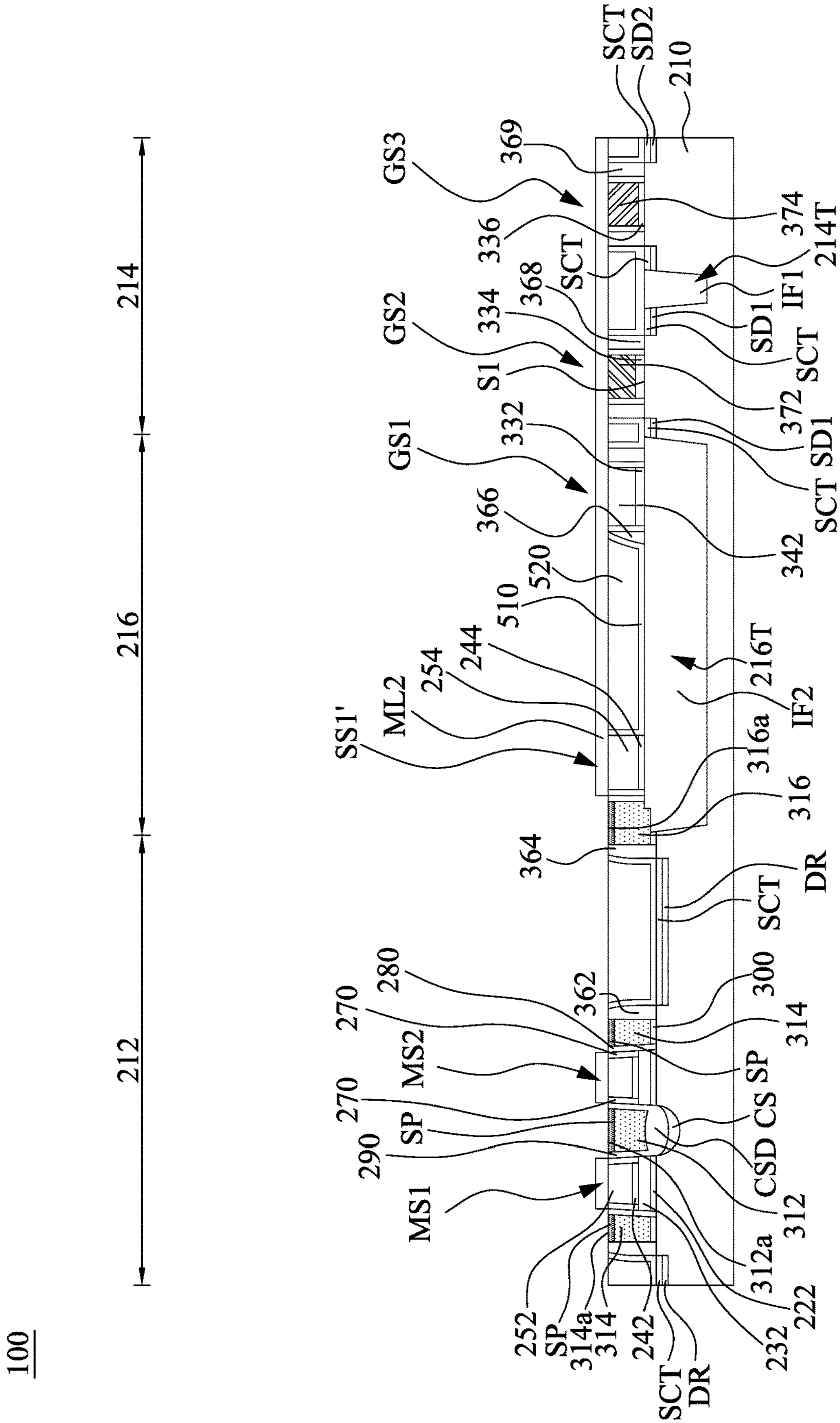
Figure 36B:
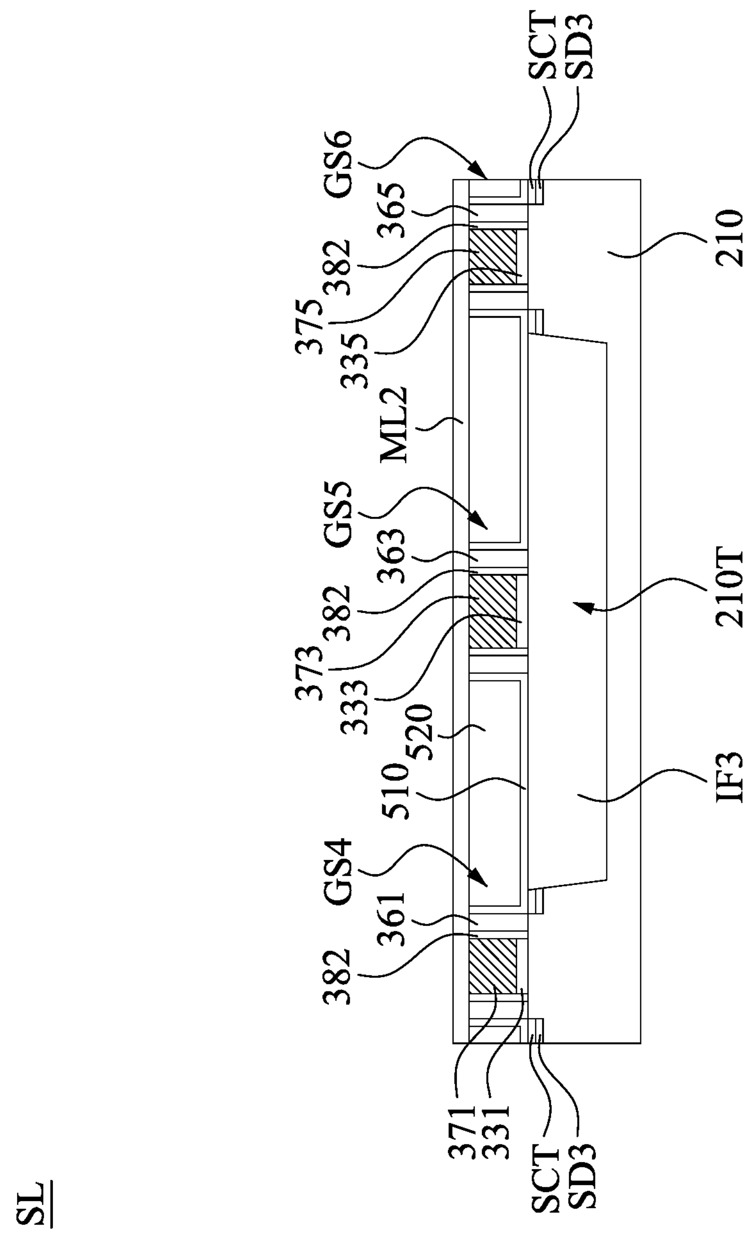

As illustrated in FIGS. 36A and 36B, a silicidation process is performed to the exposed top surface 314*a* of the select gates 314, the exposed top surface 312*a* of the erase gate 312, and the exposed top surface 316*a* of the dummy gate 316, such that silicide portions SP are formed on the top surfaces 312*a*, 314*a*, and 316*a* of the erase gate 312, the select gates 314, and the dummy gate 316. In some embodiments, a mask layer ML2 may be formed over the top surfaces of the gate stacks MS1 and MS2, the stack SS1', the dummy gate stack GS1, the high voltage gate stack GS2, the logic gate stack GS3, the dummy gate stacks GS4, GS6 and the gate stack GS5. The mask layer ML2 is removed after the silicidation process.

Figure 37A:
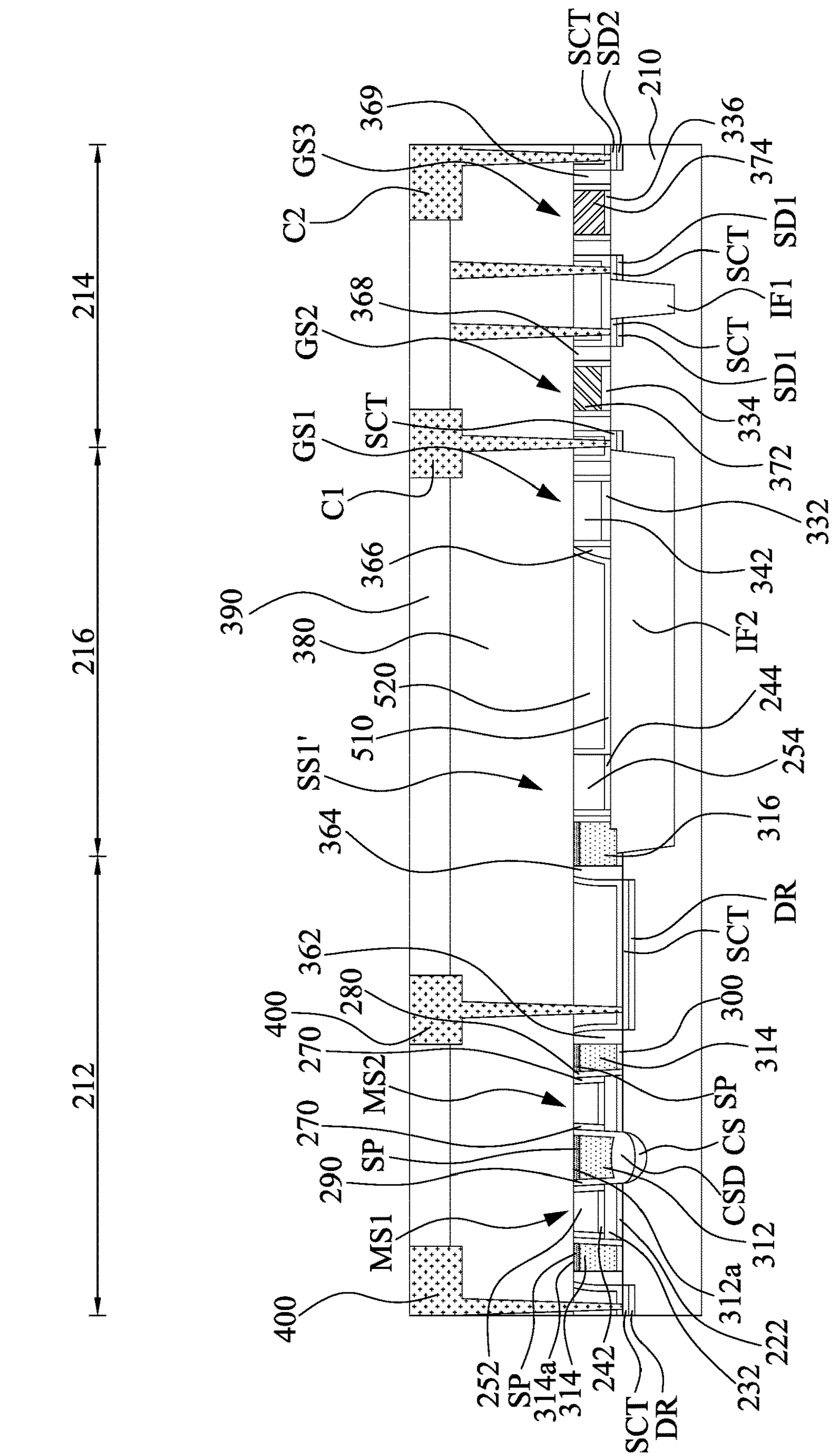
Figure 37B:
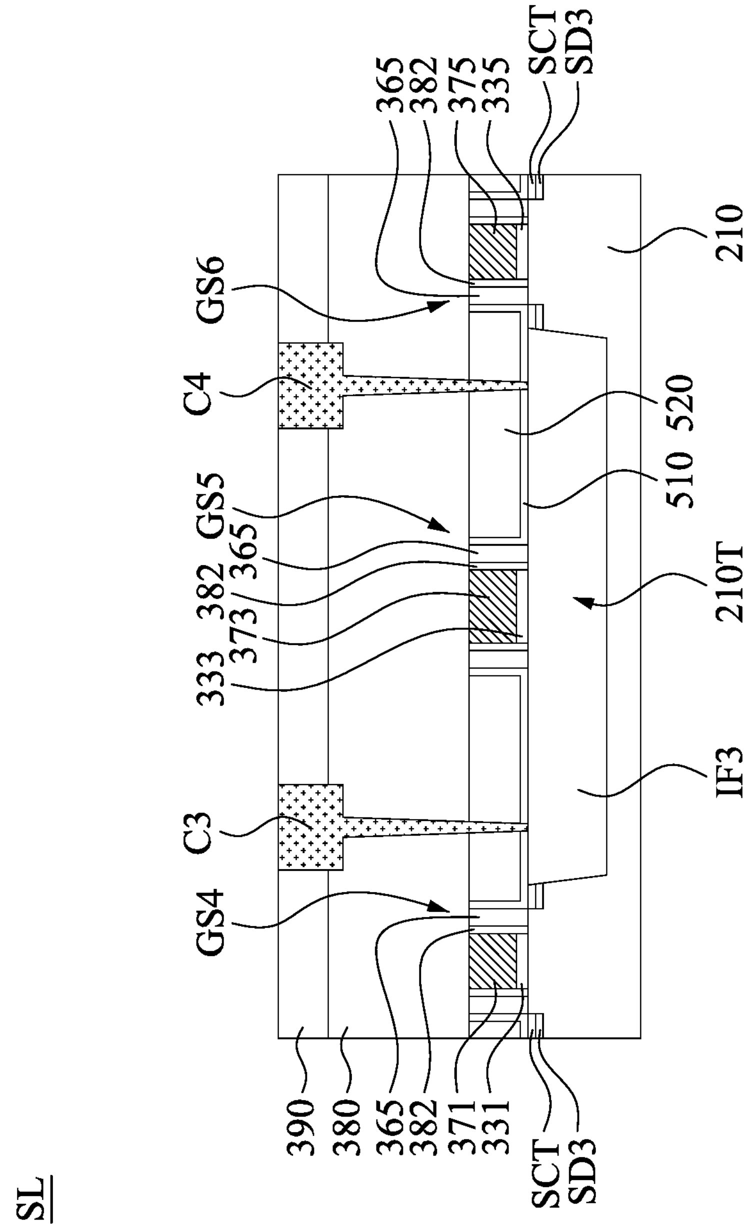

As illustrated in FIGS. 37A and 37B, drain contacts 400, source/drain contacts C1, C2 and contacts C3 and C4 are formed. In greater detail, ILD layers 380 and 390 are formed over the structure of FIGS. 36A and 36B, followed by forming trenches and via openings through the ILD layers 380, 390 and 520 and the etch stop layer 510 to expose the silicide contact terminals SCT and the isolation structure IF3 by using, for example, a dual damascene process. One or more metal layers are then deposited to fill the trenches and via openings, followed by performing a CMP process to remove excess portions of the one or more metal layers outside the trenches and via openings. In this way, the drain contacts 400 are respectively in contact with the silicide contact terminals SCT on the drain regions DR, the source/drain contacts C1 and C2 are respectively in contact with the silicide contact terminals SCT on the source/drain regions SD1 and SD2, and the contacts C3 and C4 are in contact with the isolation structure IF3. A top view of the contact-to-gate monitor pattern of FIG. 37B may be similar to, for example, FIG. 4A, 5A or 6A, where the metal gate structure 373 of FIG. 37B may corresponds to the gate structure 932 of FIG. 4A, 5A or 6A, the dummy metal gate structures 371 and 375 of FIG. 37B may respectively correspond to the dummy gate structures 962 and 963 of FIG. 4A, 5A or 6A, and the contacts C3 and C4 of FIG. 37B may respectively correspond to the contacts 952 of FIG. 4A, 5A or 6A.

A contact-to-gate breakdown voltage can be tested, measured and/or monitored by using the contacts C3 and/or C4 and the metal gate structure 373 in the scribe line region SL. Because the contacts C3 and C4 are not in contact with the semiconductor substrate 210, a noise of the drain-side junction breakdown voltage can be prevented. In some embodiments, a gate contact (e.g., gate contact 941 as shown in FIG. 4A) is formed on the metal gate structure 373 simultaneously with the formation of the drain contacts 400, source/drain contacts C1, C2 and contacts C3 and C4.

Figure 38:
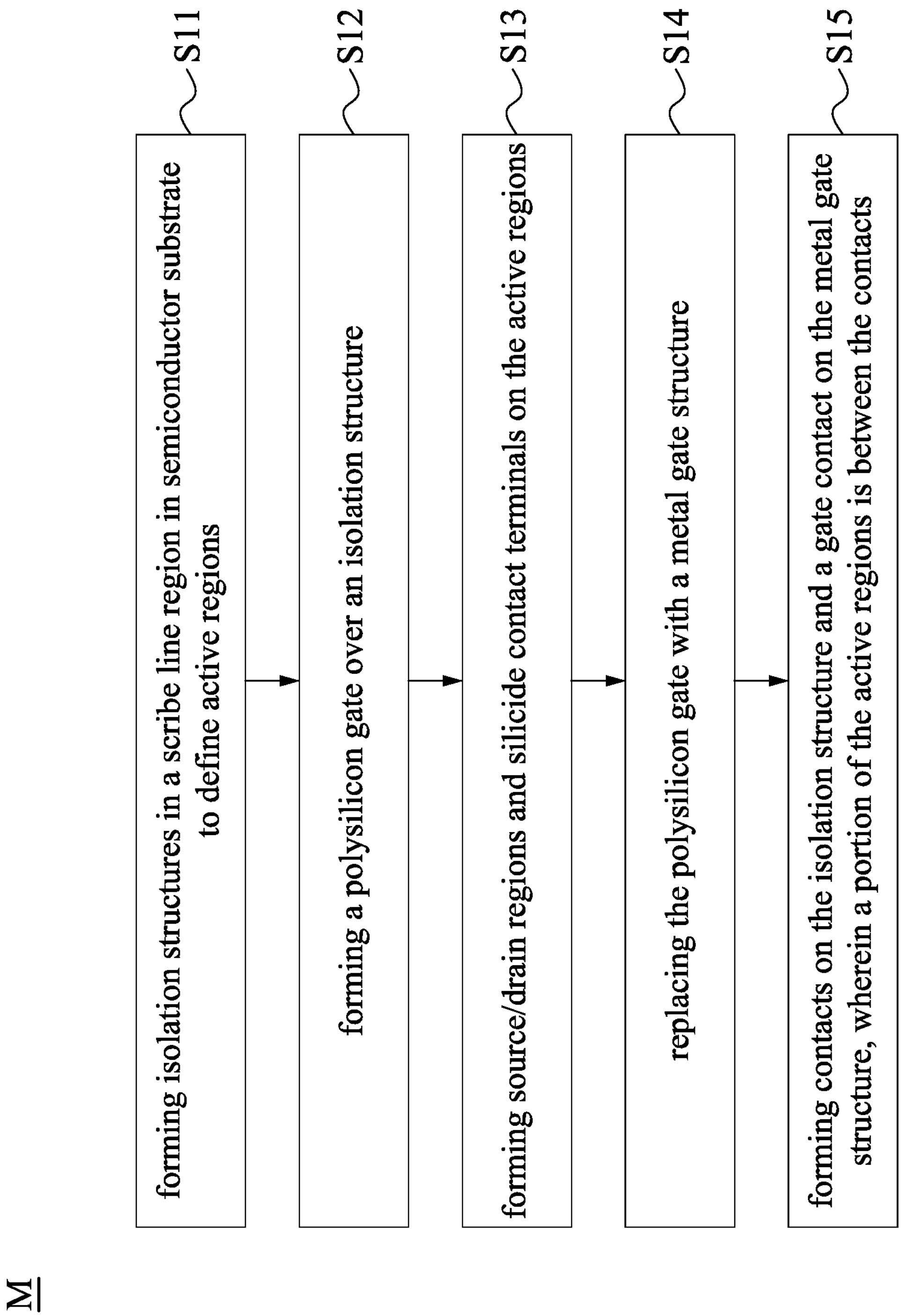
FIG. 38 is a flow chart outlining a method of forming a contact-to-gate monitor pattern according to some embodiments of the present disclosure.

FIG. 38 is a flow chart outlining a method M of forming a contact-to-gate monitor pattern in accordance with some embodiments. Although the method M is illustrated and/or described as a series of acts or events, it will be appreciated that the method is not limited to the illustrated ordering or acts. Thus, in some embodiments, the acts may be carried out in different orders than illustrated, and/or may be carried out concurrently. Further, in some embodiments, the illustrated acts or events may be subdivided into multiple acts or events, which may be carried out at separate times or concurrently with other acts or sub-acts. In some embodiments, some illustrated acts or events may be omitted, and other un-illustrated acts or events may be included. It will be appreciated that other figures are used as examples for the method, but the method is also applicable to other structures and/or configurations.

At block S11, one or more isolation structures (e.g., the isolation structures IF3 as shown in FIG. 12B) are formed in a scribe line region in a semiconductor substrate to define active regions, as illustrated in the exemplary cross-sectional view of the scribe line region SL as shown in FIG. 12B. Moreover, FIGS. 4B, 5B, 6B and 7B illustrate exemplary top views of various embodiments of the isolation structures formed in the scribe line region SL. It will be appreciated that the depicted cross-sectional view shapes and top-view shapes of the isolation structures are merely examples and are not intended to be limiting.

At block S12, one or more polysilicon gates (e.g., polysilicon gates 343 as shown in FIG. 28B) are formed over the isolation structures. FIGS. 28A and 28B illustrate a cross-sectional view of some embodiments corresponding to act in block S12.

At block S13, source/drain regions and silicide contact terminals (e.g., source/drain regions SD3 and silicide contact terminals SCT as shown in FIG. 32B) are formed in the active regions. FIGS. 32A and 32B illustrate a cross-sectional view of some embodiments corresponding to act in block S13.

At block S14, polysilicon gates are replaced with metal gate structures (e.g., metal gate structure 373 as shown in FIG. 35B). FIGS. 35A and 35B illustrate a cross-sectional view of some embodiments corresponding to act in block S14.

At block S15, conductive contacts (e.g., contacts C3 and C4 as shown in FIG. 37B) are formed on the isolation structure and gate contacts (e.g., gate contact 941 as shown in FIG. 4A) on the respective metal gate structures. FIGS. 37A and 37B illustrate a cross-sectional view of some embodiments corresponding to act in block S15. FIGS. 4A, 5A, 6A and 7A illustrate top views of some embodiments corresponding to act in block S15.

Based on the above discussions, it can be seen that the present disclosure offers following advantages. It is understood, however, that other embodiments may offer additional advantages, and not all advantages are necessarily disclosed herein, and that no particular advantage is required for all embodiments.

One advantage is that the contact-to-gate monitor pattern includes contacts landing on STI regions, instead of active regions, so that noises resulting from drain-side junction breakdown can be prevented, thus improving accuracy of the measurement results of the contact-to-gate breakdown voltage.

Another advantage is that the STI dishing effect in the contact-to-monitor pattern can be alleviated due to an increased density of active regions (i.e., OD density) in the contact-to-monitor pattern, which in turn will reduce unacceptable defects (e.g., peeling issues as discussed previously) in the contact-to-monitor pattern.

Another advantage is that the OD density improvement in the contact-to-gate monitor pattern can be achieved without using additional masks and lithography processes.

Another advantage is that processes for the OD density improvement in the contact-to-gate monitor pattern are compatible with manufacturing processes of flash memory devices and transistors having high-k metal gate (HKMG) structures.

In some embodiments, a method includes forming one or more shallow trench isolation (STI) regions in a semiconductor substrate to define a first active region and a plurality of second active regions laterally surrounding the first active region, wherein the first active region has a top-view area greater than a top-view area of each of the second active regions; forming a plurality of gate structures laterally surrounded by the second active regions and spaced apart at least in part by the first active region; and forming a plurality of conductive contacts between the gate structures. The conductive contacts are in contact with the STI region.

In some embodiments, a method includes forming a first shallow trench isolation (STI) region in a scribe line region in a semiconductor substrate, the STI region bordering an active region in the semiconductor substrate; forming a gate structure in the scribe line region; and forming a conductive contact in contact with the first STI region, wherein a boundary between the active region and the first STI region is between the conductive contact and the gate structure.

In some embodiments, a device includes a semiconductor substrate having a die region and a scribe line region around the die region, a flash memory cell in the die region, and a contact-to-gate monitor pattern in the scribe line region. The contact-to-gate pattern includes a first active region, a plurality of second active regions around the first active region, a shallow trench isolation (STI) region bordering the first active region, a conductive contact overlapping the STI region, and a gate structure overlapping the STI region. The first active region has a top surface larger than a top surface of at least one of the second active regions.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

forming one or more shallow trench isolation (STI) regions in a semiconductor substrate to define a first active region and a plurality of second active regions laterally surrounding the first active region, wherein the first active region has a top-view area greater than a top-view area of each of the second active regions;

forming a plurality of gate structures laterally surrounded by the second active regions and spaced apart at least in part by the first active region; and forming a plurality of conductive contacts between the gate structures, wherein the conductive contacts are in contact with the STI region.

2. The method of claim 1, further comprising:

forming a dummy gate structure over a portion of the first active region between the conductive contacts.

3. The method of claim 2, wherein the dummy gate structure is formed simultaneously with forming the gate structures.

4. The method of claim 2, wherein forming the dummy gate structure is performed such that the dummy gate structure has a width less than a width of one of the gate structures.

5. The method of claim 1, wherein the one or more STI regions comprises a first STI region laterally surrounded by the first active region and a second STI region laterally surrounding the first active region, and forming the gate structures is performed such that one of the gate structures extends past opposing edges of the first STI region.

6. The method of claim 1, further comprising:

forming a gate contact overlapping with one of the gate structures and the first active region.

7. The method of claim 6, wherein the gate contact is formed simultaneously with forming the conductive contacts.

8. The method of claim 1, wherein forming the conductive contacts is performed such that the conductive contacts non-overlap with the first active region.

9. The method of claim 1, wherein the first active region extends continuously around the gate structures.

10. The method of claim 1, wherein forming the one or more STI regions is performed to define a plurality of the first active regions in the semiconductor substrate, and the first active regions are arranged in an alternating manner with the gate structures.

11. A method, comprising:

forming a first shallow trench isolation (STI) region in a scribe line region in a semiconductor substrate, the STI region bordering an active region in the semiconductor substrate;

forming a gate structure in the scribe line region; and forming a conductive contact in contact with the first STI region, wherein a boundary between the active region and the first STI region is between the conductive contact and the gate structure.

12. The method of claim 11, further comprising:

forming first and second flash memory cells in a die region in the semiconductor substrate prior to forming the gate structure in the scribe line region.

13. The method of claim 12, further comprising:

forming a common source region in the semiconductor substrate and between the first and second flash memory cells; and forming a source/drain region in the active region after forming the common source region.

14. The method of claim 11, further comprising:

forming a metal gate structure in a die region in the semiconductor substrate simultaneously with forming the gate structure in the scribe line region.

15. The method of claim 11, further comprising:

forming a second STI region in a die region in the semiconductor substrate simultaneously with forming the first STI region in the scribe line region.

16. The method of claim 11, further comprising:

forming a first source/drain region in the active region in the semiconductor substrate; and forming a second source/drain region in a die region in the semiconductor substrate simultaneously with forming the first source/drain region.

17. A method, comprising:

forming a shallow trench isolation (STI) region within a scribe line region of a substrate, the STI region bordering an active region within the scribe line region;

forming a patterned protective layer over the STI region within the scribe line region, while leaving a flash memory array region of the substrate exposed;

forming a tunnel dielectric layer over the exposed flash memory array region and a floating gate layer over the tunnel dielectric layer;

performing a chemical mechanical planarization (CMP) process on the floating gate layer until the patterned protective layer is exposed;

removing the patterned protective layer to expose the STI region within the scribe line region;

depositing in sequence a blocking layer and a control gate layer over the floating gate layer and the exposed STI region within the scribe line region;

patterning the control gate layer, the blocking layer, the floating gate layer, and the tunnel dielectric layer into a pair of memory gate stacks; and after forming the pair of memory gate stacks, forming a gate structure and a conductive contact over the STI region within the scribe line region.

18. The method of claim 17, wherein the gate structure has a longitudinal axis substantially parallel with a boundary between the STI region and the active region.

19. The method of claim 17, wherein the active region has a longitudinal axis substantially perpendicular to a longitudinal axis of the gate structure.

20. The method of claim 17, wherein the active region has a longitudinal axis substantially parallel with a longitudinal axis of the gate structure.

* * * * *